United States Patent [19]

Engeler

[11] Patent Number: 5,039,870

[45] Date of Patent: Aug. 13, 1991

[54] WEIGHTED SUMMATION CIRCUITS HAVING DIFFERENT-WEIGHT RANKS OF CAPACITIVE STRUCTURES

[75] Inventor: William E. Engeler, Scotia, N.Y.

[73] Assignee: General Electric Company, Schenectady, N.Y.

[21] Appl. No.: 525,931

[22] Filed: May 21, 1990

[51] Int. Cl.$^5$ ............................................. G06F 15/40
[52] U.S. Cl. .................................. 307/201; 307/246; 307/464; 364/807
[58] Field of Search ............... 364/513, 807, 602, 604, 364/825–827, 819; 307/201, 246, 464, 529; 365/189.08

[56] References Cited

U.S. PATENT DOCUMENTS

| | | | |
|---|---|---|---|
| 3,890,635 | 6/1975 | Engeler | 357/14 |
| 4,027,175 | 5/1977 | Hurst | 307/464 |
| 4,156,284 | 5/1979 | engeler | 364/862 |
| 4,471,482 | 9/1984 | Meijercluwen | 307/246 X |
| 4,518,866 | 5/1985 | Clymer | 307/201 |
| 4,616,185 | 10/1986 | van Roermund | 307/529 X |
| 4,660,166 | 4/1987 | Hopfield | 364/807 |
| 4,731,747 | 3/1988 | Denker | 364/807 |
| 4,754,226 | 6/1988 | Lusignan et al. | 307/529 X |
| 4,999,525 | 3/1991 | Park et al. | 307/201 |

OTHER PUBLICATIONS

"An Introduction to Computing with Neural Nets", R. P. Lippmann, IEEE ASSP Magazine, Apr. 1987, pp. 4–22.

"Switched-Capacitor Neural Networks", Y. P. Tsividis and D. Anastassio, Electronics Letters, Aug. 27, 1987, vol. 23, No. 18.

Primary Examiner—David Hudspeth
Attorney, Agent, or Firm—Allen L. Limberg; James C. Davis, Jr.; Marvin Snyder

[57] ABSTRACT

The input signals to the weighted summation circuitry are weighted by respective weighting factors on a digit-sliced basis. Each of the weighting factors is expressed as a respective plurality of portions of different weighting significance, the portions being R in number. The portions of the weighting factors expressed as digits that have the same weighting significance constitute a rank of values. These ranks of values are normalized by dividing each of them by its respective weighting significance. R ranks of capacitors are connected in R respective networks that sum the input signals, as weighted respectively by each of the ranks of normalized values, to get normalized respective partial summation results. To generate a final weighted summation result, means are provided to sum the respective partial summation results provided from the R respective networks, after the respective partial summation results have been weighted by their corresponding weighting significances to remove normalization. Where the weighted summation circuitry is used in a neural net layer, this final weighted summation result is supplied to a non-linear amplifier with sigmoidal transfer characteristic to obtain an axonal response to the synaptic input signals after their weighted summation.

76 Claims, 34 Drawing Sheets

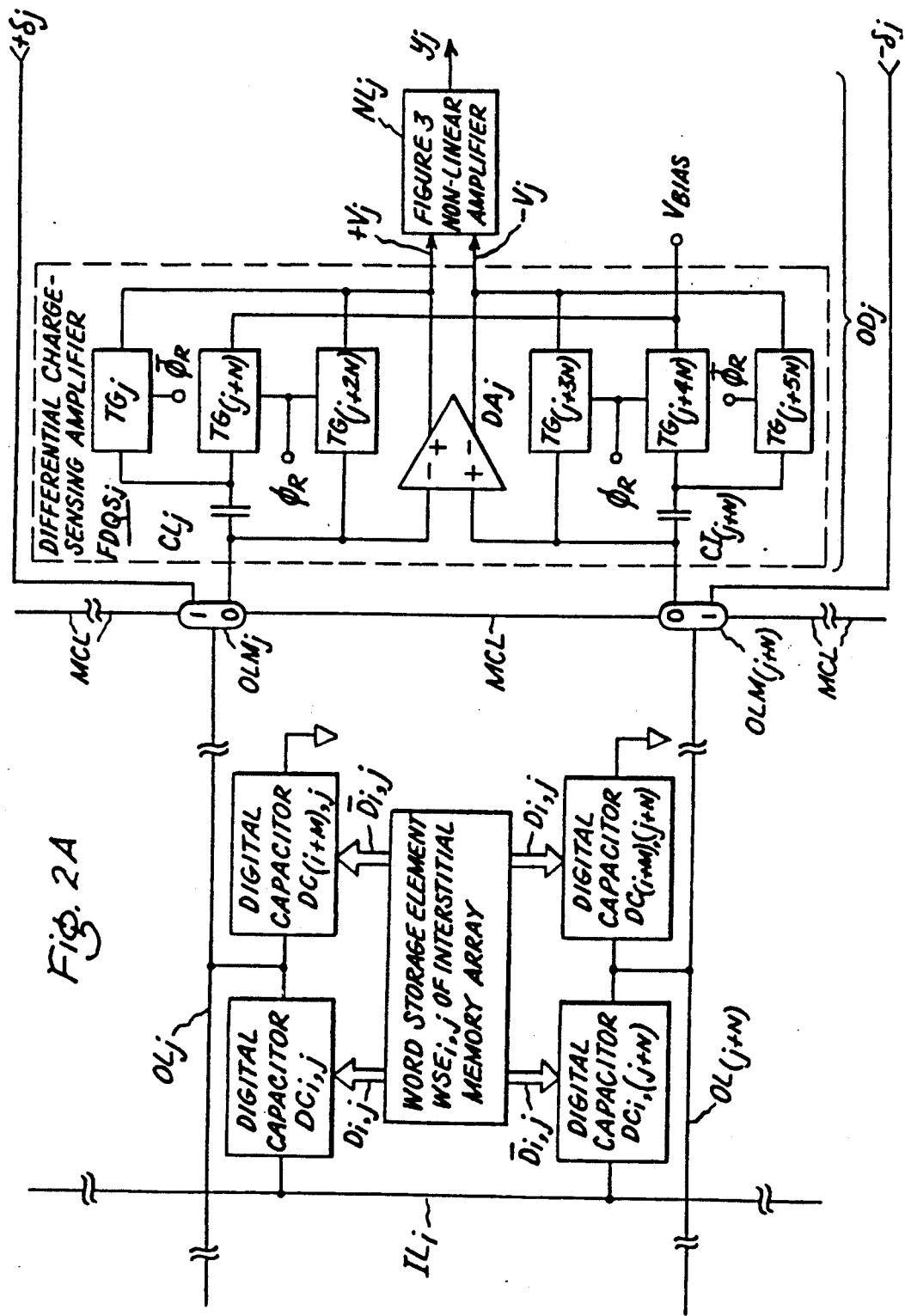

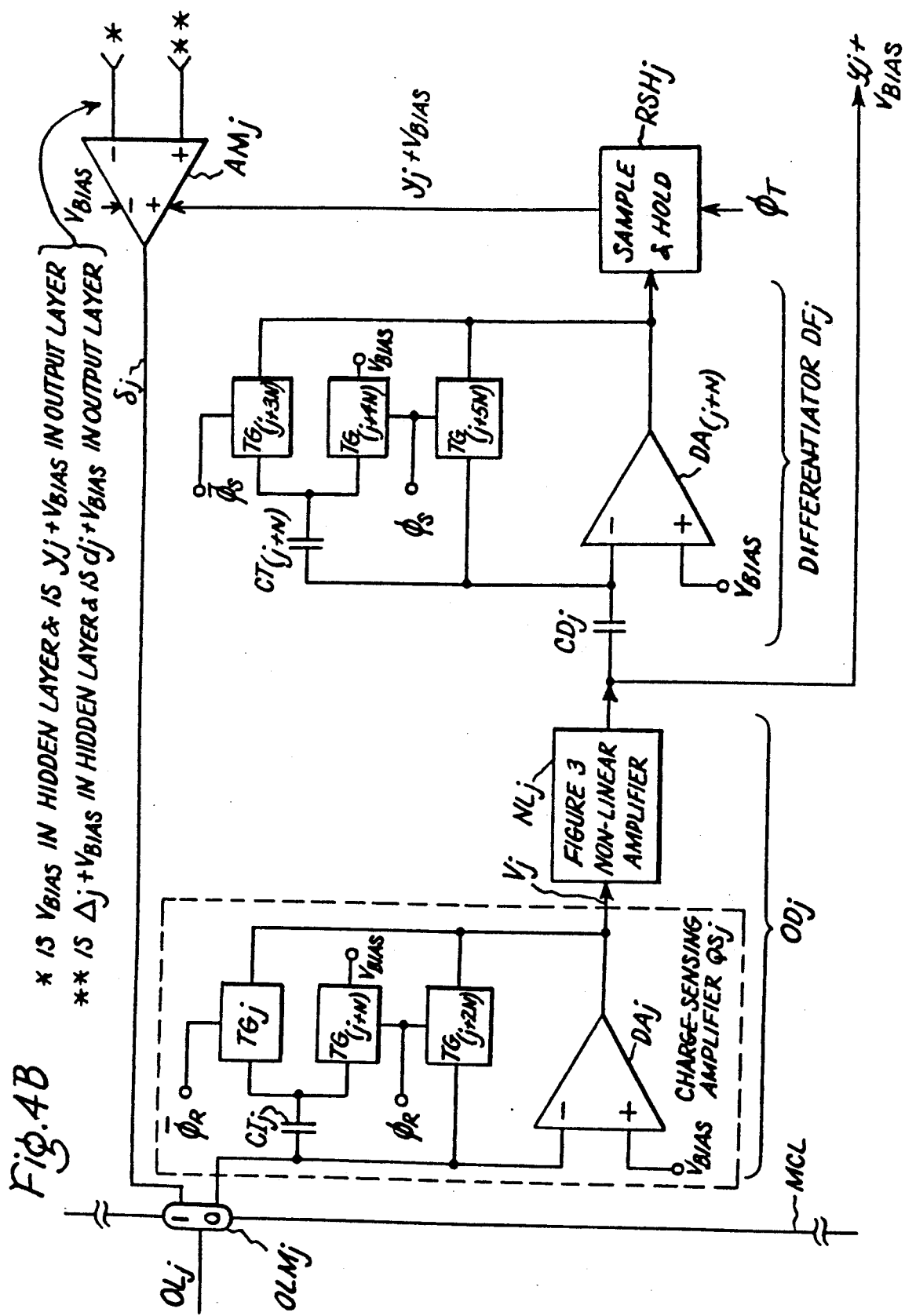

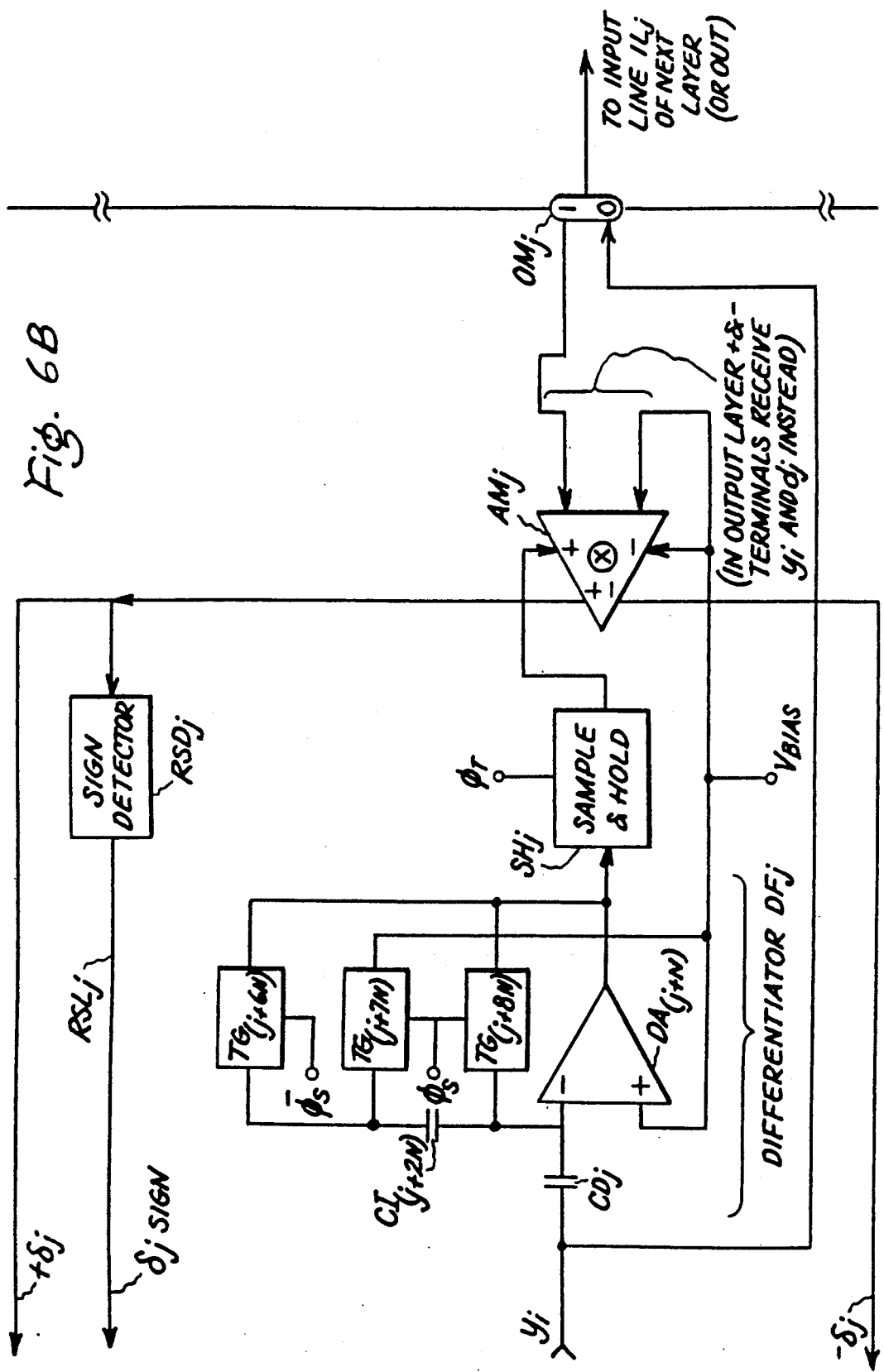

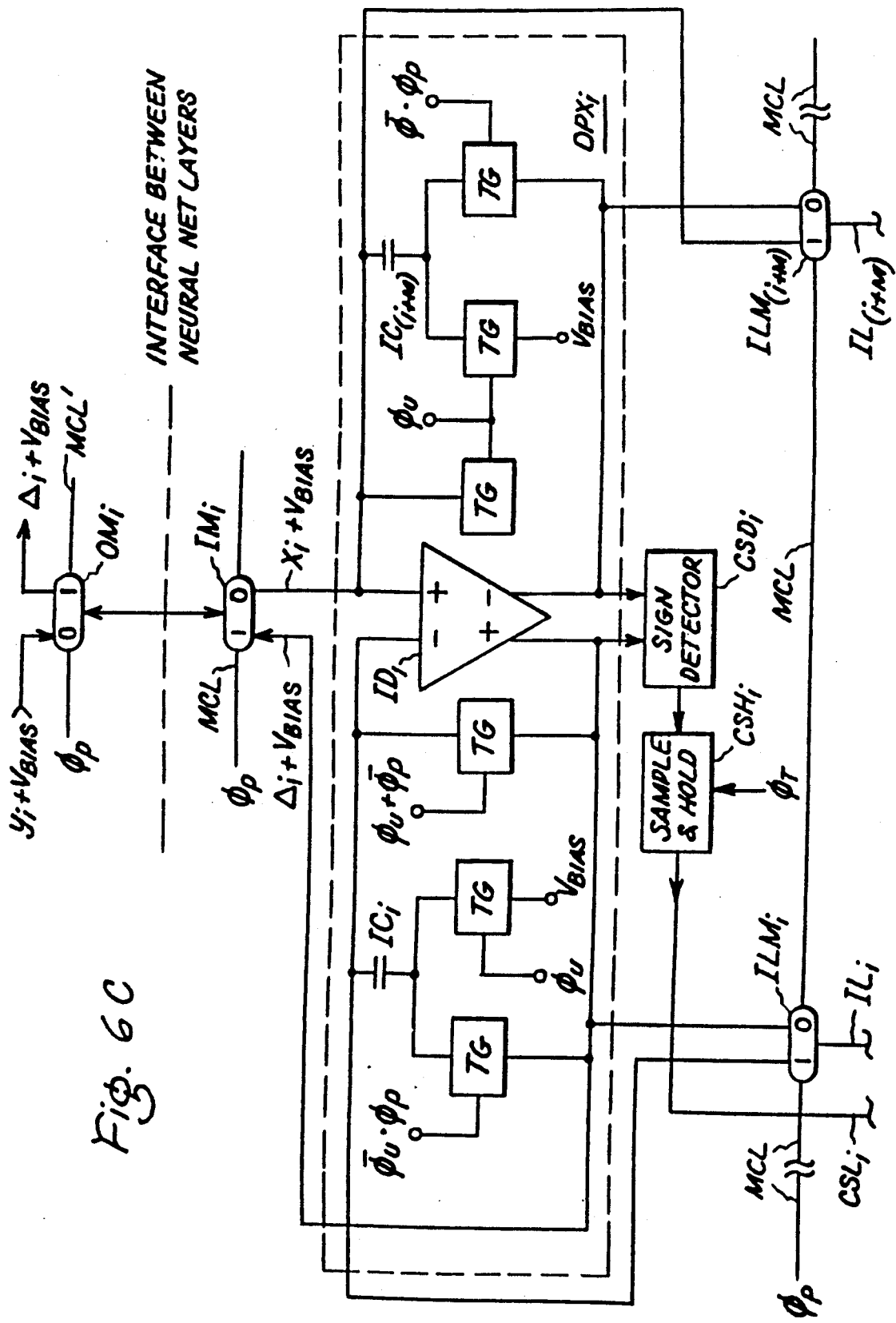

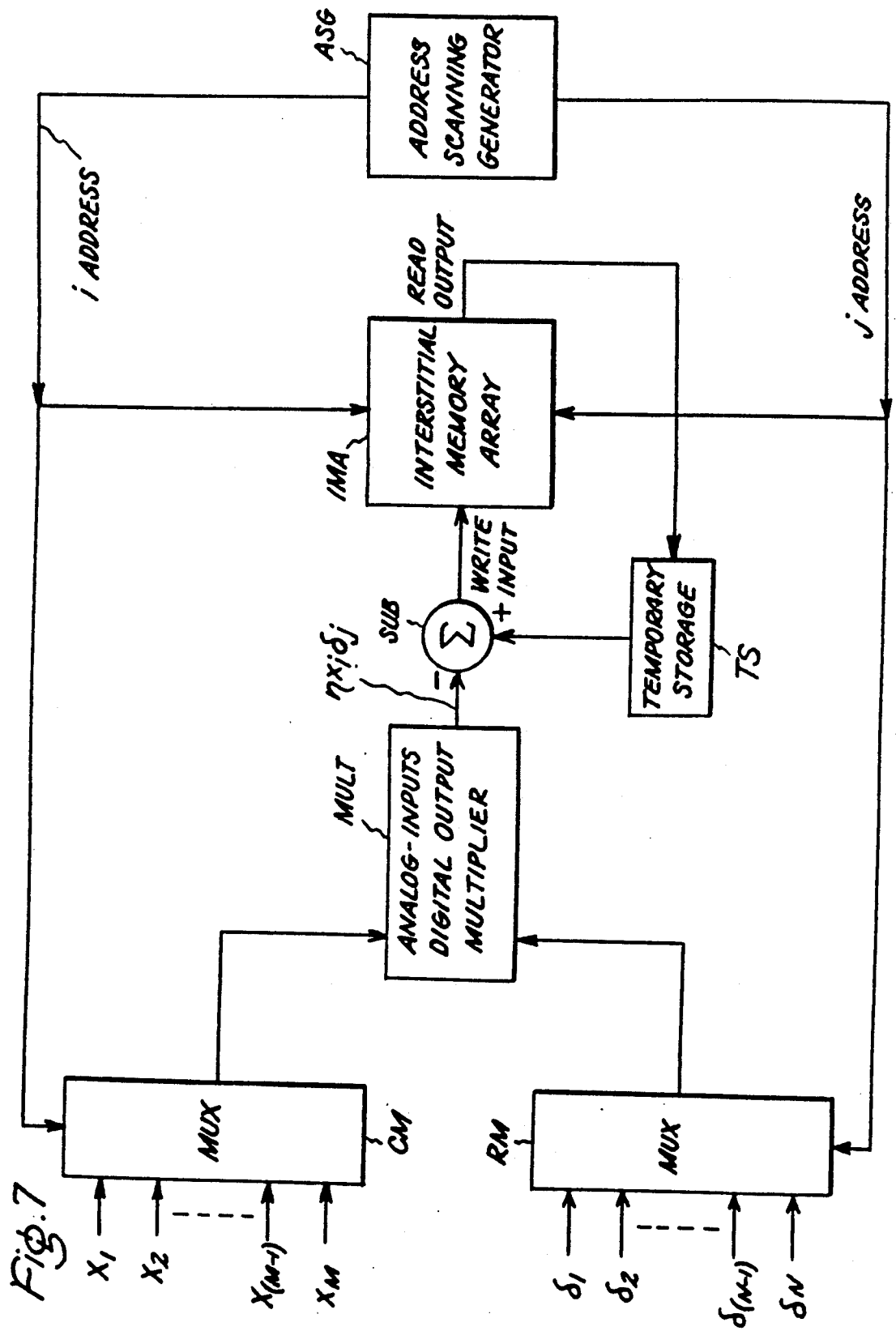

CAPACITANCES OF FIGURE 9 CAPACITOR QUAD

| WEIGHTING WORD | NEGATIVE LINE CAPACITANCE | POSITIVE LINE CAPACITANCE |
|---|---|---|
| 0111 | 0+0+0+0.0+0.5 | 4+2+1+0.5 |
| 0110 | 0+0+0+0.5+0.5 | 4+2+1+0.0 |
| 0101 | 0+0+1+0.0+0.5 | 4+2+0+0.5 |
| 0100 | 0+0+1+0.5+0.5 | 4+2+0+0.0 |
| 0011 | 0+2+0+0.0+0.5 | 4+0+1+0.5 |
| 0010 | 0+2+0+0.5+0.5 | 4+0+1+0.0 |
| 0001 | 0+2+1+0.0+0.5 | 4+0+0+0.5 |
| 0000 | 0+2+1+0.5+0.5 | 4+0+0+0.0 |
| 1111 | 4+0+0+0.0+0.5 | 0+2+1+0.5 |
| 1110 | 4+0+0+0.5+0.5 | 0+2+1+0.0 |
| 1101 | 4+0+1+0.0+0.5 | 0+2+0+0.5 |
| 1100 | 4+0+1+0.5+0.5 | 0+2+0+0.0 |
| 1011 | 4+2+0+0.0+0.5 | 0+0+1+0.5 |
| 1010 | 4+2+0+0.5+0.5 | 0+0+1+0.0 |
| 1001 | 4+2+1+0.0+0.5 | 0+0+0+0.5 |
| 1000 | 4+2+1+0.5+0.5 | 0+0+0+0.0 |

*FIG. 10*

CAPACITANCES OF FIGURE 11 CAPACITOR QUAD

| WEIGHTING WORD | NEGATIVE LINE CAPACITANCE | POSITIVE LINE CAPACITANCE |
|---|---|---|
| 01000 | 0+0.0+0+0+0.0 | 4+0.5+2+1+0.5 |
| 00111 | 0+0.5+0+0+0.0 | 4+0.0+2+1+0.5 |
| 00110 | 0+0.5+0+0+0.5 | 4+0.0+2+1+0.0 |
| 00101 | 0+0.5+0+1+0.0 | 4+0.0+2+0+0.5 |
| 00100 | 0+0.5+0+1+0.5 | 4+0.0+2+0+0.0 |
| 00011 | 0+0.5+2+0+0.0 | 4+0.0+0+1+0.5 |
| 00010 | 0+0.5+2+0+0.5 | 4+0.0+0+1+0.0 |
| 00001 | 0+0.5+2+1+0.0 | 4+0.0+0+0+0.5 |
| 00000 | 0+0.5+2+1+0.5 | 4+0.0+0+0+0.0 |
| 11111 | 4+0.0+0+0+0.0 | 0+0.5+2+1+0.5 |
| 11110 | 4+0.0+0+0+0.5 | 0+0.5+2+1+0.0 |
| 11101 | 4+0.0+0+1+0.0 | 0+0.5+2+0+0.5 |
| 11100 | 4+0.0+0+1+0.5 | 0+0.5+2+0+0.0 |
| 11011 | 4+0.0+2+0+0.0 | 0+0.5+0+1+0.5 |
| 11010 | 4+0.0+2+0+0.5 | 0+0.5+0+1+0.0 |
| 11001 | 4+0.0+2+1+0.0 | 0+0.5+0+0+0.5 |
| 11000 | 4+0.0+2+1+0.5 | 0+0.5+0+0+0.0 |
| 10111 | 4+0.5+2+1+0.5 | 0+0.0+0+0+0.0 |

*FIG. 12*

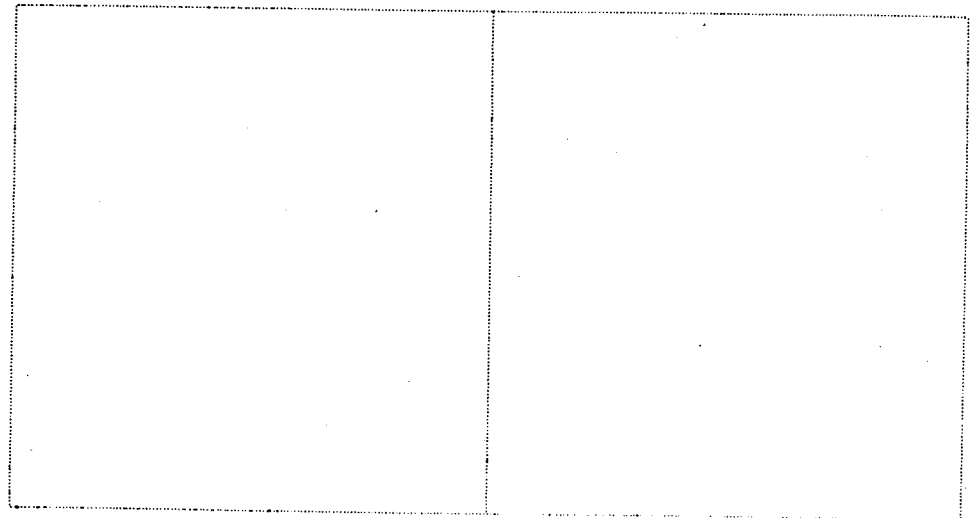
FIG. 15

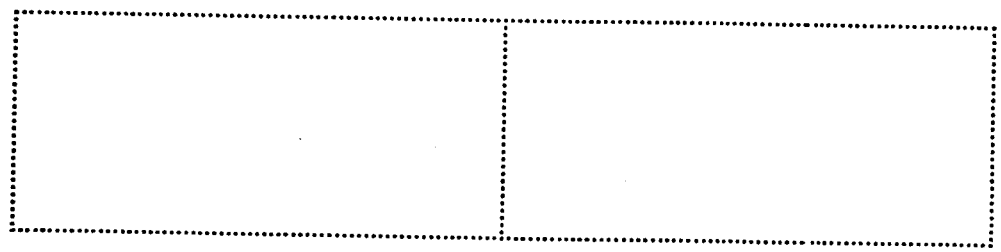
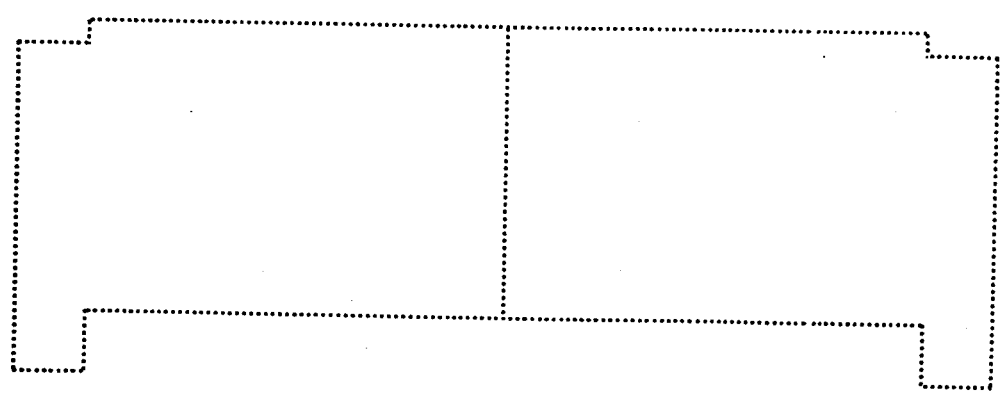
FIG. 18

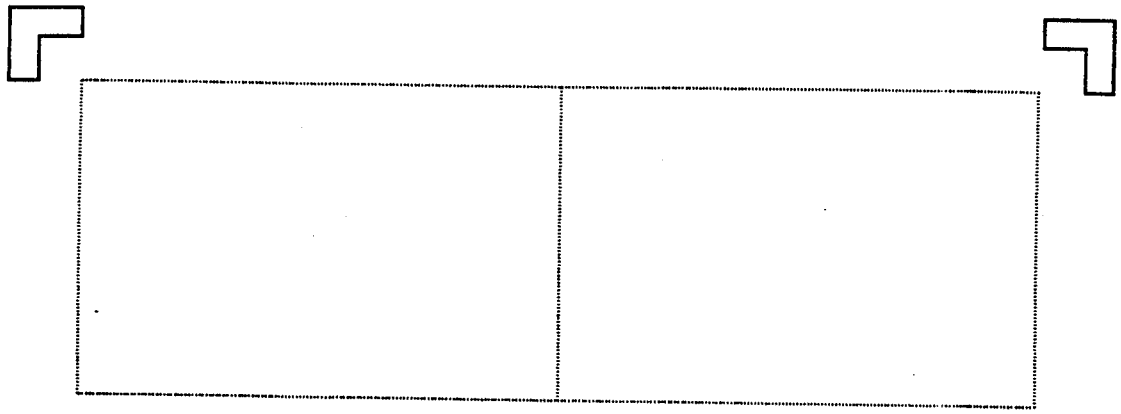
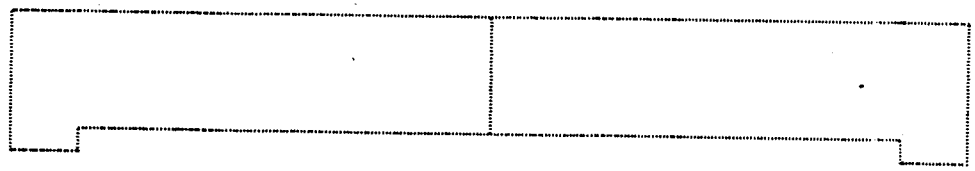
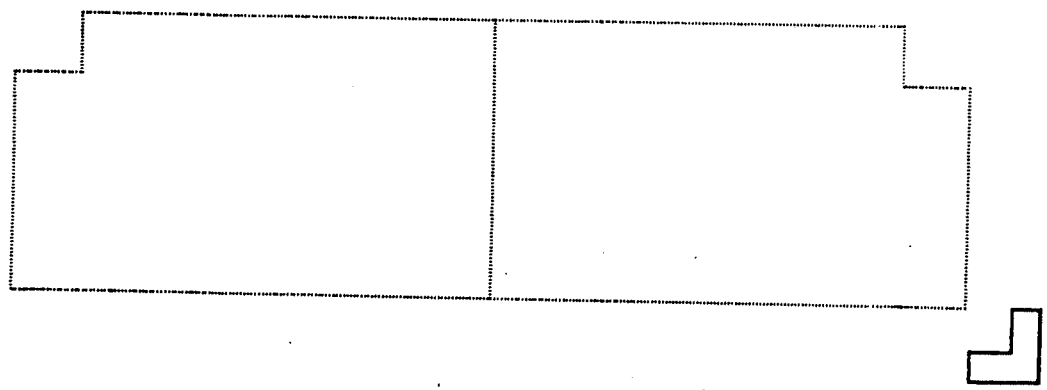
FIG. 19

Ⓜ GENERAL ELECTRIC COMPANY

WEIGHTED SUMMATION CIRCUITS HAVING DIFFERENT-WEIGHT RANKS OF CAPACITIVE STRUCTURES

The invention relates to capacitive structures, as can be realized using complementary metal-oxide-semiconductor (CMOS) technology, that can implement weighted summation procedures and are useful in neural nets, which emulate portions of a brain in operation.

BACKGROUND OF THE INVENTION

The networking ability of the neurons in the brain has served as a model for the formation of a highly interconnected set of processors, called a "neural network" or "neural net" that can provide computational and reasoning functions without the need of formal programming. The neural nets can learn the correct procedure by experience rather than being preprogrammed for performing the correct procedure. The reader is referred to R. P. Lippmann's article "An Introduction to Computing With Neural Nets" appearing on pages 4-21 of the April 1987 IEEE ASSP MAGAZINE (0740-7467/87/0400-0004/$10.00"1987 IEEE), incorporated herein by reference, for background about the state of the art in regard to neural nets.

Neural nets are composed of a plurality of neuron models, processors each exhibiting "axon" output signal response to a plurality of "synapse" input signals. In a type of neural net called a "perceptron", each of these processors calculates the weighted sum of its "synapse" input signals, which are respectively weighted by respective weighting values that may be positive- or negative-valued, and responds non-linearly to the weighted sum to generate the "axon" output response. This relationship may be described in mathematical symbols as follows.

$$v_j = f\left(\sum_{i=1}^{M} W_{i,j} x_i\right) \quad j = 1, 2, \ldots N \quad (1)$$

Here, i indexes the input signals of the perceptron, of which there are an integral number M, and j indexes its output signals, of which there are an integral number N. $W_{i,j}$ is the weighting of the $i^{th}$ input signal as makes up the $j^{th}$ output signal at such low input signal levels that the function $$f\left(\sum_{i=1}^{M} W_{i,j} x_i\right)$$

is approximately linear. At higher absolute values of its argument, the function $$f\left(\sum_{i=1}^{M} W_{i,j} x_i\right)$$

no longer exhibits linearity but rather exhibits a reduced response to $$\sum_{i=1}^{M} W_{i,j} x_i.$$

A more complex artificial neural network arranges a plurality of perceptrons in hierarchic layers, the output signals of each earlier layer providing input signals for the next succeeding layer. Those layers preceding the output layer providing the ultimate output signal(s) are called "hidden" layers.

The processing just described normally involves sampled-data analog signals, and prior-art neural nets have employed operational amplifiers with resistive interconnecting elements for the weighting and summing procedures. The resistive elements implement weighted summation being done in accordance with Ohm's Law. The speed of such a processor is limited by capacitances in various portions of the processor, and computations have been slow if the power consumption of a reasonably large neural net is to be held within reasonable bounds. That is, speed is increased by reducing resistance values to reduce RC time constants in the processors, but the reduced resistance values increase the $V^2/R$ power consumption (R, C and V being resistance, capacitance and voltage, respectively.) Using capacitors to perform weighted summation in accordance with Coulomb's Law provide neural nets of given size operating at given speed that consume less power than those the processors which use resistors to implement weighted summation in accordance with Ohm's Law. Y. P. Tsividis and D. Anastassion in a letter "Switched-Capacitor Neural Networks" appearing in ELECTRONICS LETTERS, 27th Aug. 1987, Vol. 23, No. 18, pages 958,959 (IEE) describe one method of implementing weighted summation in accordance with Coulomb's Law. Their method, a switched capacitor method, is useful in analog sampled-data neural net systems. However, a method of implementing weighted summation in accordance with Coulomb's Law that does not rely on capacitances being switched is highly desirable, it has been pointed out by W. E. Engeler in U.S. patent applications Ser. Nos. 366,838 and 366,839 respectively entitled "NEURAL NET USING CAPACITIVE STRUCTURES CONNECTING INPUT LINES AND DIFFERENTIALLY SENSED OUTPUT LINE PAIRS" and "NEURAL NET USING CAPACITIVE STRUCTURES CONNECTING OUTPUT LINES AND DIFFERENTIALLY DRIVEN INPUT LINE PAIRS", both of which applications were filed 15 June 1989 and are assigned to General Electric Company. This avoids the complexity of the capacitor switching elements and associated control lines. Furthermore, operation of the neural net with continuous analog signals over sustained periods of time, as well as with sampled data analog signals, is thus made possible.

A problem that is encountered when one attempts to use capacitors to perform weighted summation in a neural net layer is associated with the stray capacitance between input and output lines, which tends to be of appreciable size in neural net layers constructed using a metal-oxide-semiconductor (MOS) integrated circuit technology. The input and output lines are usually laid out as overlapping column and row busses using plural-layer metallization. The column busses are situated in one layer of metallization and the row busses are situated in another layer of metallization separated from the other layer by an intervening insulating oxide layer. This oxide layer is thin, so there is appreciable capacitance at each crossing of one bus over another. The fact of the row and column busses being in different planes tends to increase stray capacitances between them. The stray capacitance problem is also noted where both row and column busses are situated in the same metallization layer with one set of busses being periodically interrupted in their self-connections to allow passage of the other set of busses and being provided with cross-over connections to complete their self-connections. The problem of stray capacitance is compounded by the fact that the capacitive elements used to provide weights in a capacitive voltage summation network have stray capacitances to the substrate of the monolithic integrated circuit in which they are incorporated; a perfect two-terminal capacitance is not actually available in the monolithic integrated circuit. Where capacitive elements having programmable capacitances are used, capacitance is usually not programmable to zero value, either.

The problems of stray capacitance are solved in the above-cited U.S. patent application Ser. No. 366,838 entitled "NEURAL NET USING CAPACITIVE STRUCTURES CONNECTING INPUT LINES AND DIFFERENTIALLY SENSED OUTPUT LINE PAIRS" by using output line pairs and sensing the charge conditions on the output lines of each pair differentially so that the effects of stray capacitances tend to cancel each other out. These output line pairs facilitate both excitory and inhibitory weights—that is, both positive- and negative-polarity $W_{i,j}$—in effect to be achieved without having to resort to capacitor switching to achieve negative capacitance.

The foregoing problems of stray capacitance are solved in the above-cited U.S. patent application Ser. No. 366,839 entitled "NEURAL NET USING CAPACITIVE STRUCTURES CONNECTING OUTPUT LINES AND DIFFERENTIALLY DRIVEN INPUT LINE PAIRS" by using balanced input line pairs, so that the effects of stray capacitance from each output line tend to cancel each other. Driving paired input lines with balanced input signals also allows both excitory and inhibitory weights—that is, both positive- and negative-polarity $W_{i,j}$—in effect to be achieved without having to resort to capacitor switching in order to achieve negative capacitance. The $W_{i,j} x_i$ terms are obtained by summing weighted $x_i$ and $-x_i$ balanced input signals.

Neural nets employing capacitors in accordance with the U.S. patent applications Ser. Nos. 366,838 and 366,839 lend themselves to being used in performing parts of the computations needed to implement a back-propagation training algorithm. The back-propagation training algorithm is an iterative gradient algorithm designed to minimize the mean square error between the actual output of a multi-layer feed-forward neural net and the desired output. It requires continuous differentiable non-linearities. A recursive algorithm starting at the output nodes and working back to the first hidden layer is used iteratively to adjust weights in accordance with the following formula.

$$W_{i,j}(t+1) = W_{i,j}(t) - \eta \delta_j x_i \quad (2)$$

In this equation $W_{i,j}(t)$ is the weight from hidden node i (or, in the case of the first hidden layer, from an input node) to node j at time t; $x_i$ is either the output of node i (or, in the case of the first hidden layer, is an input signal); $\eta$ is a gain term introduced to maintain stability in the feedback procedure used to minimize the mean square errors between the actual output(s) of the perceptron and its desired output(s); and $\delta_j$ is a derivative of error. The general definition of $\delta_j$ is the change in error energy from output node j of a neural net layer with a change in the weighted summation of the input signals used to supply that output node j.

Lippman presumes that a particular sigmoid logistic non-linearity is used. Presuming the non-linearity of processor response is to be defined not as restrictively as Lippmann does, then $\delta_j$ can be more particularly defined as in equation (2), following, if node j is an output node, or as in equation (3), following, if node j is an internal hidden node.

$$\delta_j = y_j'(d_j - y_j) \quad (3)$$

$$\delta_j = y_j' \sum_k \delta_k W_{j,k} \quad (4)$$

In equation (3) $d_j$ and $y_j$ are the desired and actual values of output response from the output layer and $y_j'$ is differential response of $y_j$ to the non-linearity in the output layer—i.e., the slope of the transfer function of that non-linearity. In equation (4) k is over all nodes in the neural net layer succeeding the hidden node j under consideration and $W_{j,k}$ is the weight between node j and each such node k. The term $y_j'$ is defined in the same way as in equation (3).

The general definition of the $y_j'$ term appearing in equations (3) and (4), rather than that general term being replaced by the specific value of $y_j'$ associated with a sigmoid logistic non-linearity, is the primary difference between the training algorithm as described here and as described by Lippmann. Also, Lippmann defines $\delta_j$ in opposite polarity from equations (1), (3) and (4) above.

During training of the neural net, prescribed patterns of input signals are sequentially repetitively applied, for which patterns of input signals there are corresponding prescribed patterns of output signals known. The pattern of output signals generated by the neural net, responsive to each prescribed pattern of input signals, is compared to the prescribed pattern of output signals to develop error signals, which are used to adjust the weights per equation (2) as the pattern of input signals is repeated several times, or until the error signals are detected as being negligibly valued. Then training is done with the next set of patterns in the sequence. During extensive training the sequence of patterns may be recycled.

SUMMARY OF THE INVENTION

The present invention also generally concerns neural nets the processors of which use capacitors to perform weighted summation in accordance with Coulomb's Law. More particularly, the present invention concerns weighted summation circuitry using capacitive elements and how weights with a plurality, B in number, of bits of resolution can be provided using capacitive elements the largest and smallest of which have respective capacitances in a ratio substantially less than $2^B$: 1. In accordance with the invention, the weighted summation is done on a digit-sliced basis, the weighted summation circuitry including a plurality, R in number, of capacitance networks each of a type to perform weighting and summing on a normalized basis for each digit-slice of the weighting factors, the respective partial weighted summation results from which are weighted and summed to generate a final weighted summation result.

The input signals to the weighted summation circuitry are weighted by respective weighting factors. Each of the weighting factors is expressed as a respective plurality of portions of different weighting significance, the portions being R in number. The portions of the weighting factors that have the same weighting significance constitute a rank of values. These ranks of values are normalized by dividing each of them by its respective weighting significance. R ranks of capacitors are connected in R respective networks that sum the input signals, as weighted respectively by each of the ranks of normalized values, to get normalized respective partial summation results. To generate a final weighted summation result, means are provided to sum the respective partial summation results provided from the R respective networks, after the respective partial summation results have been weighted by their corresponding weighting significances to remove normalization. Where the weighted summation circuitry is used in a neural net layer, this final weighted summation result is supplied to a non-linear amplifier with sigmoidal transfer characteristic to obtain an axonal response to the synaptic input signals after their weighted summation.

BRIEF DESCRIPTION OF THE DRAWING

FIGS. 2A and 2B together form a FIG. 2 that is a schematic diagram of a modification of the FIG. 1 neural net that can be made manifold times to provide for the programmable weighting of the capacitances used in performing weighted summation of synapse signals.

FIGS. 4A and 4B together form a FIG. 4 that is a schematic diagram of a modification of the FIG. 3 neural net that can be made manifold times to provide for the programmable weighting of the capacitances used in performing weighted summation of synapse signals.

FIGS. 6A, 6B and 6C together form a FIG. 6 that is a schematic diagram of another neural net described by W. E. Engeler in U.S. patent application Ser. No. 366,838, which other neural net uses pairs of input lines driven by balanced input signals for connection to the pairs of differentially sensed output lines by weighting capacitors connected in quad configurations and operated as full bridges.

FIG. 7 is a schematic diagram of training apparatus described by W. E. Engeler in U.S. patent applications Ser. Nos. 366,838 and 366,839, which training apparatus can be used with the FIG. 1 neural net layer manifoldly modified per FIG. 2, with the FIG. 3 neural net layer manifoldly modified per FIG. 5, or with the FIG. 1 neural net layer manifoldly modified per FIG. 6.

FIG. 10 is a table indicating the disposition of capacitive elements as components of the FIG. 9 pair of capacitors as determined by the digital words encoding weighting factor in two's complement arithmetic.

FIG. 12 is a table indicating the disposition of capacitive elements as components of the FIG. 11 pair of capacitors as determined by the digital words encoding weighting factor in one's complement arithmetic.

FIG. 15 is the mask defining the extent of the n-well region in a p-type silicon die, which n-well region underlies portions of a FIG. 14 double switched capacitor structure.

FIG. 18 is the mask defining the extent of the p+ implant used for establishing the source and drain regions of the p-channel field-effect transistors and for contacting to the p-type silicon substrate in a FIG. 14 double switched capacitor structure.

FIG. 19 is the mask defining the extent of the n+ contacts to n-well and of the n+ source and drain regions of the n-channel field-effect transistors in a FIG. 14 double switched capacitor structure.

Figure 26:
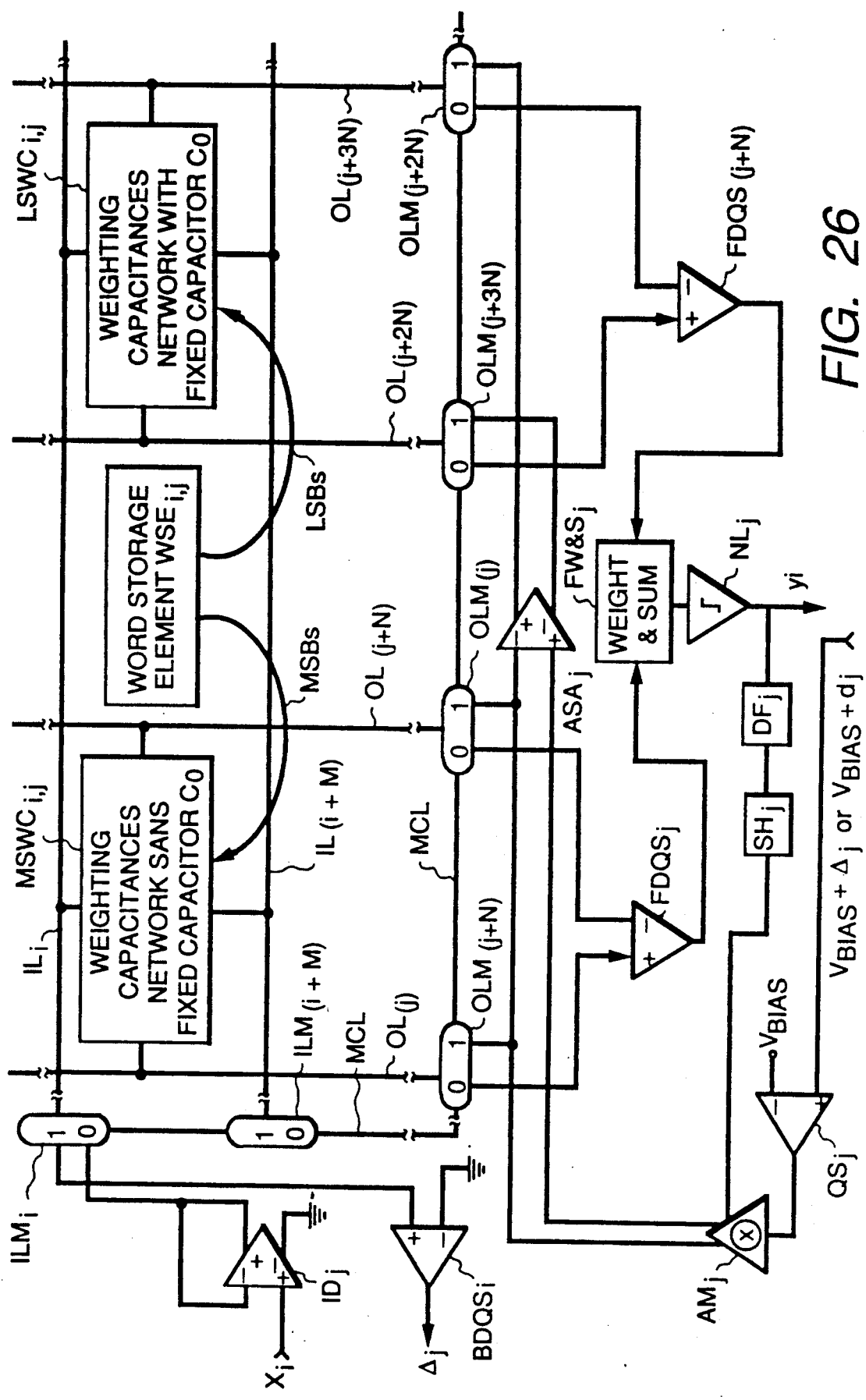
Figure 27:
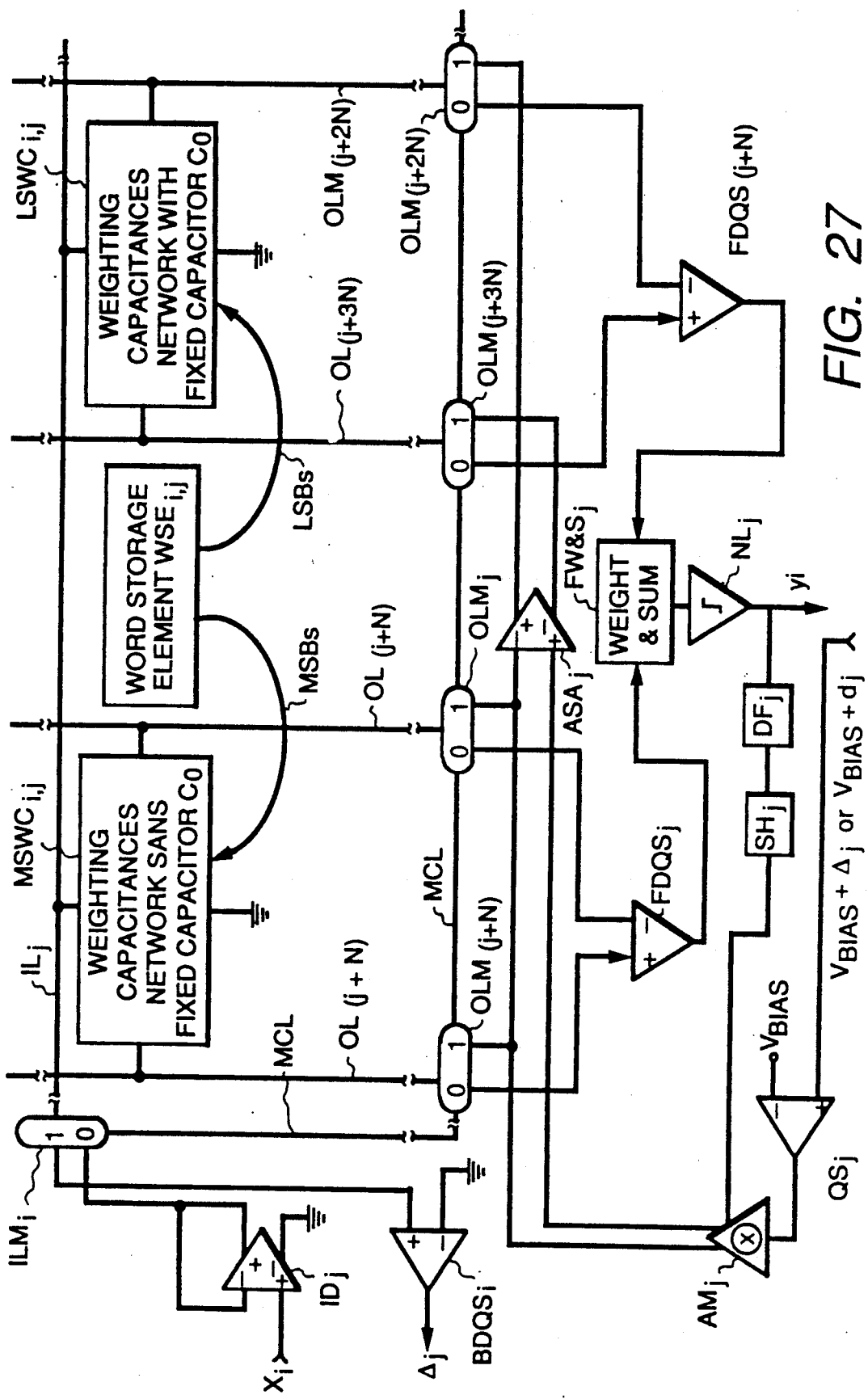
Figure 28:
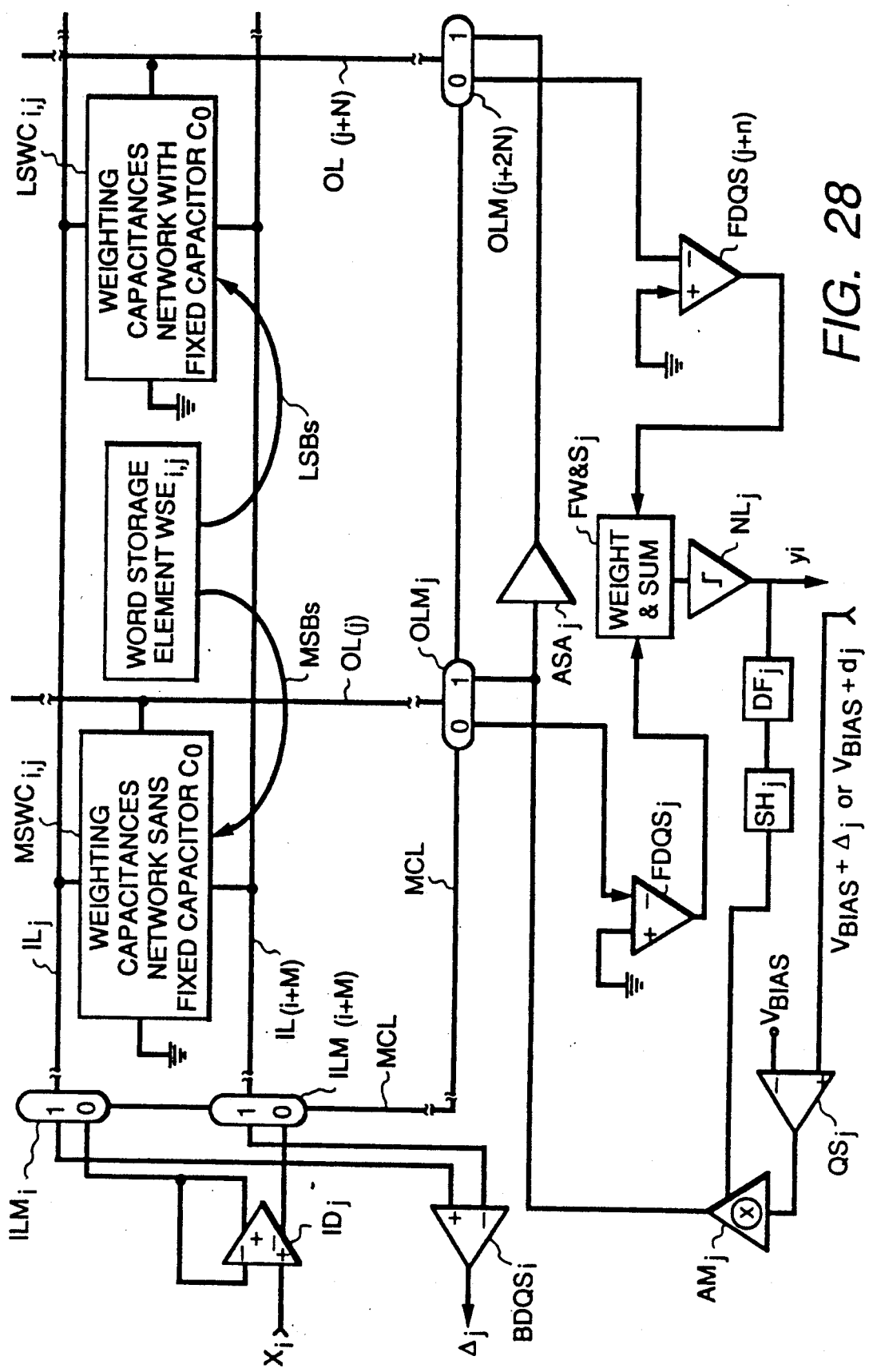

Each of FIGS. 26, 27 and 28 is a schematic diagram of a neural net layer wherein in accordance with the invention weighting with higher bit resolution is provided without having to have as wide a range of weighting capacitor sizes.

Figure 29:
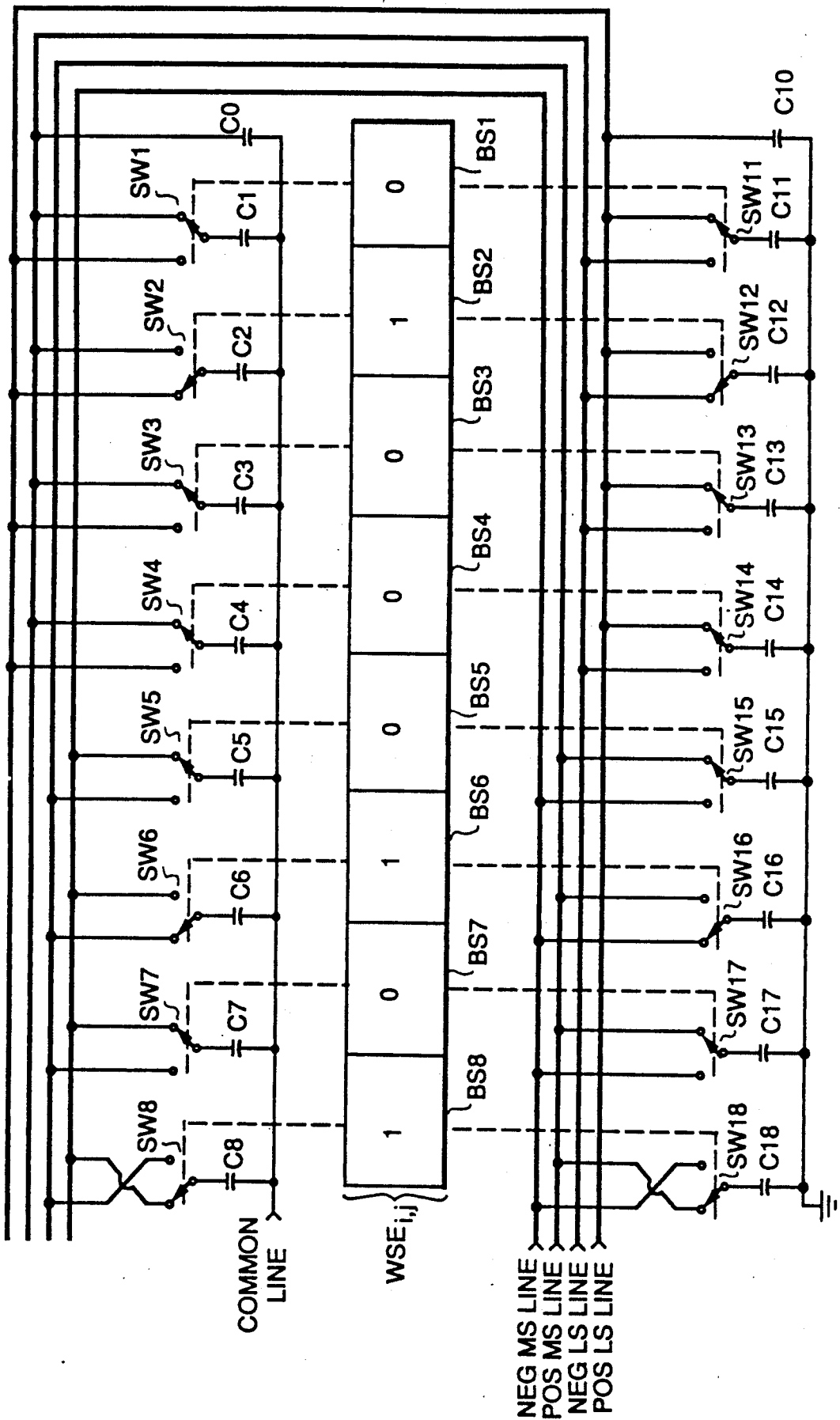
Figure 30:
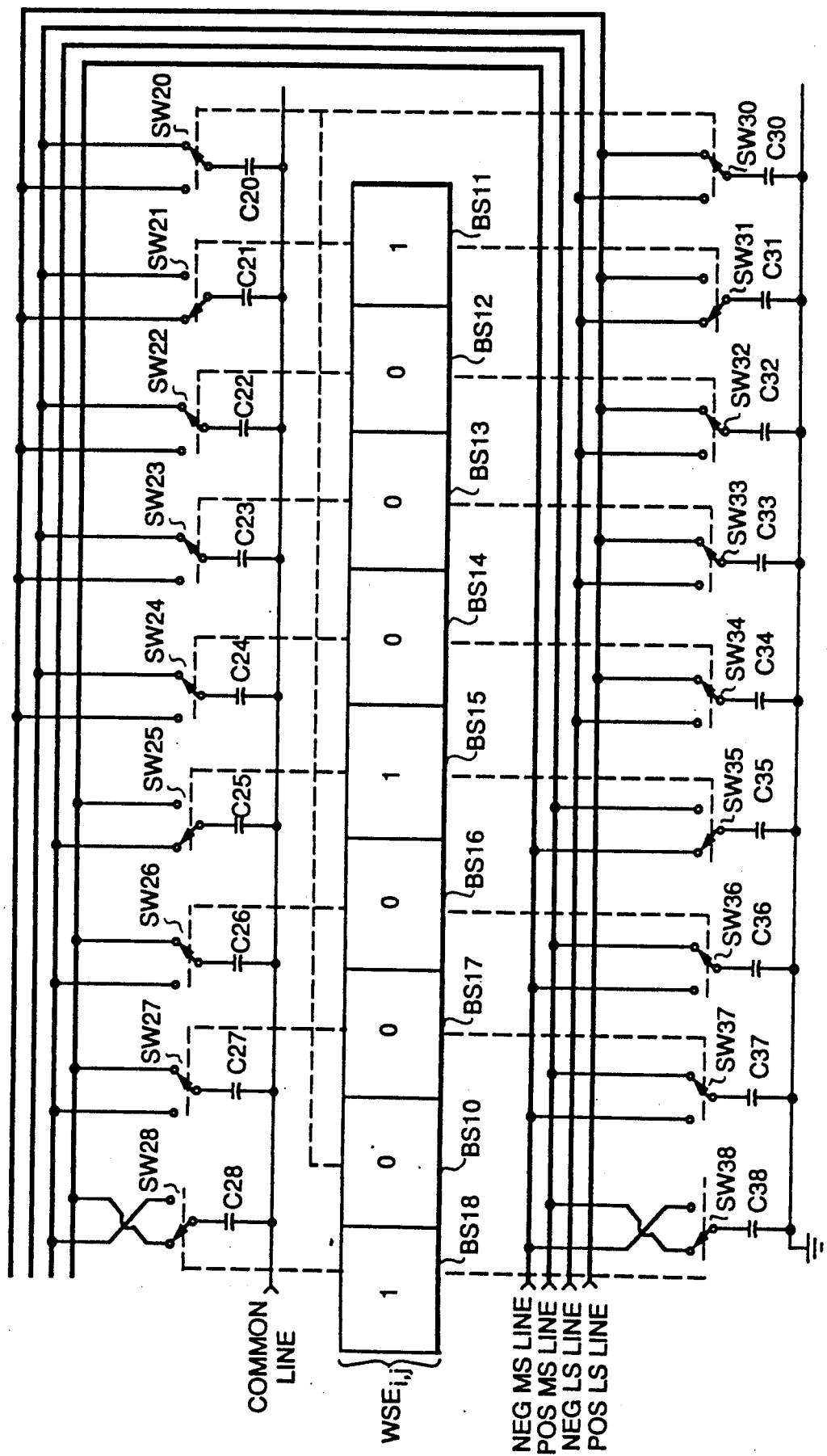

Each of FIGS. 29 and 30 is a conceptual schematic diagram of capacitor quads constructed in accordance with the invention to implement weighting with higher bit resolution in a neural net layer per FIG. 26, 27 or 28.

DETAILED DESCRIPTION

Figure 1:
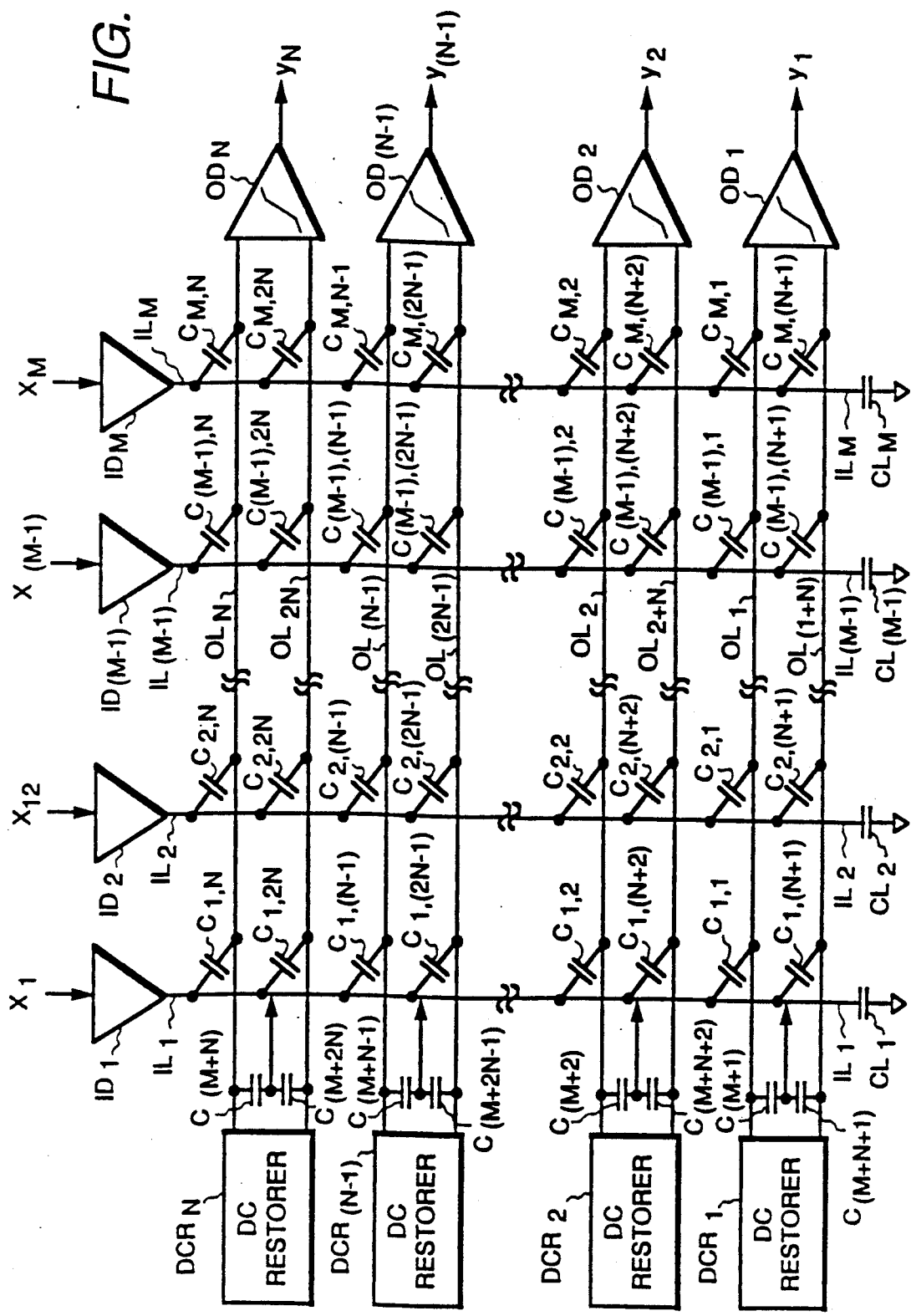
FIG. 1 is a schematic diagram of a neural net layer as described by W. E. Engeler in U.S. patent application Ser. No. 366,838 entitled "NEURAL NET USING CAPACITIVE STRUCTURES CONNECTING INPUT LINES AND DIFFERENTIALLY SENSED OUTPUT LINE PAIRS", which neural net layer uses capacitors to perform weighted summations of synapse signals to be subsequently sensed and non-linearly amplified to generate axon response signals.

FIG. 1 shows a neural net comprising a plurality, N in number, of non-linear amplifiers $OD_1$, $OD_2$, ... $OD_{(N-1)}$, $OD_N$. Each of a plurality, M in number, of input voltage signals $x_1$, $x_2$, ... $x_{(M-1)}$, $x_M$ supplied as "synapse" signals is weighted to provide respective input voltages for the non-linear voltage amplifiers $OD_1$, $OD_2$, ... $OD_{(N-1)}$, $OD_N$, which generate respective "axon" responses $y_1$, $y_2$, ... $y_{(N-1)}$, $y_N$. This weighting is, as will be described in detail further on in this specification, done using capacitive structures.

M is a positive plural integer indicating the number of input synapse signals to the FIG. 1 neural net, and N is a positive plural integer indicating the number of output axon signals the FIG. 1 net can generate. To reduce the written material required to describe operation of the FIG. 1 neural net, operations using replicated elements will be described in general terms; using a subscript i ranging over all values one through M for describing operations and apparatuses as they relate to the (column) input signals $x_1$, $x_2$, ... $x_{(M-1)}$, $x_M$; and using a subscript j ranging over all values one through N for describing operations and apparatus as they relate to the (row) output signals $y_1$, $y_2$, ... $y_{(N-1)}$, $Y_N$. That is, i and j are the column and row numbers used to describe particular portions of the neural net.

Input voltage signal $x_i$ is applied to the input port of an input driver amplifier $ID_i$ that is a voltage amplifier which in turn applies its voltage response to an input line $IL_i$. Respective output lines $OL_j$ and $OL_{(j+N)}$ connect to the non-inverting input port of output driver amplifier $OD_j$ and to its inverting input port. The non-linear output driver amplifier $OD_j$ is shown in FIG. 1 as simply being a differential-input non-linear voltage amplifier with the quiescent direct potential applied to its (+) and (−) input signal terminals via output lines $OL_j$ and $OL_{(j+N)}$ being adjusted by clamping to a desired bias voltage at selected times using a respective direct-current restorer circuit $DCR_j$. (The direct-current restorer circuit $DCR_j$ is shown at the left of FIG. 1 for drafting reasons, but is normally associated with the input port of the output driver amplifier $OD_j$.) Output driver amplifier $OD_j$ generates at its output port a non-linear voltage response to the cumulative difference in charge on that respective pair of output lines $OL_j$ and $OL_{(j+N)}$.

A respective capacitor $C_{i,j}$ connects each of the input lines $IL_i$ to each of the output lines $OL_j$, and a respective capacitor $C_{i,(j+N)}$ connects each of the input lines $IL_i$ to each of the output lines $OL_{(j+N)}$. Since at its output terminal the output driver amplifier $OD_j$ responds without inversion to $x_i$ input signal voltage applied to its non-inverting (+) input terminal via capacitor $C_{i,j}$ and responds with inversion to $x_i$ input signal voltage applied to its inverting (−) input terminal via capacitor $C_{i,(j+N)}$, respectively, the electrically equivalent circuit is $x_i$ signal voltage being applied to a single output line $OL_j$ by a capacitor having a capacitance that equals the capacitance of $C_{i,j}$ minus the capacitance of $C_{i,(j+N)}$. This technique of single-ended output signal drive to paired output lines that are differentially sensed avoids the need for switched-capacitance techniques in order to obtain inhibitory (or negative) weights as well as excitory (or positive) weights. Thus, this technique facilitates operating the neural net with analog signals that are continuous over sustained periods of time, if so desired.

FIG. 1 shows each of the input lines $IL_i$ as being provided with a respective load capacitor $CL_i$ to cause that capacitive loading upon the output port of the input driver amplifier $ID_i$ to be substantially the same as that upon each output port of the other input driver amplifiers. This is desirable for avoiding unwanted differential delay in responses to the input signals $x_i$. Substantially equal capacitive loading can be achieved by making the capacitance of each of the input line loading capacitors, $CL_1$ through $CL_M$, very large compared to the total capacitance of the capacitors $C_{i,j}$ connecting thereto. Preferably, however, this result is achieved by making the capacitance of each of the input line loading capacitors complement the combined value of the other capacitances connecting thereto. This procedure reduces the amount of line loading capacitance required. Where the voltages appearing on the output lines $OL_j$ and $OL_{(j+N)}$ are sensed directly by the non-linear output driver amplifiers $OD_1$, ... $OD_N$, as shown in FIG. 1, this procedure makes the voltage division ratio for each input voltage $x_i, \ldots x_m$ independent of the voltage division ratios for the other input voltages.

FIG. 1 also shows each of the output lines $OL_j$ being loaded with a respective load capacitor $CL_{(M+j)}$ and each of the output lines $OL_{(N+j)}$ being loaded with a respective load capacitor $CL_{(M+N+j)}$. This is done so that the total capacitance on each output line remains substantially the same as on each of the other output lines. This can be done by choosing $CL_{(M+j)}$ to be much larger than other capacitances to output line $OL_j$, and by choosing $CL_{(M+N+j)}$ to be much larger than other capacitances to output line $OL_{N+j}$. Alternatively, this can be done by choosing $CL_{(M+j)}$ and $CL_{(M+N+j)}$ to complement the combined value of the other capacitances connecting the same output line. The input voltage to output driver amplifier $OD_j$ will (to good approximation) have the following value, $v_j$, in accordance with Coulomb's Law.

$$v_j = (C_j)^{-1} \sum_{i=1}^{M} (C_{i,j} - C_{i,(j+N)}) x_i \quad (5)$$

The generation of voltage $v_j$ can be viewed as the superposition of a plurality of capacitive divisions between, on the one hand, the effective capacitance $(C_{(i,j)} - C_{i,(j+N)})$ each input voltage has to output line $OL_j$ and, on the other hand, the total capacitance $C_j$ of the output line to its surroundings. That is, $C_j$ is the total capacitance on output line $OL_j$ or the total capacitance on output line $OL_{(N+j)}$, which capacitances should be equal to each other and fixed in value.

Each non-linear output driver amplifier $OD_j$ in the FIG. 1 neural net layer can be implemented using linear voltage amplifier circuitry followed by non-linear voltage amplifier circuitry. Each output driver amplifier can comprise a long-tailed pair connection of transistors having a current mirror amplifier load for converting their output signal voltage to single-ended form for application to an ensuing non-linear voltage amplifier. The long-tailed pair connection of transistors is a differential amplifier connection where their source electrodes have a differential-mode connection to each other and to a constant-current generator. An ensuing non-linear voltage amplifier can, as described in patent applications Ser. Nos. 366,838 and 366,839, comprise a cascade connection of two source-follower transistors, one an n-channel MOSFET and the other a p-channel MOSFET, each provided with a respective suitably-valued constant-current generator source load. Non-linearity of response in such a cascade connection comes about because (1) source-follower action of the n-channel MOSFET for positive-going excursions of its gate electrode potential becomes limited as its source potential approaches its drain potential $V_{HI}$ and (2) source-follower action of the p-channel MOSFET for negative-going excursions of its gate electrode potential becomes limited as its source potential approaches its drain potential $V_{LO}$. At the source electrode of the output source-follower of the cascade connection, there is a sigmoidal response to a linear ramp potential applied to the gate electrode of the input source-follower of the cascade connection.

Alternatively, the difference in charge appearing on the output lines $OL_j$ and $OL_{(j+N)}$ can be sensed by fully differential charge-sensing amplifiers preceding the non-linear voltage amplifiers in the output driver amplifiers. In such case the output signals from the charge-sensing amplifiers will be balanced with reference to a reference $V_{BIAS}$ potential. This alternative will be described presently in connection with FIG. 2.

Consider now how neuron model behavior is exhibited by input driver amplifier $ID_i$, capacitors $C_{i,j}$ and $C_{i,(j+N)}$, and non-linear output driver amplifier $OD_j$ for particular respective values of i and j. If the capacitance of capacitor $C_{i,j}$ is larger than the capacitance of capacitor $C_{i,(j+N)}$ for these particular values of i and j, then the output voltage $y_j$ for that j will exhibit "excitory" response to the input voltage $x_i$. If the capacitances of $C_{i,j}$ and $C_{i,(j+N)}$ are equal for these i and j values, then the output voltage $y_j$ for that j should exhibit no response to the input voltage $y_j$. If the capacitance of capacitor $C_{i,j}$ is smaller than the capacitance of capacitor $C_{i,(j+N)}$ for those i and j values, then the output voltage $y_j$ for that j will exhibit "inhibitory" response to the input voltage $x_i$.

In some neural nets using capacitors for weighting synapse signals, the capacitors $C_{i,j}$ and $C_{i,(j+N)}$ for all i and j may be fixed-value capacitors, so there is never any alteration in the weighting of input voltages $x_i$ where $i=1, \ldots M$. However, such neural nets lack the capacity to adapt to changing criteria for neural responses—which adaptation is necessary, for example, in a neural network that is to be connected for self-learning. It is desirable in certain applications, then, to provide for altering the capacitances of each pair of capacitors $C_{i,j}$ and $C_{i,(j+N)}$ associated with a respective pair of values of i and j. This alteration is to be carried out in a complementary way, so the sum of the capacitances of $C_{i,j}$ and of $C_{i,(j+N)}$ remains equal to $C_k$. Each of a set of component capacitors with capacitances related in accordance with powers of two is selected to be a component of one or the other of the pair of capacitors $C_{i,j}$ and $C_{i,(j+N)}$, the selecting being done by field effect transistors operated as transmission gates.

Figure 2B:
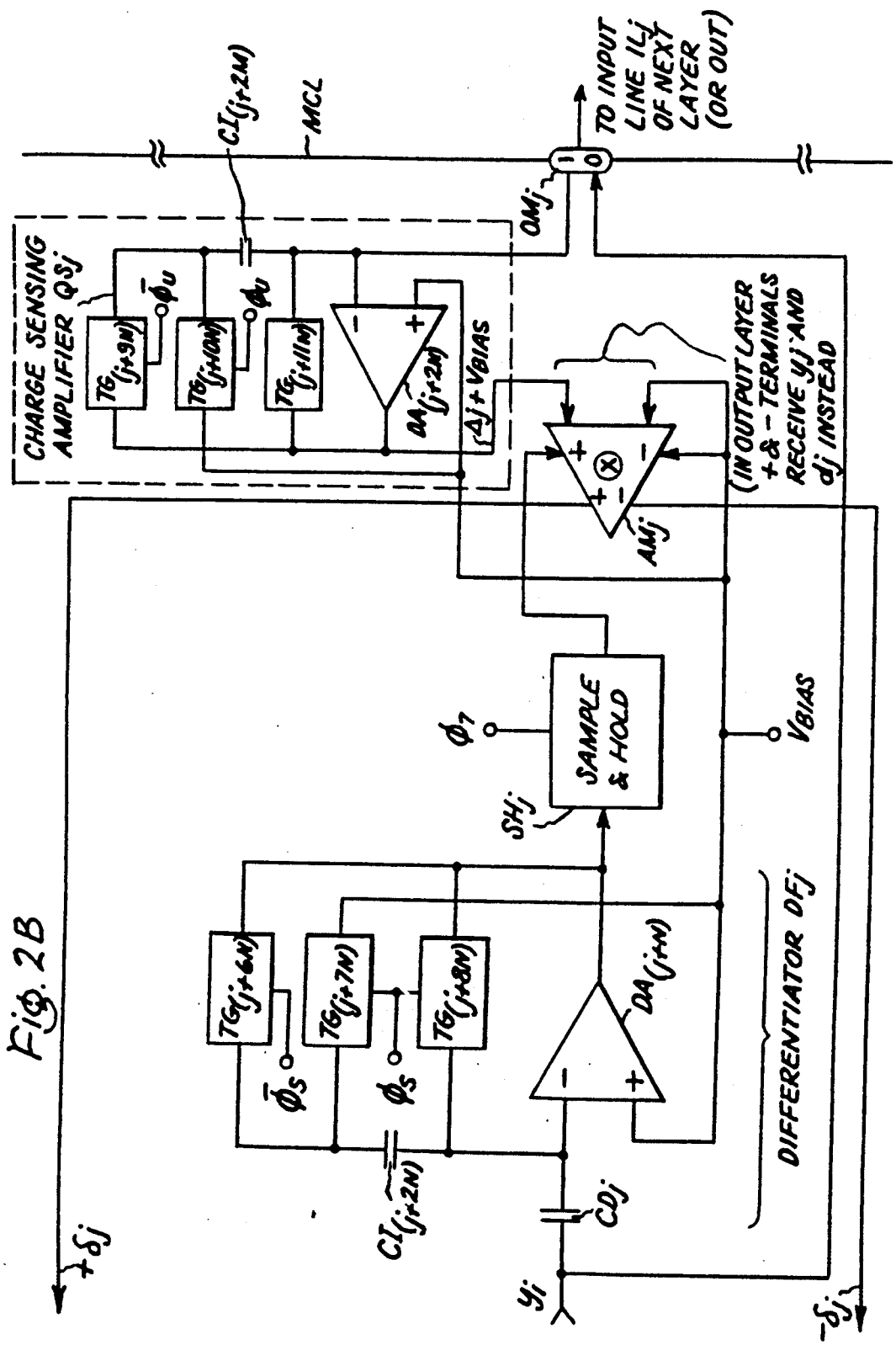

FIG. 2, comprising component FIGS. 2A and 2B, shows a representative modification that can be made to the FIG. 1 neural net near each set of intersections of output line $OL_j$ and $OL_{(j+N)}$ with an input line $IL_i$ from which they receive with differential weighting a synapse input signal $x_i$. Such modifications together make the neural net capable of being trained. Each capacitor pair $C_{i,j}$ and $C_{i,(j+N)}$ of the FIG. 1 neural net is to be provided by a pair of digital capacitors $DC_{i,j}$ and $DC_{i,(j+N)}$. The capacitances of $DC_{i,j}$ and $DC_{i,(j+N)}$ are controlled in complementary ways by a weighting factor and its one's complement as described by a digital word stored in a respective word-storage element $WSE_{i,j}$ of an array of such elements located interstitially among the rows of digital capacitors and connected to form a memory. This memory may, for example, be a random access memory (RAM) with each word-storage element $WSE_{i,j}$ being selectively addressable by row and column address lines controlled by address decoders. Or, by way of further example, this memory can be a plurality of static shift registers, one for each column j. Each static shift register will then have a respective stage $WSE_{i,j}$ for storing the word that controls the capacitances of each pair of digital capacitors $DC_{i,j}$ and $DC_{i,(j+N)}$.

The word stored in word storage element $WSE_{i,j}$ may also control the capacitances of a further pair of digital capacitors $DC_{(i+M),j}$ and $DC_{(i+M),(j+N)}$, respectively. The capacitors $DC_{(i+M),j}$ and $DC_{(i+M),(j+N)}$ connect between "ac ground" and output lines $OL_j$ and $OL_{(j+N)}$, respectively, and form parts of the loading capacitors $CL_{(M+j)}$. The capacitances of $DC_{(i+2M,j)}$ and $DC_{i,j}$ are similar to each other and changes in their respective values track each other. The capacitances of $DC_{(i+M),(j+N)}$ and $DC_{i,(j+N)}$ are similar to each other and changes in their respective values track each other. The four digital capacitors $DC_{i,j}$, $DC_{i,(j+N)}$, $DC_{(i+M),j}$ and $DC_{(ik+M),(j+N)}$ are connected in a quad or bridge configuration having input terminals connecting from the input line $IL_i$ and from a-c ground respectively and having output terminals connecting to output lines $OL_j$ and $OL_{(j+N)}$ respectively. This configuration facilitates making computations associated with back-propagation programming by helping make the capacitance network bilateral insofar as voltage gain is concerned. Alternatively, where the computations for back-propagation programming are done by computers that do not involve the neural net in the computation procedures, the neural net need not include the digital capacitors $DC_{(i+M),j}$ and $DC_{(i+M),(j+N)}$.

When the FIG. 2 neural net is being operated normally, following programming, the $\phi_P$ signal applied to a mode control line MCL is a logic ZERO. This ZERO on mode control line MCL conditions each output line multiplexer $OLM_j$ of an N-numbered plurality thereof to select the output line $OL_j$ to the inverting input terminal of a respective associated fully differential amplifier $DA_j$. This ZERO on mode control line MCL also conditions each output line multiplexer $OLM_{(j+N)}$ to select the output line $OL_{(j+N)}$ to the non-inverting input terminal of the respective associated fully differential amplifier $DA_j$ differential amplifier $DA_j$, which is included in a respective charge-sensing amplifier $QS_j$ that performs a charge-sensing operation for output line $OL_j$. A fully differential amplifier constructed of MOS field-effect transistors, as may serve for any one of the fully differential amplifiers $DA_j$ for $j=1, 2, \ldots N$, is described on pages 255–257 of the book *Analog MOS Integrated Circuits for Signal Processing* by R. Gregorian and G. C. Temes, copyright 1986, published by John Wiley & Sons, Inc., of New York, Chichester, Brisbane, Toronto and Singapore.

In futherance of this charge-sensing operation, a transmission gate $TG_j$ responds to the absence of a reset pulse $Q_R$ to connect an integrating capacitor $CI_j$ between the (+) output and (−) input terminals of amplifier $DA_j$; and a transmission gate $TG_{(j+5N)}$ responds to the absence of the reset pulse $\phi_R$ to connect an integrating capacitor $CI_{(j+N)}$ between the (−) output and (+) input terminals of amplifier $DA_j$. With integrating capacitors $CI_j$ and $CI_{(j+N)}$ so connected, amplifier $DA_j$ functions as a differential charge amplifier. When $\phi_P$ signal on mode control line MCL is a ZERO, the input signal $x_i$ induces a total differential change in charge on the capacitors $DC_{i,j}$ and $DC_{i,(j+N)}$ proportional to the difference in their respective capacitances. The resulting displacement current flows needed to keep the input terminals of differential amplifier $DA_j$ substantially equal in potential requires that there be corresponding displacement current flow from the integrating capacitor $CI_j$ and and $CI_{(j+N)}$ differentially charging those charging capacitors to place thereacross a differential voltage $v_j$ defined as follows.

$$v_j = (CI_j + CI_{(j+N)})^{-1} \sum_{i=1}^{M} (C_{i,j} - C_{(i+M),j}) x_i \quad (6)$$

The half $V_j$ signal from the non-inverting (+) output terminal of amplifier $DA_j$ is supplied to a non-linear voltage amplifier circuit $NL_j$ which can be the non-linear voltage amplifier circuit using a cascade connection of p-channel and n-channel source-follower field effect transistors as previously described. The non-linear voltage amplifier circuit $NL_j$ responds to generate the axon output response $y_j$. It is presumed that this non-linear voltage amplifier $NL_j$ supplies $y_j$ at a relatively low source impedance as compared to the input impedance offered by the circuit $y_j$ is to be suppled to—e.g. on input line in a succeeding neural net layer. If this is so there is no need in a succeeding neural net layer to interpose an input driver amplifier $ID_i$ as shown in FIG. 1. This facilitates interconnections between successive neural net layes being bilateral. An output line multiplexer $OLM_j$ responds to the $\phi_P$ signal appearing on the mode control line MCL being ZERO to apply $y_j$ to an input line of a succeeding neural net layer if the elements shown in are in a hidden layer. If the elements shown in FIG. 2 are in the output neural net layer, output line multiplexer $OLM_j$ responds to the $\phi_P$ signal on the mode control line being ZERO to apply $y_j$ to an output terminal for the neural net.

From time to time, the normal operation of the neural net is interrupted; and, to implement dc-restoration a reset pulse $\phi_R$ is supplied to the charge sensing amplifier $QS_j$. Responsive to $\phi_R$, the logic complement of the reset pulse $\phi_R$, going low when $\phi_R$ goes high, transmission gates $TG_j$ and $TG_{(j+SN)}$ are no longer rendered conductive to connect the integrating capacitors $CI_j$ and $CI_{(j+N)}$ from the output terminals of differential amplifier $DA_j$. Instead, transmission gates $TG_{(j+N)}$ and $TG_{(j+4N)}$ respond to $\phi_R$ going high to connect to $V_{BIAS}$ the plates of capacitor $CI_j$ and $CI_{(j+N)}$ normally connected from those output terminals, $V_{BIAS}$ being the 2.5 volt intermediate potential between the $V_{SS}=0$ volt and $V_{DD}=5$ volt operating voltages of differential amplifier $DA_j$. Other transmission gates $TG_{(j+2N)}$ and $TG_{(J+3N)}$ respond to $\phi_R$ going high to apply direct-coupled degenerative feedback from the output terminal of differential amplifier $DA_j$ to its input terminals, to bring the voltage at the output terminals to that supplied to its inverting input terminal from output lines $OL_j$ and $OL_{(j+N)}$. During the dc-restoration all $x_i$ are "zero-valued". So the charges on integrating capacitor $CI_j$ and $CI_{(j+N)}$ are adjusted to compensate for any differential direct voltage error occurring in the circuitry up to the output terminals of differential amplifier $DA_j$. Dc-restoration is done concurrently for all differential amplifiers $DA_j$ (i.e., for values of j ranging from one to N).

During training, the $\phi_P$ signal applied to mode control line MCL is a logic ONE, which causes the output line multiplexer $OLM_j$ to disconnect the output lines $OL_j$ and $OL_{(j+N)}$ from the (+) and (−) input terminals of differential amplifier $DA_j$ and to connect the output lines $OL_j$ and $OL_{(j+N)}$ to receive $+\delta_j$ and $-\delta_j$ error terms. These $+\delta_j$ and $-\delta_j$ error terms are generated as the balanced product output signal of a analog multiplier $AM_j$, responsive to a signal $\Delta_j$ and to a signal $y'_j$ which is the change in output voltage $y_j$ of non-linear amplifier $NL_j$ for unit change in the voltage on output line $OL_j$. The term $\Delta_j$ for the output neural net layer is an error signal that is the difference between $y_j$ actual value and its desired value $d_j$. The term $\Delta_j$ for a hidden neural net layer is also an error signal, which is of a nature that will be explained in detail further on in this specification.

Differentiator $DF_j$ generates the signal $y'_j$, which is a derivative indicative of the slope of $y_j$ change in voltage on output line $OL_j$, superposed on $V_{BIAS}$. To determine the $y'_j$ derivative, a pulse doublet comprising a small positive-going pulse immediately followed by a similar-amplitude negative-going pulse is introduced at the inverting input terminal of differential amplifier $DA_j$ (or equivalently, the opposite-polarity doublet pulse is introduced at the non-inverting input terminal of differential amplifier $DA_j$) to first lower $y_j$ slightly below normal value and then raise it slightly above normal value. This transition of $y_j$ from slightly below normal value to slightly above normal value is applied via a differentiating capacitor $CD_j$ to differentiator $DF_j$.

Differentiator $DF_j$ includes a charge sensing amplifier including a differential amplifier $DA_{(j+N)}$ and an integrating capacitor $CI_{(j+N)}$. During the time $y_j$ that is slightly below normal value, a reset pulse $\phi_S$ is applied to transmission gates $TG_{(j+4N)}$ and $TG_{(j+5N)}$ to render them conductive. This is done to drain charge from integrating capacitor $CI_{(J+N)}$, except for that charge needed to compensate for $DA_{(j+N)}$ input offset voltage error. The reset pulse $\phi_S$ ends, rendering transmission gates $TGB_{(j+4N)}$ and $TG_{(j+5N)}$ no longer conductive, and the complementary signal $\overline{\phi_S}$ goes high to render a transmission gate $TG_{(j+3N)}$ conductive for connecting integrating capacitor $CI_{(j+N)}$ between the output and inverting-input terminals of differential amplifier $DA_{(j+N)}$.

With the charge-sensing amplifier comprising elements $DA_{(j+N)}$ and $CI_{(j+N)}$ reset, the small downward pulsing of $y_j$ from normal value is discontinued and the small upward pulsing of $y_j$ from normal value occurs. The transition between the two abnormal conditions of $y_j$ is applied to the charge-sensing amplifier by electrostatic induction via differentiating capacitor $CD_j$. Differential amplifier $DA_{(j+N)}$ output voltage changes by an amount $y'_j$ from the $V_{BIAS}$ value it assumed during reset. The use of the transition between the two pulses of the doublet, rather than the edge of a singlet pulse, to determine the derivative $y'_j$ makes the derivative-taking process treat more similarly those excitory and inhibiting responses of the same amplitude. The doublet pulse introduces no direct potentitial offset error into the neural net layer.

Responsive to a pulse $\phi_T$, the value $y'_j + V_{BIAS}$ from differentiator $DF_j$ is sampled and held by row sample and hold circuit $RSH_j$ for application to an analog multiplier $AM_j$ as an input signal. This sample and hold procedure allows $y_j$ to return to its normal value, which is useful in the output layer to facilitate providing $y_j$ for calculating $(y_j - d_j)$. The sample and hold circuit $RSH_j$ may simply comprise an L-section with a series-arm transmission-gate sample switch and a shunt-leg hold capacitor, for example. The analog multiplier $AM_j$ accepts a first push-pull input signal between input terminals IN1 and $\overline{IN1}$, accepts a second push-pull input signal between terminals IN2 and $\overline{IN2}$, and supplies product output signal in balanced form at its output terminals POUT and $\overline{POUT}$. The difference between $y'_j + V_{BIAS}$ and $V_{BIAS}$ voltages is applied as a differential input signal to the analog multiplier $AM_j$, which exhibits common-mode rejection for the $V_{BIAS}$ term. In U.S. patent applications Ser. Nos. 366,838 and 366,839 respectively entitled "NEURAL NET USING CAPACITIVE STRUCTURES CONNECTING INPUT LINES AND DIFFERENTIALLY SENSED OUTPUT LINE PAIRS" and "NEURAL NET USING CAPACITIVE STRUCTURES CONNECTING OUTPUT LINES AND DIFFERENTIALLY DRIVEN INPUT LINE PAIRS", the four-quadrant analog multiplier $AM_j$ is described as being a push-pull-output analog multiplier formed by modifying a single-ended-output analog multiplier described by K. Bultt and H. Wallinga in their paper "A CMOS Four-quadrant Analog Multiplier" appearing on pages 430–435 of the IEEE JOURNAL OF SOLID STATE CIRCUITS, Vol. SC-21, No. 3, June 1986, incorporated herein by reference.

During training, the $\phi_P$ signal applied to mode control line MCL is a logic ONE, as previously noted. When the FIG. 2 elements are in the output layer, the ONE on mode control line MCL conditions an output multiplexer $OM_j$ to discontinue the application of $y_j$ signal from non-linear amplifier $NL_j$ to an output terminal. Instead, the output multiplexer $OM_j$ connects the output terminal to a charge-sensing amplifier $QS_j$. Charge sensing amplifier $QS_j$ includes a differential amplifier $DA_{(j+2N)}$ and an integrating capacitor $CI_{(j+2N)}$ and is periodically reset responsive to a reset pulse $\phi_U$. Reset pulse $\phi_U$ can occur simultaneously with reset pulse $\phi_S$, for example. Output signal $\Delta_j$ from charge-sensing amplifier $QS_j$ is not used in the output layer, however. Analog multiplier $AM_j$ does not use $\Delta_j + V_{BIAS}$ and $V_{BIAS}$ as a differential input signal in the output layer, $(y_j - d_j)$ being used instead.

When the FIG. 2 elements are in a hidden neural net layer, $\phi_P$ signal on the mode control line MCL being a ONE conditions output multiplexer $OM_j$ to discontinue the application of $y_j$ signal from non-linear amplifier $NL_j$ to the input line $IL_j$ of the next neural net layer. Instead, output multiplexer $OM_j$ connects the input line $IL_j$ to a charge-sensing amplifier $QS_j$. Charge-sensing amplifier $QS_j$ senses change in the charge on input line $IL_j$ during training to develop a $\Delta_j$ error signal superposed on $V_{BIAS}$ direct potential. The difference between $\Delta_j + V_{BIAS}$ and $V_{BIAS}$ voltages is used as a differential input signal to analog multiplier $AM_j$, which multiplier exhibits common-mode rejection for the $V_{BIAS}$ term.

Charge-sensing amplifier $QS_j$ employs a differential-input amplifier $DA_{(j+2N)}$ and an integrating capacitor $CI_{(j+2N)}$. Transmission gates $TG_{(j+9N)}$, $TG_{(j+10N)}$ and $TG_{(j+11N)}$ cooperate to provide occasional resetting of charge conditions on the integrating capacitor $CI_{j+2N}$ responsive to the reset pulse $\phi_U$.

Figure 3:
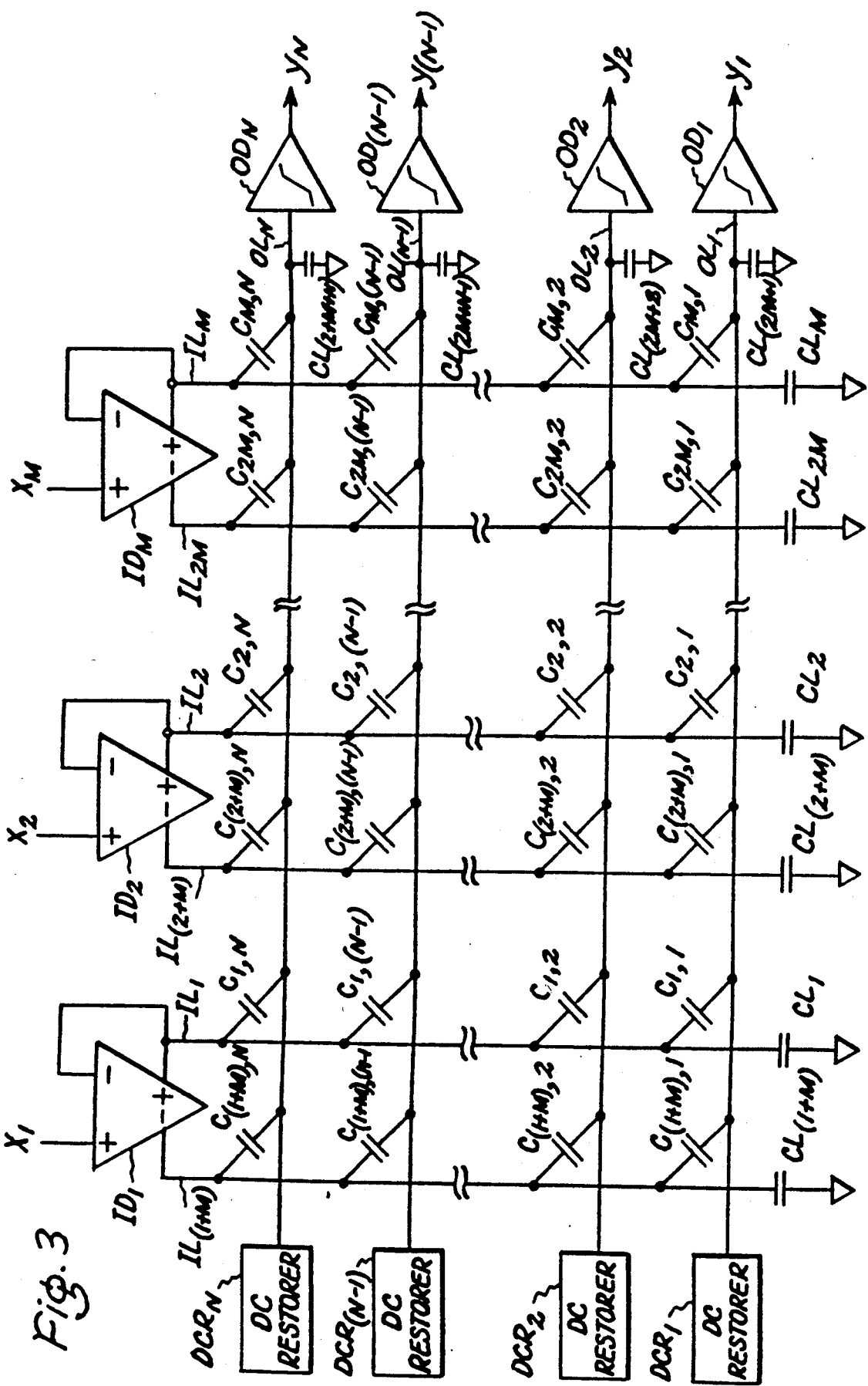
FIG. 3 is a schematic diagram of a neural net layer as described by W. E. Engeler in U.S. patent application Ser. No. 366,839 entitled "NEURAL NET USING CAPACITIVE STRUCTURES CONNECTING OUTPUT LINES AND DIFFERENTIALLY DRIVEN INPUT LINE PAIRS", which neural net layer uses capacitors to perform weighted summations of synapse signals to be subsequently sensed and non-linearly amplified to generate axon response signals.

FIG. 3 shows a neural net in which the input driver amplifier $ID_i$ applies, in response to input voltage signal $x_i$, not only an non-inverted voltage response from its (+) output port to an input line $IL_i$, but also an inverted voltage response from its (−) output port to an input line $IL_{(i+M)}$. A respective degenerative feedback connection from its (+) output terminal to its (−) input terminal conditions each of the input driver amplifiers $ID_i$ in the FIG. 3 neural net to provide $x_i$ voltage-follower response at its (+) output terminal to $x_i$ signal applied to its (+) input terminal and to provide inverted, $-x_i$ response at its (−) output terminal. A respective single output line $OL_j$ connects to the input port of output driver amplifier $OD_j$, which generates at its output port a non-linear voltage response to the cumulative charge on that respective output line $OL_j$.

The non-linear output driver amplifier $OD_j$ is shown in FIG. 3 as being just a non-linear voltage amplifier with the quiescent direct potential applied to its input signal terminal via output line $OL_j$ being adjusted by clamping to a desired bias voltage at selected times using a respective direct-current restorer circuit $DCR_j$. A respective capacitor $C_{i,j}$ connects each of the input lines $IL_i$ to each of the output lines $OL_j$, and a respective capacitor $C_{(i+M),j}$ connects to each of the output lines $OL_j$ the one of the input lines $IL_{(i+M)}$ paired with that $IL_i$. Since the paired $IL_i$ and $IL_{(i+M)}$ input lines are driven with $x_i$ and $-x_i$ signal voltages respectively, the electrically equivalent circuit is $x_i$ signal voltage being applied to output line $OL_j$ by a capacitor having a capacitance that equals the capacitance of $C_{i,j}$ minus the capacitance of $C_{(i+M),j}$. This balanced input signal drive to paired input lines technique avoids the need for switched-capacitance techniques in order to obtain inhibitory as well as excitory weights, and thus facilitates operating the neural net with analog signals that are continuous over sustained periods of time, if so desired.

FIG. 3 shows each of the input lines $IL_i$ or $IL_{(i+M)}$ as being provided with a respective load capacitor $CL_i$ or $CL_{(i+M)}$ to cause that capacitive loading upon each of the output terminals of the input driver amplifier $ID_i$ to be substantially the same as that upon each output port of the other input driver amplifiers. This is desirable for avoiding unwanted differential delay in responses to the input signals $x_i$. Substantially equal capacitive loading can be achieved by making the capacitance of each of the input line loading capacitors $CL_1$-$CL_{2M}$ very large compared to the total capacitance of the capacitors $C_{i,j}$ or $C_{(i+M),j}$ connecting thereto. Preferably, however, this result is achieved by making the capacitance of each of the input line loading capacitors complement the combined value of the other capacitances connecting thereto. This procedure reduces the amount of line loading capacitance required. Where the voltage appearing on the output lines is sensed directly by the non-linear output driver amplifiers $OD_1, \ldots OD_N$, as shown in FIG. 3, this preferable procedure makes the voltage division ratio for each input voltage $x_i, \ldots x_M$ independent of the voltage division ratios for the other input voltages. Where the charge appearing on the output lines is sensed by charge-sensing amplifiers preceding the non-linear output driver amplifiers, as will be described later on in this specification in connection with FIG. 4, this latter consideration is not as important.

FIG. 3 also shows each of the output lines $OL_j$ being loaded with a respective load capacitor $CL_{(2M+j)}$ to cause the total capacitance on that line to remain substantially the same as on each of the other output lines. Again, this can be done either by choosing $CL_{(2M+j)}$ to be much larger than other capacitances to output line $OL_j$, or by choosing $CL_{(2M+j)}$ to complement the combined value of the other capacitances connecting thereto. The input voltage to output driver amplifier $OD_j$ will (to good approximation) have the following value, $v_j$, in accordance with Coulomb's Law.

$$v_j = (C_j)^{-1} \sum_{i=1}^{M} (C_{i,j} - C_{(i+M),j}) x_i \qquad (7)$$

Here $C_j$ is the total capacitance on output line $OL_j$. The generation of voltage $v_j$ can be viewed as the superposition of a plurality of capacitive divisions between, on the one hand, the effective capacitance $(C_{(i,j)} - C_{(i+M),j})$ each input voltage has to output line $OL_j$ and, on the other hand, the total capacitance $C_j$ of the output line to its surroundings.

Consider now how neuron model behavior is exhibited by input driver amplifier $ID_i$, capacitors $C_{i,j}$ and $C_{(i+M),j}$, and non-linear output driver amplifier $OD_j$ for particular respective values of i and j. The voltage responses input driver amplifier $ID_i$ applies to input lines $IL_i$ and $IL_{(i+M)}$ are the same in amplitude but are of opposing polarity as referred to a common-mode voltage that is designed to be nominally the same as a bias voltage $V_{BIAS}$ midway between the 0-volt $V_{SS}$ and +5-volt $V_{DD}$ supply voltages. If the capacitance of capacitor $C_{i,j}$ is larger than the capacitance of capacitor $C_{(i+M),j}$ for these particular values of i and j, then the output voltage $y_j$ for that j will exhibit "excitory" response to the input voltage $x_i$. If the capacitances of $C_{i,j}$ and $C_{(i+M),j}$ are equal for these i and j values, then the output voltage $y_j$ for that j should exhibit no response to the input voltage $y_j$. If the capacitance of capacitor $C_{i,j}$ is smaller than the capacitance of capacitor $C_{(i+M),j}$ for those i and j values, then the output voltage $y_j$ for that j will exhibit "inhibitory" response to the input voltage $x_i$.

In some neural nets the capacitors $C_{i,j}$ and $C_{(i+M),j}$ for all i and j may be fixed-value capacitors, so there is never any alteration in the weighting of input voltages $x_i$ where i=1, ... M. However, such neural nets lack the capacity to adapt to changing criteria for neural responses—which adaptation is necessary, for example, in a neural network that is to be connected for self-learning. It is desirable in certain applications, then, to provide for altering the capacitances of each pair of capacitors $C_{i,j}$ and $C_{(i+M),j}$ associated with a respective pair of values of i and j. This alteration is to be carried out in a complementary way, so the sum of the capacitances of $C_{i,j}$ and of $C_{(i+M),j}$ remains equal to $C_k$. Each of a set of component capacitors with capacitances related in accordance with powers of two is selected to be a component of one or the other of the pair of capacitors $C_{i,j}$ and $C_{(i+M),j}$, the selecting being done by field effect transistors operated as tranmission gates.

Figure 4A:
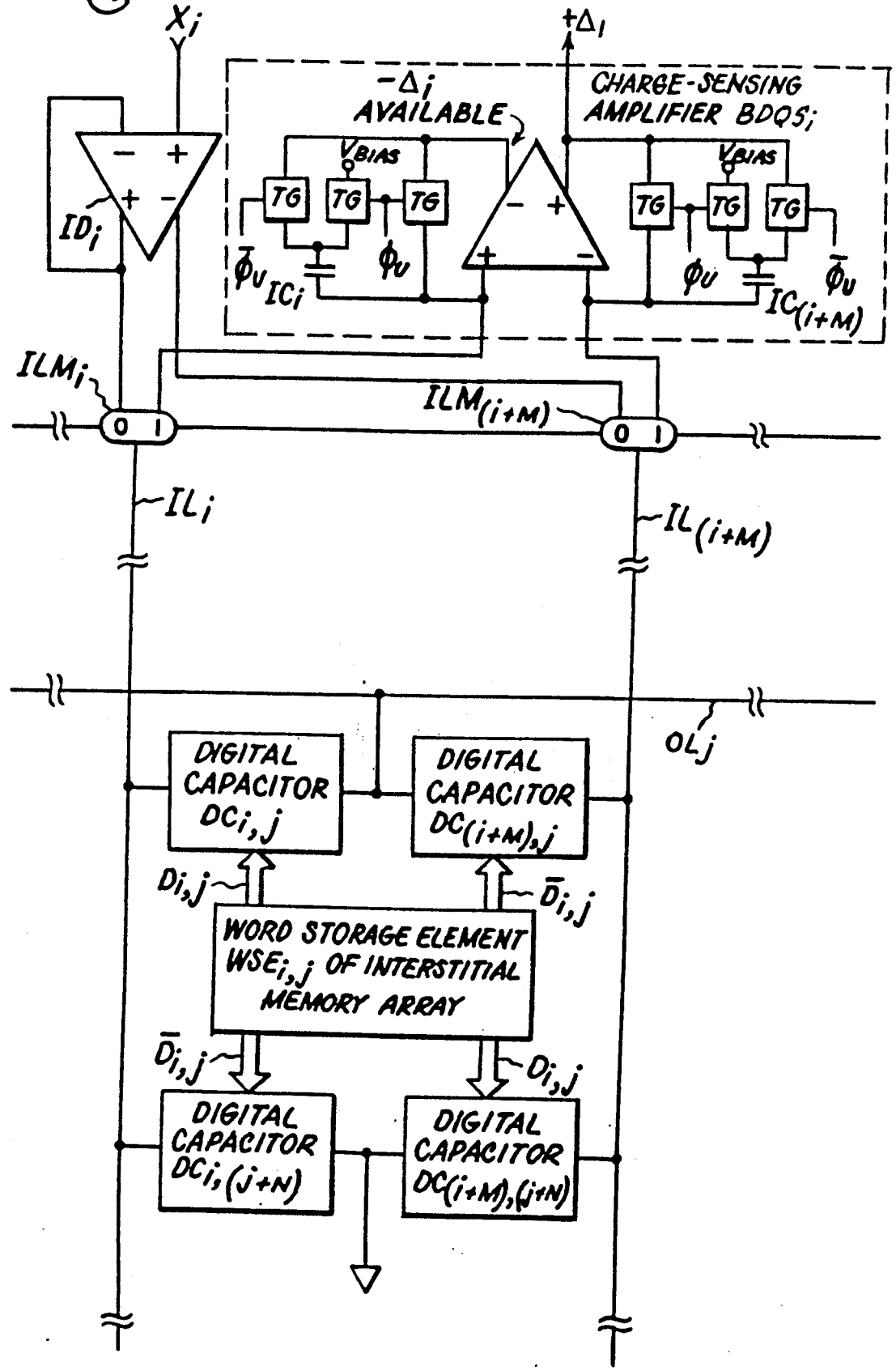

FIG. 4, comprising component FIGS. 4A and 4B, shows a representative modification that can be made to the FIG. 3 neural net near each set of intersections of an output line $OL_j$ with input lines $IL_i$ and $IL_{(i+K)}$ driven by opposite senses of a synapse input signal $x_i$. Such modifications together make the neural net capable of being trained. Each capacitor pair $C_{i,j}$ and $C_{(i+M),j}$ of the FIG. 3 neural net is to be provided by a pair of digital capacitors $DC_{i,j}$ and $DC_{(i+M),j}$. The capacitances of $DC_{i,j}$ and $DC_{(i+M),j}$ are controlled in complementary ways by a digital word, as drawn from a respective word-storage element $WSE_{i,j}$ in an array of such elements located interstitially among the rows of digital capacitors and connected to form a memory. This memory may, for example, be a random access memory (RAM) with each word-storage element $WSE_{i,j}$ being selectively addressable by row and column address lines controlled by address decoders. Or, by way of further example, this memory can be a plurality of static shift registers, one for each column j. Each static shift register will then have a respective stage $WSE_{i,j}$ for storing the word that controls the capacitances of each pair of digital capacitors $DC_{i,j}$ and $DC_{(i+M),j}$.

The word stored in word storage element $WSE_{i,j}$ may also control the capacitances of a further pair of digital capacitors $DC_{i,(j+N)}$ and $DC_{(i+M),(j+N)}$, respectively. The capacitors $DC_{i,(j+N)}$ and $DC_{(i+M),(j+N)}$ connect between "ac ground" and input lines $IL_i$ and $IL_{(i+M)}$, respectively, and form parts of the loading capacitors CL$_i$ and CL$_{(i+M)}$, respectively. The capacitances of DC$_{(i+M),(j+N)}$ and DC$_{i,j}$ are similar to each other and changes in their respective values track each other. The four digital capacitors DC$_{i,j}$, DC$_{(i+M),j}$, DC$_{i,(j+N)}$ and DC$_{(i+M),(j+N)}$ are connected in a quad or bridge configuration having input terminals to which the input lines IL$_i$ and IL$_{(i+M)}$ respectively connect and having output terminals connecting to output line OL$_j$ and to ac ground respectively. The capacitances of DC$_{i,(j+N)}$ and DC$_{(i+M),j}$ are similar to each other and changes in their respective values track each other. This configuration facilitates making computations associated with back-propagation programming by helping make the capacitance network bilateral insofar as voltage gain is concerned. Alternatively, where the computations for back-propagation programming are done by computers that do not involve the neural net in the computation procedures, the neural net need not include the digital capacitors DC$_{i,j+N}$ and DC$_{(i+M),(j+N)}$. These digital capacitors DC$_{i,(j+N)}$ and DC$_{(l+M),(j+N)}$ are not needed either where very large loading capacitors are placed on the output lines OL$_j$, but this alternative undersirably reduces sensitivity of the output driver amplifier OD$_j$.

When the FIG. 3 neural net is being operated normally, following programming, the $\phi_P$ signal applied to a mode control line MCL. is a logic ZERO. This ZERO conditions a respective input line multiplexer ILM$_i$ to connect the non-inverting output port at each input driver amplifier ID$_i$ to input line IL$_i$. The $\phi_P$ signal on mode control line MCL being a ZERO also conditions a respective input line multiplexer ILM$_{(i+M)}$ to connect the inverting output port of each input driver amplifier ID$_i$ to input line IL$_{(i+M)}$.

A ZERO on mode control line MCL also conditions each output line multiplexer OLM$_j$ of an n-numbered plurality thereof to select the output line OL$_j$ to the inverting input terminal of a respective associated differential-input amplifier DA$_j$, included in a respective charge-sensing amplifier QS$_j$ that performs a charge-sensing operation for output line OL$_j$. In furtherance of this charge-sensing operation, a transmission gate TG$_j$ responds to the absence of a reset pulse $Q_R$ to connect an integrating capacitor CI$_j$ between the output and inverting-input terminals of differential-input amplifier DA$_j$. Amplifier DA$_j$ may be an operational amplifier of the conventional voltage amplifier type or may be an operational transconductance amplifier. With integrating capacitor CI$_j$ so connected, amplifier DA$_j$ functions as a charge amplifier. When $\phi_P$ signal on mode control line MCL is a ZERO, the input signal x$_i$ induces a total change in charge on the capacitors DC$_{i,j}$ and DC$_{(i+M),j}$ proportional to the difference in their respective capacitances. The resulting displacement current flow from the inverting input terminal of differential-input amplifier DA$_j$ requires that there be a corresponding displacement current flow from the integrating capacitor CI$_j$ charging that capacitor to place thereon a voltage v$_j$ defined as follows.

$$v_j = (CI_j)^{-1} \sum_{i=1}^{M} (C_{i,j} - C_{(i+M),j})x_i \quad (8)$$

The voltage V$_j$ is supplied to a non-linear voltage amplifier circuit NL$_j$, which non-linear voltage amplifier circuit responds to generate the axon output response y$_j$.

From time to time, the normal operation of the neural net is interrupted, and to implement dc-restoration a reset pulse $\phi_R$ is supplied to each charge sensing amplifier QS$_j$. Responsive to $\phi_R$ the logic complement of the reset pulse $\phi_R$, going low when $\phi_R$ goes high, transmission gate TG$_j$ is no longer rendered conductive to connect the integrating capacitor CI$_j$ from the output terminal of differential amplifier DA$_j$. Instead, a transmission gate TG$_{(j+N)}$ responds to $\phi_R$ going high to connect to V$_{BIAS}$ the plate of capacitor C$_j$ normally connected from that output terminal, V$_{BIAS}$ being the 2.5 volt intermediate potential between the V$_{SS}=0$ volt and V$_{DD}=5$ volt operating voltages of differential amplifier DA$_j$. Another transmission gate TG$_{(j+2N)}$ responds to $\phi_R$ going high to apply direct-coupled feedback from the output terminal of differential amplifier DA$_j$ to its inverting input terminal, to bring the voltage at the output terminal to that supplied to its inverting input terminal from output line OL$_j$. During the dc-restoration all x$_i$ are "zero-valued". So the charge on integrating capacitor CI$_j$ is adjusted to compensate for any direct voltage error occurring in the circuitry up to the output terminal of differential amplifier DA$_j$. DC-restoration is done concurrently for all differential amplifiers DA$_j$ (i.e., for values of j ranging from one to N).

During training, the $\phi_P$ signal applied to mode control line MCL is a logic ONE, which causes the output line multiplexer OLM$_j$ to disconnect the output line OL$_j$ from the inverting input terminal of differential amplifier DA$_j$ and to connect the output line OL$_j$ to receive a $\delta_j$ error term. This $\delta_j$ error term is generated as the product output signal of a analog multiplier AM$_j$, responsive to a signal $\Delta_j$ and to a signal y'$_j$ which is the change in output voltage y$_j$ of non-linear amplifier NL$_j$ for unit change in the voltage on output line OL$_j$. The term $\Delta_j$ is for the output neural net layer the difference between y$_j$ actual value and its desired value d$_j$. The term $\Delta_j$ is for a hidden neural net layer the $\Delta_j$ output of the succeeding neural net layer during the back-propagation procedure.

Differentiator DF$_j$ generates the signal y'$_j$, which is a derivative indicative of the slope of y$_j$ change in voltage on output line OL$_j$, superposed on V$_{BIAS}$. To determine the y'$_j$ derivative, a pulse doublet comprising a small positive-going pulse immediately followed by a similar-amplitude negative-going pulse is introduced at the inverting input terminal of differential amplifier DA$_j$ (or equivalently, the opposite-polarity doublet pulse is introduced at the non-inverting input terminal of differential amplifier DA$_j$) to first lower y$_j$ slightly below normal value and then raise it slightly above normal value. This transition of y$_j$ from slightly below normal value to slightly above normal value is applied via a differentiating capacitor CD$_j$ to differentiator DF$_j$.

Differentiator DF$_j$ includes a charge sensing amplifier including a differential amplifier DA$_{(j+N)}$ and an integrating capacitor CI$_{(j+N)}$. During the time that y$_j$ is slightly below normal value, a reset pulse $\phi_S$ is applied to transmission gates TG$_{(j+4N)}$ and TG$_{(j+5N)}$ to render them conductive. This is done to drain charge from integrating capacitor CI$_{(J+N)}$, except for that charge needed to compensate for DA$_{(j+N)}$ input offset voltage error. The reset pulse $\phi_S$ ends, rendering transmission gates TGB$_{(j+4N)}$ and TG$_{(j+5N)}$ no longer conductive, and the complementary signal $\phi_S$ goes high to render a transmission gate TG$_{(j+3N)}$ and conductive for connecting integrating capacitor CI$_{(j+N)}$ between the output and inverting-input terminals of differential amplifier DA$_{(j+N)}$.

With the charge sensing amplifier comprising elements $DA_{(j+N)}$ and $CI_{(j+N)}$ reset, the small downward pulsing of $y_j$ from normal value is discontinued and the small upward pulsing of $y_j$ from normal value occurs. The transition between the two abnormal conditions of $y_j$ is applied to the charge sensing amplifier by electrostatic induction via differentiating capacitor $CD_j$. Differential amplifier $DA_{(j+N)}$ output voltage changes by an amount $y'_j$ from the $V_{BIAS}$ value it assumed during reset. The use of the transition between the two pulses of the doublet, rather than the edge of a singlet pulse, to determine the derivative $y'_j$ makes the derivative-taking process treat more similarly those excitory and inhibiting responses of the same amplitude. The doublet pulse introduces no direct potential offset error into the neural net layer.

Responsive to a pulse $\phi_T$, the value $y'_j + V_{BIAS}$ from differentiator $DF_j$ is sampled and held by (row) sample and hold circuit $RSH_j$ for application to the analog multiplier $AM_j$ as an input signal. This sample and hold procedure allows $y_j$ to return to its normal value, which is useful in the output layer to facilitate providing $y_j$ for calculating $(y_j - d_j)$. The sample and hold circuit $RSH_j$ may simply comprise an L-section with a series-arm transmission-gate sample switch and a shunt-leg hold capacitor, for example. The difference between $y_j + V_{BIAS}$ and $V_{BIAS}$ voltages is used as a differential input signal to the analog multiplier $AM_j$, which exhibits common-mode rejection for the $V_{BIAS}$ term.

During training, the $\phi_P$ signal applied to the mode control line MCL is a ONE, as previously noted, and this causes the input line multiplexers $ILM_i$ and $ILM_{(i+M)}$ to disconnect the input lines $IL_i$ and $IL_{(i+M)}$ from the input driver amplifier $ID_i$ output terminals and connect them instead to the non-inverting and inverting input terminals of a differential charge-sensing amplifier BDQSi. The voltage $\delta_j$ induces a differential change in charge between input lines $IL_j$ and $IL_{(i+M)}$ proportional to $\delta_j(C_{i,j} - C_{(i+M),j})$, which differential change in charge is sensed using the differential charge sensing amplifier BDQSi.

Differential charge-sensing amplifier BDQSi includes a fully differential amplifier provided with integrating capacitors $IC_i$ and $IC_{(i+M)}$ in respective degenerative feedback connections from each of its output terminals to each of its input terminals. Resetting of differential charge-sensing amplifier BDQSi is similar to the resetting of a single-ended amplifier such as $QS_j$, except for involving two integrating capacitors $IC_j$ and $IC_{(i+M)}$, rather than just the one integrating capacitor $CI_j$. Resetting of differential charge-sensing amplifier BDQSi is done responsive to a pulse $\phi_U$, which occurs during the time when mode control line MCL has a ONE thereon conditioning input line multiplexers $ILM_i$ and $IM_{(i+M)}$ to connect input lines $IL_i$ and $IL_{(i+M)}$ to the differential charge-sensing amplifier BDQSi. Resetting is normally done shortly after a ZERO to ONE transition appears in the $\phi_P$ signal applied to mode control line MCL and may also be done at other times. This procedure corrects for capacitive unbalances on the input lines $IL_i$ and $IL_{(i+M)}$ during back-propagation computations that follow the resetting procedure. In these computations voltages $+\Delta_i + V_{BIAS}$ and $-\Delta_i V_{BIAS}$ are developed at the (+) and (−) output terminals of the fully differential amplifier included in differential charge-sensing amplifier BDQSi. The voltage $+\Delta_i + V_{BIAS}$ is used by the preceding neural net layer during the back-propagation training procedure, if such a preceding neural net layer exists. The use of single-ended $+\Delta_i$ and $+\Delta_j$ drive is shown in FIG. 4A, presuming the neural net layers to be integrated within separate monolithic integrated circuits, and presuming the limitation on number of pin-outs is restrictive. Where a plurality of neural net layers are integrated within the same monolithic integrated circuitry, or where maximum pin-out count is not a restrictive design factor, balanced $\Delta$ signals may be applied from one neural net layer to the preceding one. So, too, if the non-linear voltage amplifier $NL_j$ is of a correct type (for example, a long-tailed pair connection of transistors) $y_j + V_{BIAS}$ and $-y_j + V_{BIAS}$ balanced output signals may be supplied to the next neural net layer. Indeed, the $y'_j$ signals applied to the analog multiplier $AM_j$ may be generated in balanced form, replacing differentiator $DF_j$ and sample-and-hold circuit $SH_j$ with balanced circuitry.

Figure 5:
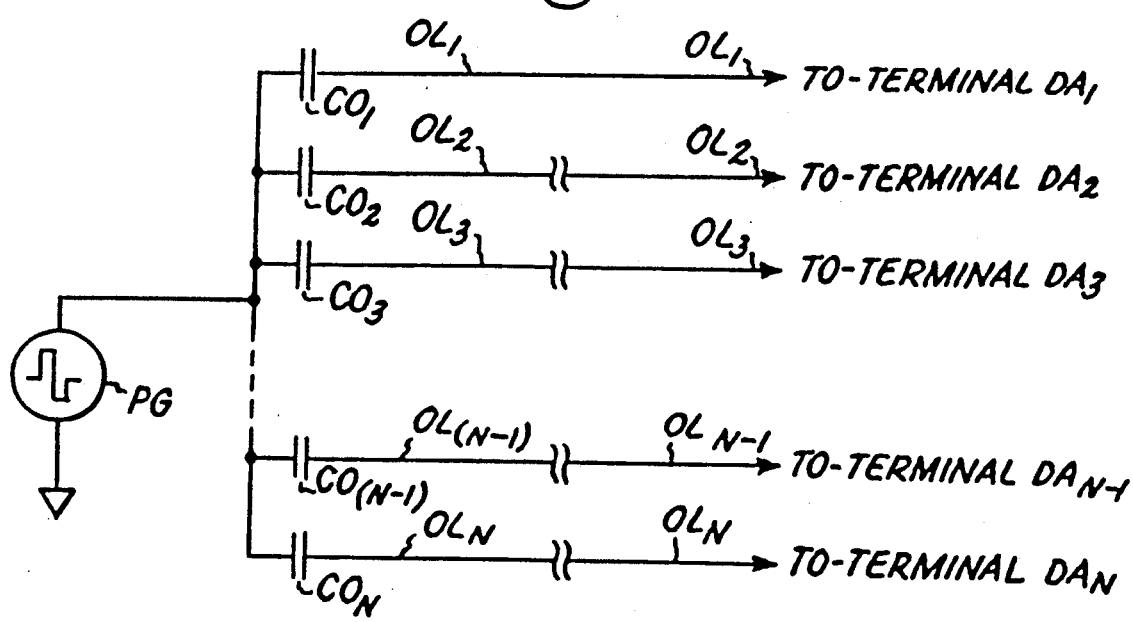
FIG. 5 is a schematic diagram illustrating one way of pulsing the non-linear output driver amplifiers, as may be used in a FIG. 1 neural net layer modified manifoldly per FIG. 2, or as may be used in a FIG. 3 neural net layer modified manifoldly per FIG. 4.

FIG. 5 shows how in either FIG. 2 or 4 each output line $OL_j$ for $j = 1, \ldots N$ may be pulsed during calculation of $y'_j$ terms. Each output line $OL_j$ is connected by a respective capacitor $CO_j$ to the output terminal of a pulse generator PG, which generates the doublet pulse. FIG. 5 shows the doublet pulse applied to the end of each output line $OL_j$ remote from the—terminal of the associated differential amplifier $DA_j$ in the charge-sensing amplifier $QS_j$ sensing the charge on that line. It is also possible to apply the doublet pulses more directly to those terminals by connecting to these terminals respective ones of the plates of capacitors $CO_j$ that are remote from the plates connecting to pulse generator PG.

Each output line $OL_j$ has a respective capacitor $CO_j$ connected between it and a point of reference potential, and each output line $OL_{(j+N)}$ has a respective capacitor $CO_{(j+N)}$ connected between it and the point of reference potential, which capacitors are not shown in the drawing. The respective capacitances of the capacitors $CO_j$ and $CO_{(j+N)}$ are all of the same value, so that the back-propagation algorithm is not affected by the presence of these capacitors. Arrangements for adding the doublet pulse to $v_j$ before its application to the non-linear amplifier $NL_j$ can be used, rather than using the FIG. 5 arrangement.

Figure 6A:
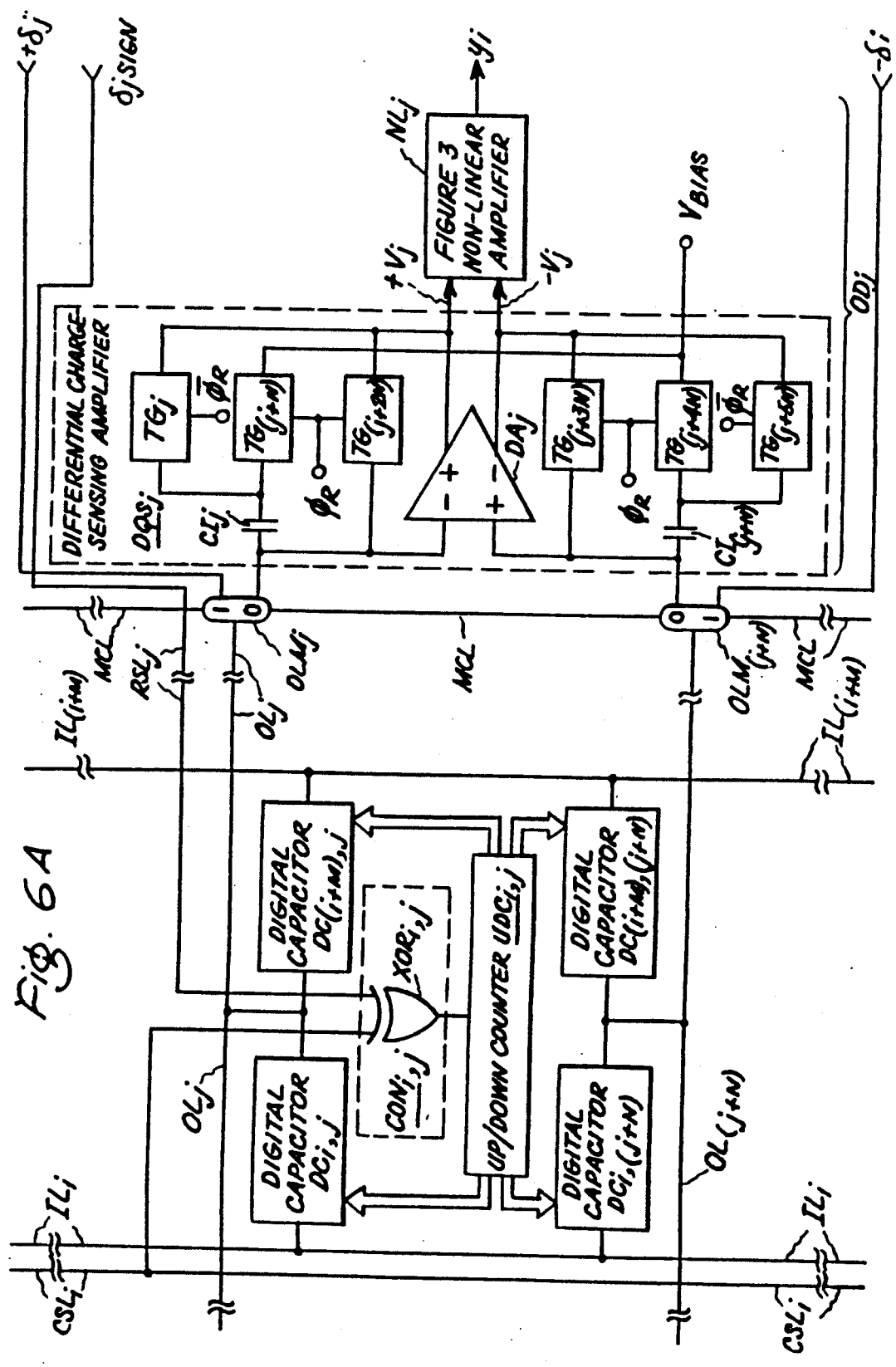

FIG. 6 comprising component FIGS. 6A, 6B and 6C shows further modification that can be made to the FIG. 4 modification for the FIG. 3 neural net. This modification, as shown in FIG. 6A provides for a pair of input lines $IL_i$ and $IL_{(i+M)}$ for driving each quad configuration of digital capacitors $DC_{i,j}$, $DC_{i,(j+N)}$, $DC_{(i+M),j}$ and $DC_{(i+M),(j+N)}$ push-pull rather than single-ended. Push-pull, rather than single-ended drive is provided to the differential charge sensing amplifier FDQSj, doubling its output response voltage. Push-pull drive also permits differential charge sensing amplifier FDQSj to be realized with differential-input amplifiers that do not provide for common-mode suppression of their output signals, if one so desires. FIG. 6A differs from FIG. 4A in that sign detector $CSD_i$ and $CSH_i$ do not appear, being relocated to appear in FIG. 6C as shall be considered further later on.

FIG. 6B differs from FIG. 4B in that the single-ended charge-sensing amplifier $QS_i$ does not appear, being inappropriate for sensing differences in charge appearing on a pair of input lines. Instead, $\Delta_j + B_{BIAS}$ is developed in the following neural net layer and is fed back to analog multiplier $AM_j$ via the output multiplexer $OM_j$ when the $\phi_p$ signal on mode control line MCL is a ONE.

FIG. 6C shows circuitry that may be used in each neural net layer to provide balanced input signal drive to a pair of input lines $IL_i$ and $IL_{(i+M)}$ during normal operation and to differentially sense the charge on those input lines during back-propagation calculations. A single fully differential amplifier $ID_i$ is multiplexed to implement both functions in duplex circuitry $DPX_i$ shown in FIG. 6C. Alternatively, the functions could be implemented with separate apparatus.

During normal operation the $\delta_P$ signal appearing on mode control line MCL is a ZERO, conditioning an input multiplexer $IM_i$ to apply $x_i$ signal to the non-inverting (+) input terminal of differential amplifier $ID_i$ and conditioning input line multiplexers $ILM_i$ and $ILM_{(i+M)}$ to connect the non-inverting (+) and inverting (−) output terminals of differential amplifier $ID_i$ to input lines $IL_i$ and $IL_{(i+M)}$ respectively. A signal $\theta_P$ is a ONE during normal operation and appears in the $\phi_U + \theta_P$ control signal applied to a transmission gate between the non-inverting (+) output terminal of differential amplifier $ID_i$ and its inverting (−) input terminal, rendering that transmission gate conductive to provide direct-coupled feedback between those terminals. This d-c feedback conditions differential amplifier $ID_i$ to provide $x_i$ and $-x_i$ responses at its (+) and (−) output terminals to the $x_i$ signal applied to its (−) input terminal. Other transmission gates within the duplex circuitry $DPX_i$ are conditioned to be non-conductive during normal operation.

During back-propagation calculations, the $\phi_P$ signal appearing on mode control line MCL is a ONE, conditioning input multiplexer $IM_i$ to apply $\Delta_i$ signal from the non-inverting (+) output terminal of differential amplifier $ID_i$ to the preceding neural net layer, if any, and conditioning input line multiplexers $ILM_i$ and $ILM_{(i+M)}$ to connect the input lines $IL_i$ and $IL_{(i+M)}$ to respective ones of the non-inverting (+) and inverting (−) input terminals of differential amplifier $ID_i$. Integrating capacitors $IC_i$ and $IC_{(i+M)}$ connect from the (+) and (−) output terminals of differential amplifier $ID_i$ to its (−) and (+) input terminals when transmission gates in duplex circuitry $DPX_i$ that are controlled by $\phi_U \cdot \phi_P$ signal receive a ZERO during back-propagation calculations. The charge conditions on integrating capacitors $IC_i$ and $IC_{(i+M)}$ are reset when $\phi_U$ occasionally pulses to ONE during back-propagation calculations. This happens in response to transmission gates in duplexer circuitry $DPX_i$ receptive of $\phi_U$ and $\phi_U + \phi_P$ control signals being rendered conductive responsive to $\phi_u$ being momentarily a ONE, while transmission gates in duplexer circuitry $DPX_i$ receptive of $\phi_U$ control signal being rendered non-conductive.

Column sign detector $CSD_i$ and column sample and hold circuit $CSH_i$ appear in FIG. 6C. Column sign detector receives output signal from differential amplifier $ID_i$ directly as its input signal and can simply be a voltage comparator for the $x_i$ and $-x_i$ output signals from the differential amplifier $ID_i$.

FIG. 7 shows apparatuses for completing the back-propagation computations, as may be used with the FIG. 1 neural net manifoldly modified per FIG. 2, with the FIG. 3 neural net manifoldly modified per FIG. 4, or with the FIG. 1 neural net manifoldly modified per FIG. 6. The weights at each word storage element $WSE_{i,j}$ in the interstitial memory array IMA are to be adjusted as the i column addresses and j row addresses are scanned row by row, one column at a time. An address scanning generator ASG generates this scan of i and j addresses shown applied to interstitial memory array IMA, assuming it to be a random access memory. The row address j is applied to a row multiplexer RM that selects $\delta_j$ to one input of a multiplier MULT, and the column address i is applied to a column multiplexer CM that selects $x_i$ to another input of the multiplier MULT.

Multiplier MULT is of a type providing a digital output responsive to the product of its analog input signals. Multiplier MULT may be a multiplying analog-to-digital converter, or it may comprise an analog multiplier followed by an analog-to-digital converter, or it may comprise an analog-to-digital converter for each of its input signals and a digital multiplier for multiplying together the converted signals. Multiplier MULT generates the product $x_i \delta_j$ as reduced by a scaling factor $\eta$, which is the increment or decrement to the weight stored in the currently addressed word storage element $WSE_{ij}$ in the memory array IMA. The former value of weight stored in word storage element $WSE_{ij}$ is read from memory array IMA to a temporary storage element, or latch, TS. This former weight value is supplied as minuend to a digital subtractor SUB, which receives as subtrahend $\eta x_i \delta_j$ from multiplier MULT. The resulting difference is the updated weight value which is written into word storage element $WSE_{i,j}$ in memory array IMA to replace the former weight value.

Figure 8:
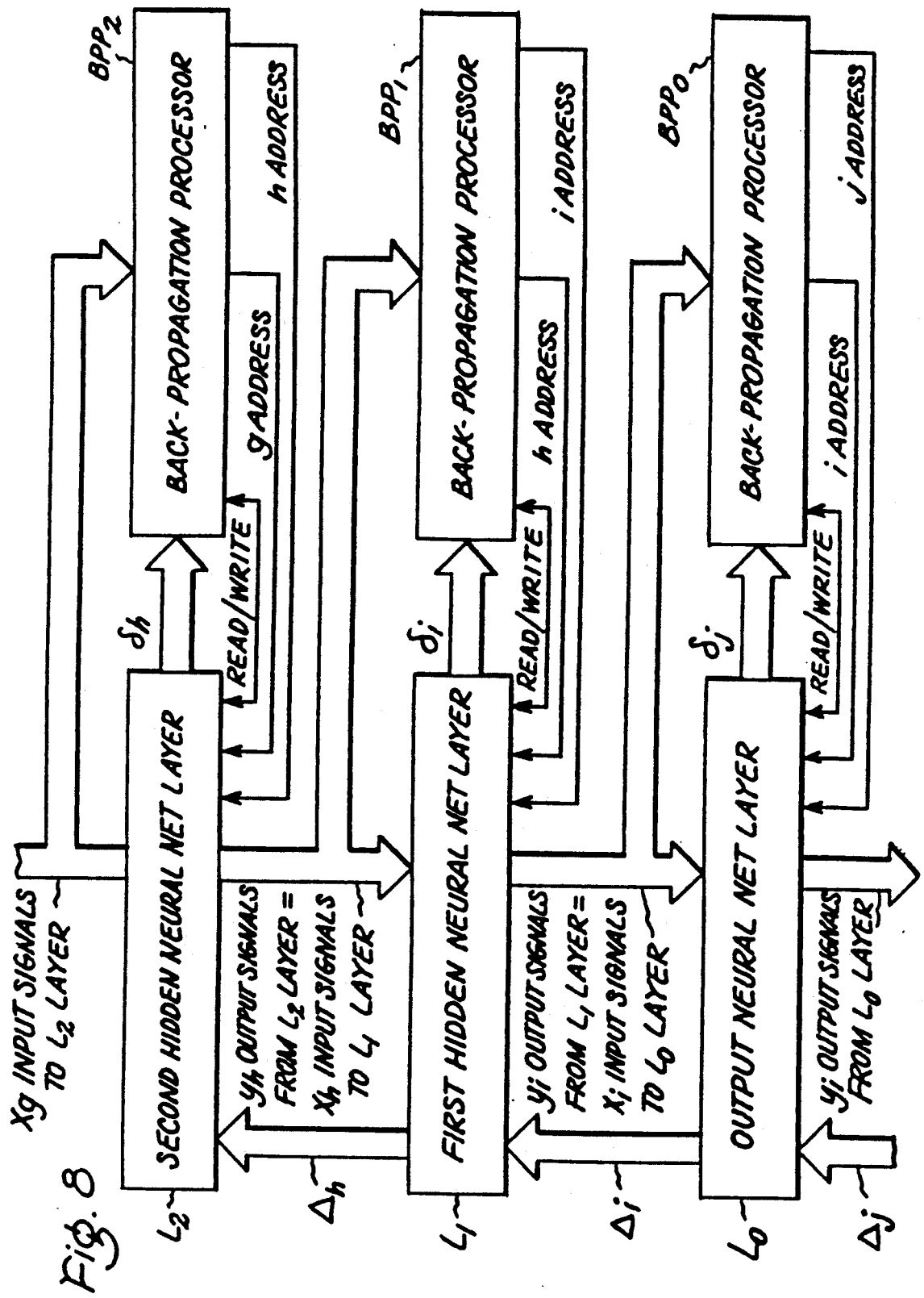
FIG. 8 is a schematic diagram of a system described by W. E. Engeler in U.S. patent applications Ser. Nos. 366,838 and 366,839, which system has a plurality of neural net layers each constructed in accordance with FIG. 1 modified manifold times per FIG. 2, with FIG. 3 modified manifold times per FIG. 5, or with FIG. 1 modified manifold times per FIG. 6.

FIG. 8 shows how trained neural net layers $L_0$, $L_1$ and $L_2$ are connected together in a system that can be trained. $L_{L0}$ is the output neural net layer that generates $y_j$ output signals; is similar to that described in connection with FIGS. 1 and 2, in connection with FIGS. 3 and 4, or in connection with FIG. 6; and is provided with a back-propagation processor $BPP_0$ with elements similar to those shown in FIG. 2, 4 or 6 for updating the weights stored in the interstitial memory array of $L_0$. $L_1$ is the first hidden neural net layer which generates $y_i$ output signals supplied to the output neural net layer as its $x_i$ input signals. These $y_i$ output signals are generated by layer $L_1$ as its non-linear response to the weighted sum of its $x_h$ input signals. This first hidden neural net layer $L_1$ is provided with a back-propagation processor $BPP_1$ similar to $BPP_0$. $L_2$ is the second hidden neural net layer, which generates $y_h$ output signals supplied to the first hidden neural net layer as its $x_h$ input signals. These $y_h$ output signals are generated by layer $L_2$ as its non-linear response to a weighted summation of its $x_g$ input signals. This second hidden layer is provided with a back-propagation processor similar to $BPP_0$ and to $BPP_1$.

FIG. 8 presumes that the respective interstitial memory array IMA of each neural net layer $L_0$, $L_1$, $L_2$ has a combined read/write bus instead of separate read input and write output busses as shown in FIG. 2, 4 or 6. FIG. 8 shows the $\Delta_j$, $\Delta_i$ and $\Delta_h$ signals being fed back over paths separate from the feed forward paths for $y_j$, $y_i$ and $y_h$ signals, which separate paths are shown to simplify conceptualization of the neural net by the reader. In actuality, as shown in FIG. 2, 4 or 6, a single path may be used to transmit $y_j$ in the forward direction and $\Delta_j$ in the reverse direction, etc. Back-propagation processor $BPP_0$ modifies the weights read from word storage elements in neural net layer $L_0$ interstitial memory array by $\eta x_i \delta_j$ amounts and writes them back to the word storage elements in a sequence of read-modify-write cycles during the training procedure. Back-propagation processor $BPP_1$ modifies the weights read from word storage elements in neural net layer $L_1$ interstitial memory array by $\eta x_h \delta_i$ amounts and writes them back to the word storage elements in a sequence of read-modify-write cycles, during the training procedure. Back-propagation processor BPP$_2$ modifies the weights read and storage elements in neural net layer L$_2$ interstitial memory array by $\eta x_g \delta_h$ amounts and writes them back to the word storage element in a sequence of read-modify-write cycles during the training procedure.

The neural nets thusfar described make extensive use of pairs of capacitors wherein the capacitances of each pair of capacitances are determined in response to a digital word, sum to a prescribed constant value, and differ so as to determine the weighting to be applied to a synapse input signal. The foregoing specification also describes the usefulness in a neural net of two pairs of capacitors, wherein the capacitances of each pair of capacitances are determined in response to the same digital word. While the capacitors C$_{i,j}$ and C$_{i,(j+N)}$ for all i and j could in some instances be fixed-value capacitors, so there would never be any alteration in the weighting of input voltages x$_i$ where i=1, ... M, such neural nets lack the capacity to adapt to changing criteria for neural responses. Such adaptation is necessary, for example, in a neural network that is to be connected for self-learning.

So it is desirable to provide for altering the capacitances of each pair of capacitors C$_{i,j}$ and C$_{(i+M),j}$ associated in FIG. 1 or 2 neural net with a respective pair of values of i and j. This alteration is to be carried out in a complementary way, so the sum of the capacitances of C$_{i,j}$ and of C$_{(i+M),j}$ remains equal to C$_k$. In FIG. 2 neural net it is also desirable to provide for altering the capacitances of each pair of capacitors C$_{i,(j+N)}$ and C$_{(i+M),(j+N)}$ in a complementary way, so the sum of their capacitances remains equal to C$_k$.

Similarly, it is desirable to provide for altering the capacitances of each pair of capacitors C$_{i,j}$ and C$_{i,(j+N)}$ associated in FIG. 3 or 4 neural net with a respective pair of values of i and j. This alteration is to be carried out in a complementary way, so the sum of the capacitances of C$_{i,j}$ and of C$_{i,(j+N)}$ remains equal to C$_k$. In FIG. 4 neural net it is also desirable to provide for altering the capacitances of each pair of capacitors C$_{(i+M),j}$ and C$_{(i+M),(j+N)}$ in a complementary way, so the sum of their capacitances of remains equal to C$_k$.

Altering the capacitances of each pair of capacitors can be implemented along the lines of W. E. Engeler's teachings in regard to "digital" capacitors having capacitances controlled in proportion to binary-numbers used as control signals, as particularly disclosed in connection with FIG. 11 of his U.S. Pat. No. 3,890,635 issued 17 June 1975, entitled "VARIABLE CAPACITANCE SEMICONDUCTOR DEVICES" and assigned to General Electric Company. Each pair of capacitors is then two similar ones of these capacitors and their capacitances are controlled by respective control signals, one of which is the one's complement of the other. Another way of realizing the pair of capacitors is to control the inverted surface potentials of a pair of similar-size metal-oxide-semiconductor (MOS) capacitors with respective analog signals developed by digital-to-analog conversion.

Such methods of constructing a pair of capacitors use separate capacitive element structures for each capacitor, portions of which capacitive element structures are unused when weighting values are chosen to be low. This undesirably tends to make the capacitive element structures take up neatly twice as much area on an integrated circuit die than is necessary, it is here pointed out.

In a method of constructing a pair of capacitors preferred by the inventor, each of a set of component capacitors with capacitances related in accordance with powers of two is selected to be a component of one or the other of the pair of capacitors, the selecting being done by field effect transistors (FETs) operated as transmission gates. This method, which requires a minimum capacitor size providing capacitance half as large as the capacitance associated with the minimum weight, easily provides for a 2$^4$:1 range of capacitive weights without requiring much concern about unbalanced stray capacitances on the balanced input lines or balanced output lines affecting the accuracy of the scaling of the differential capacitance between those lines. With present day design rules a minimum-area capacitor of three square microns is feasible, which makes a capacitor eight times as large have an area of twenty-four square microns. There is no unused portion of the capacitive element structures in this method.

Figure 9:
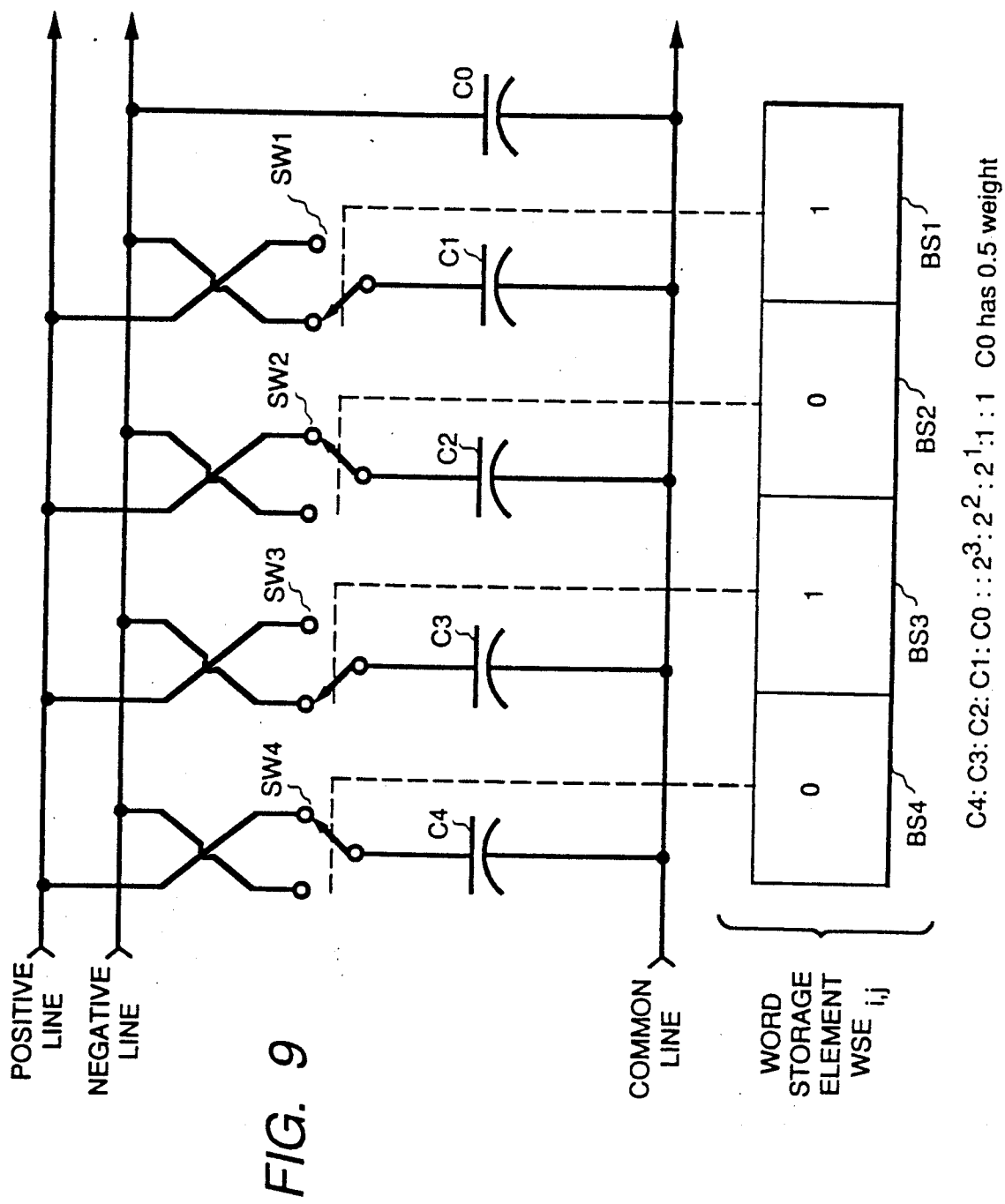
FIG. 9 is a conceptual schematic diagram of a pair of capacitors having capacitances that sum to a constant value and that are programmable responsive to digital words encoding weighting factor in two's complement arithmetic.

FIG. 9 is a conceptual schematic diagram of a pair of capacitors with digitally programmed capacitances, designed to be operated as a half bridge. The two capacitors are provided by selective connection of component capacitive elements C0, C1, C2, C3 and C4, which have a shared first plate labelled COMMON LINE and have respective second plates POSITIVE LINE and NEGATIVE LINE. As related to FIG. 1, to FIG. 2A or to FIG. 6A, COMMON LINE corresponds to the single-ended input line IL$_i$; and POSITIVE LINE and NEGATIVE LINE correspond to the balanced output lines OL$_j$ and OL$_{(j+N)}$, respectively. As related to FIG. 3 or to FIG. 4A, COMMON LINE corresponds to the single-ended output line OL$_j$; and POSITIVE LINE and NEGATIVE LINE correspond to the balanced input lines IL$_i$ and IL$_{(i+M)}$, respectively.

Component capacitive elements C0, C1, C2, C3 and C4 of the FIG. 9 capacitor pair have respective capacitances weighted in $2^0:2^0:2^1:2^2:2^3$ ratio; have respective first plates each connected to COMMON LINE; and have respective second plates connected by respective ones of single-pole-double-throw electronic switches SW1, SW2, SW3 and SW4 each to POSITIVE LINE or to NEGATIVE LINE. Single-pole-double-throw electronic switches SW1, SW2, SW3 and SW4 each provide for connection to POSITIVE LINE or to NEGATIVE LINE, as determined by a respective bit of a weighting word, which word is stored in a respective word storage element WSE$_{i,j}$. The least significant bit of the weighting word is stored in a bit store BS1 and successively more significant bits are stored in bit stores BS2, BS3 and BS4 FIG. 9 shows bit stores BS1, BS2, BS3 and BS4 as respective square boxes within the rectangular box representing word storage element WSE$_{i,j}$.

A tabulation of the various connections that can be made responsive to a four-bit weighting word, as shown in FIG. 10, suffices to indicate that a continuous set of incremental weights extending over a range with both positive and negative values is made possible by the method of constructing a pair of capacitors preferred by the inventor. The most significant bit of the four-bit weighting word governs connection of capacitive element C4 to POSITIVE LINE or to NEGATIVE LINE by electronic switch SW4 in the reverse sense that the less significant bits of the weighting word govern connections of capacitive elements C1, C2 and C3 to POSITIVE LINE or to NEGATIVE LINE by electronic switches, or multiplexers SW1, SW2 and SW3. A feeling of why this is done (which is to accommodate the use of two's complement numbers) and a feeling of why the NEGATIVE LINE is provided with the bias capacitive element C0 can be gotten from study of the FIG. 10 table.

The first, second, third and fourth component terms in the NEGATIVE LINE and POSITIVE LINE capacitances (which are to the COMMON LINE) are determined by which of the NEGATIVE LINE and POSITIVE LINE capacitive elements with weights of four, two, one, and one-half are switched to, responsive to the most significant bit, the secondmost significant bit, the thirdmost significant bit and the least significant bit of the four-bit weighting word, respectively, as read from left to right. The fifth component term in the NEGATIVE LINE capacitance is the capacitance of the bias capacitive element corresponding to the bias capacitive element C0 of FIG. 9. This fifth component term is constant in its application and is not switched responsive to the weighting word or any bit thereof.

Figure 11:
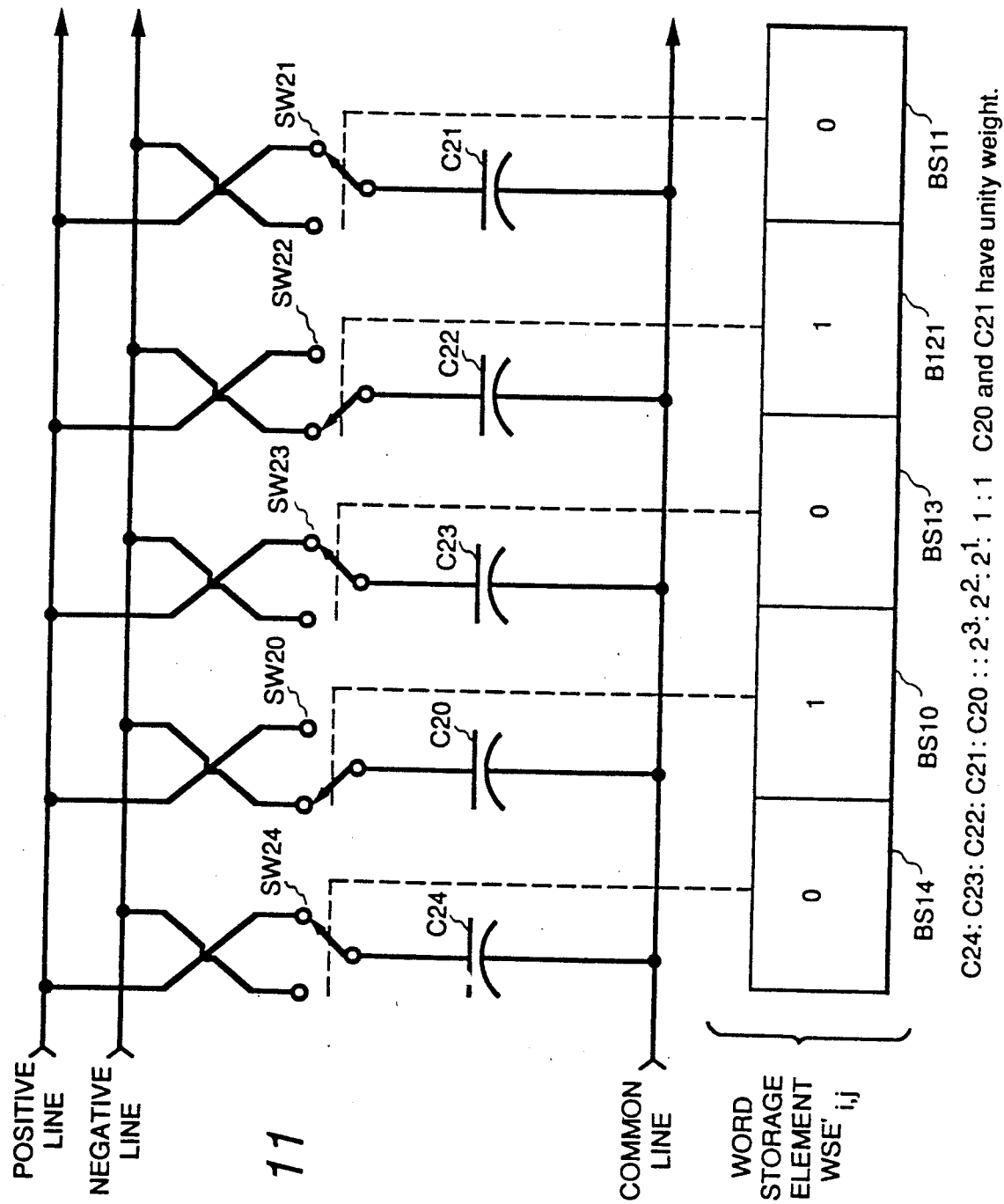
FIG. 11 is a conceptual schematic diagram of a pair of capacitors having capacitances that sum to a constant value and that are programmable responsive to digital words encoding weighting factor in one's complement arithmetic.

FIG. 11 shows another pair of capacitors with digitally programmed capacitances, designed for half bridge operation, which pair is composed of component capacitive elements C20, C21, C22, C23 and C24. Capacitive elements C20, C21, C22, C23 and C24 have respective capacitances weighted in $2^0:2^0:2^1:2^2:2^3$ ratio; have respective first plates each connected to COMMON LINE; and have respective second plates connected by respective ones of single-pole-double-throw electronic switches SW20, SW21, SW22, SW23 and SW24 each to POSITIVE LINE or to NEGATIVE LINE. Single-pole-double-throw electronic switches SW20, SW21, SW22, SW23 and SW24 each provide for connection to POSITIVE LINE or to NEGATIVE LINE, as determined by a respective bit of a weighting word, which word is stored in a respective word storage element $WSE_{i,j}$. FIG. 11 shows bit stores BS14, BS10, BS13, BS12 and BS11 as respective square boxes arranged from left to right within the rectangular box representing word storage element $WSE_{i,j}$. This arrangement from left to right is in accordance with the bit order of a binary diminished radix number system known as a one's complement system because the sign of the number can be reversed simply by replacing each bit in the number with the bit complement. The one's complement system codes arithmetic zero in two ways. The arrangement of bits shown in FIG. 11 allows conventional digital adders to be used for signed addition in one's complement arithmetic through the expedient of end-around carry, wherein the carry out from the single-bit adder generating the leftmost bit-place of the plural-bit sum is returned as carry in to the single-bit adder generating the rightmost bit-place of the plural-bit sum. It is this arrangement of bits that will be presumed to be used for one's complement arithmetic in the remainder of this specification. The bits in bit stores BS14, BS10, BS13, BS12 and BS11 control electronic switches SW24, SW20, SW23, SW22 and SW21, respectively. The leftmost bit of the five-bit weighting word governs connection of capacitive element C24 to POSITIVE LINE or to NEGATIVE LINE by electronic switch SW24 in the reverse sense that the bits of the weighting word to the right govern connections of capacitive elements C20, C23, C22 and C21 to POSITIVE LINE or to NEGATIVE LINE by electronic switches, or multiplexers SW20, SW23, SW22 and SW21.

Study of the FIG. 12 table, which tabulates the capacitances between COMMON LINE and each of the POSITIVE LINE and NEGATIVE LINE connections for the various one's complement numbers used as weighting words in the FIG. 11 pair of digitally programmable capacitors, helps provide a feeling of how this accommodates the use of one's complement numbers. The first, second, third, fourth and fifth component terms in the NEGATIVE LINE and POSITIVE LINE capacitances (which are to the COMMON LINE) are determined by which of the NEGATIVE LINE and POSITIVE LINE capacitive elements with weights of four, one-half two, one, and one-half are switched to, responsive to the respective bits of the five-bit weighting word as read from left to right.

The arithmetic of the one's complement number system for the set of weighting words used in the FIG. 11 capacitor pair has two zeroes, a "positive" zero of 00000 and a "negative" zero of 11111. When the interstitial memory array IMA has its contents modified by the increment $\eta x_i \delta_j$ supplied in two's complement form from multiplier MULT as shown in FIG. 7, the effects on the neural net training of this double zero arithmetic can be suppressed by the subtractor SUB being of the type using end-around carry. Alternatively, the effects of the double zero arithmetic may be left unsuppressed by subtractor SUB to make change between excitory and inhibitory weights less inclined to happen.

The FIG. 11 capacitor pair has the advantage for half bridge operation that the range of excitory weights is as wide as the range of inhibitory weights, which may overweigh in design considerations the disadvantages of the extra bit storage and somewhat more complicated arithmetic used in training. Symmetry in the ranges of available excitory and inhibitory weights is an especially important design consideration where the range of available weights is very restricted—such as just $-1$, 0 and $+1$ in a modification of the FIG. 11 capacitor pair wherein elements C22, SW22, C23, SW23, C24, SW24, BS12, BS13 and BS14 are dispensed with. Also, though there is extra bit storage in the FIG. 11 capacitor pair than in the FIG. 9 capacitor pair, there is greater regularity in the weighting capacitor pair structure with all component MOS capacitors being switched.

A MOS capacitor in a monolithic integrated circuit inherently has a substantial stray capacitance to substrate ground from the one of its two plates adjacent to the substrate. To prevent such stray capacitance appearing in unbalanced form, more on one of the POSITIVE LINE and NEGATIVE LINE than on the other, the component capacitive elements C0, C1, C2, C3 and C4 of FIG. 9 are poled so as to place their stray capacitances to substrate on the COMMON LINE. Similarly, in FIG. 11 the component capacitive elements C20, C21, C22, C23 and C24 are poled so as to place their stray capacitances to substrate on the COMMON LINE. This balancing out of stray capacitance is also done in the capacitor quads of FIGS. 24 and 25.

The multiplexers employed in various portions of the circuits described in this specification are customarily constructed of single-pole switch elements, similar to the SW1, SW2, SW3 and SW4 switch elements of FIG. 9 and to the SW21, SW22, SW23 and SW24 switch elements of FIG. 11. Each of these single-pole switch elements is conventionally a pair of so-called "transmission gate" connections of one or more field effect transistors in CMOS design. A suitable transmission gate is provided by the paralleled channels of a p-channel FET and an n-channel FET having oppositely swinging control voltages applied to their respective gate electrodes to control the selective conduction of those paralleled channels.

FIG. 9 shows the SW4 switch element connected to POSITIVE LINE and NEGATIVE line oppositely from the SW1, SW2 and SW3 switch elements; and FIG. 11 shows the SW24 switch element connected to POSITIVE LINE and NEGATIVE line oppositely from the SW1, SW2 and SW3 switch elements. In an actual integrated circuit layout of the FIG. 9 capacitor pair, rather than this being done for the various word storage elements, the bit lines can write to the opposite halves of the flip-flops providing bit stores BS4 that the bit lines write to the flip-flops providing bit stores BS1, BS2 and BS3. Similarly, in an actual integrated circuit layout of the FIG. 11 capacitor pair, rather than this being done for the various word storage elements, the bit lines can write to the opposite halves of the flip-flops providing bit stores BS24 that the bit lines write to the flip-flops providing bit stores BS21, BS22 and BS23.

Figure 13:
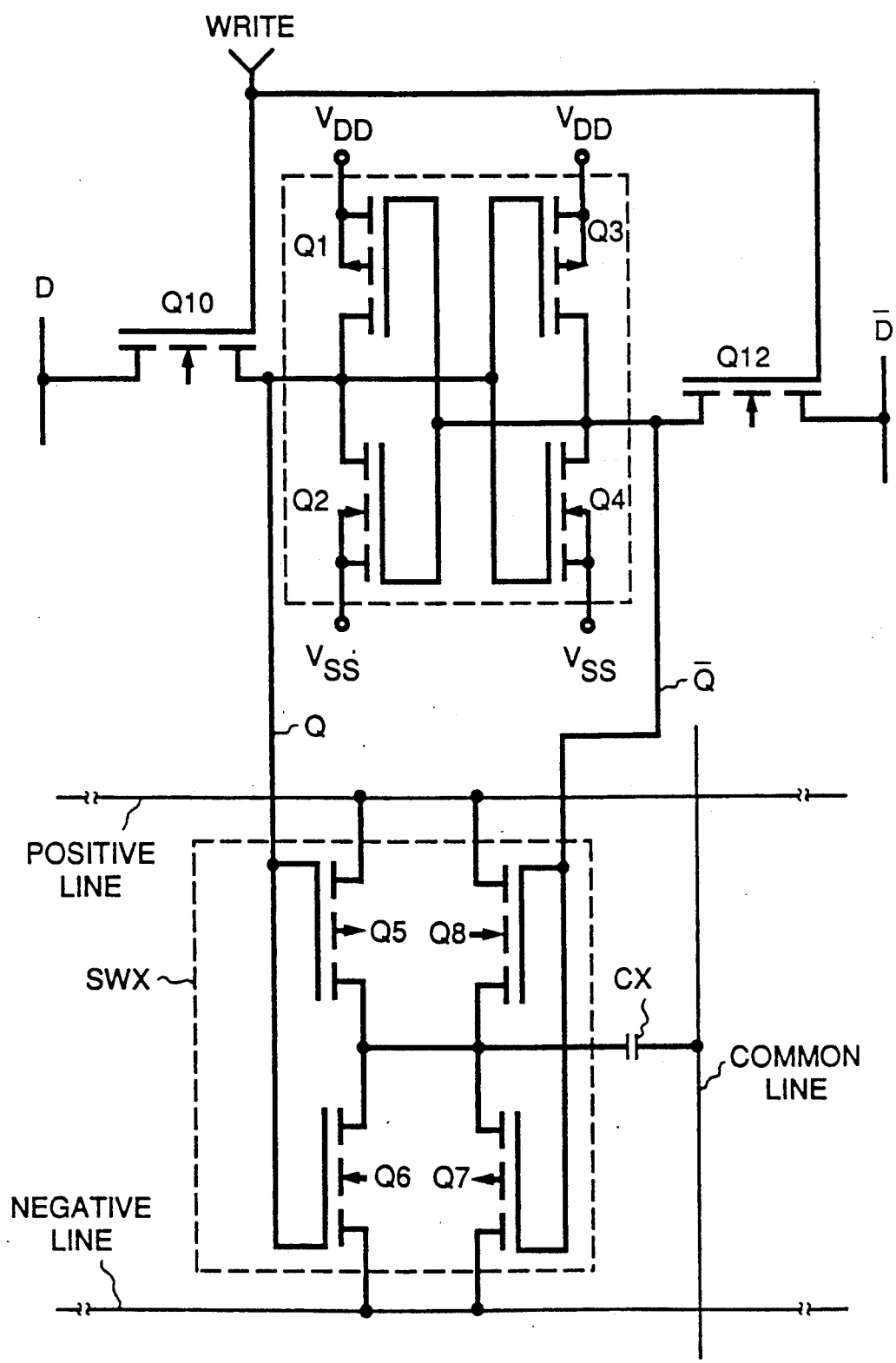
FIG. 13 is a schematic diagram showing in greater detail the electrical connections of one of the switched capacitive elements used in the FIG. 9 or FIG. 11 pair of capacitors.
Figure 14:
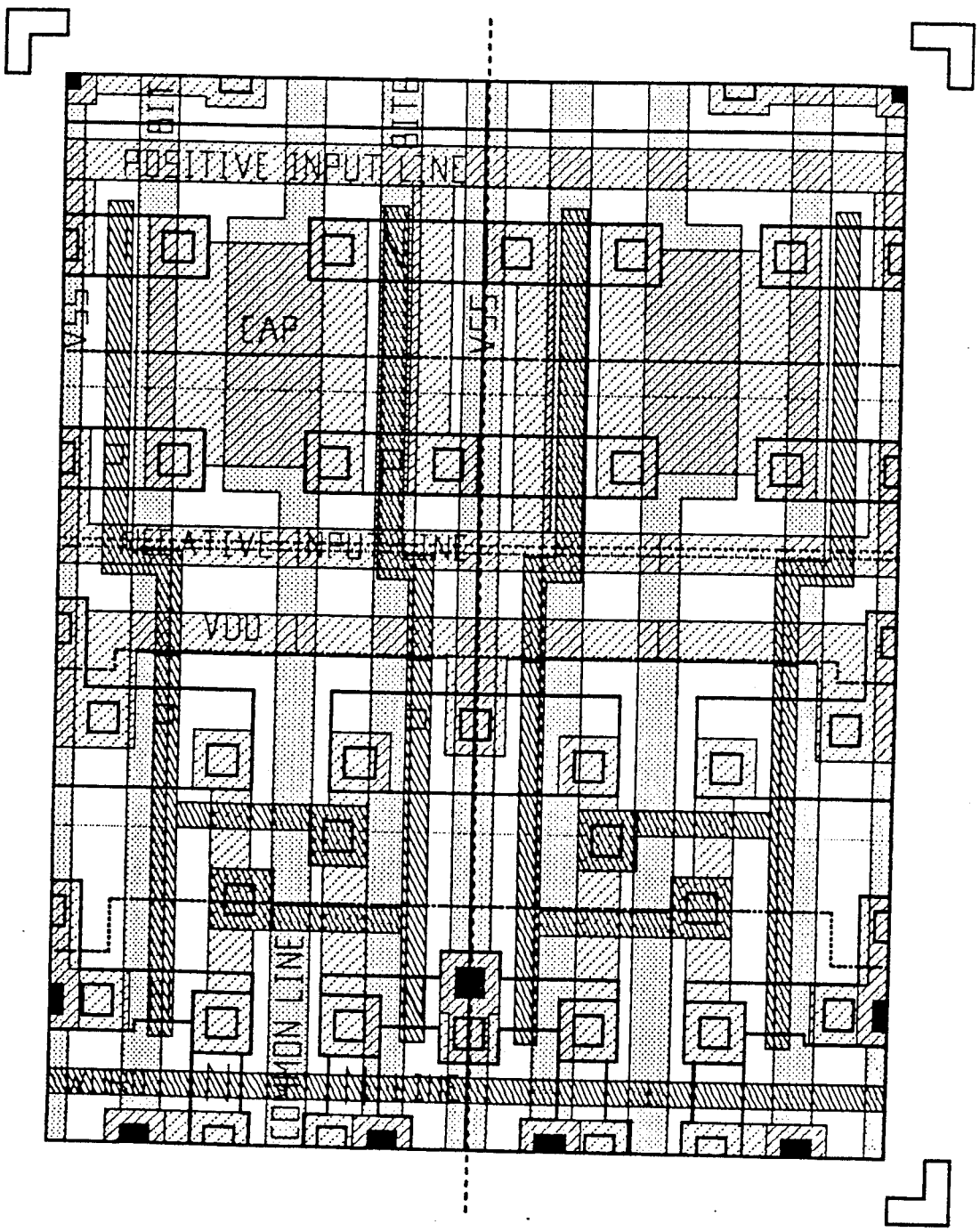
FIG. 14 is a view of a portion of the top surface of a monolithic integrated circuit in which reposes two of the switched capacitive elements and the single-bit storage elements for storing their respective control bits, which FIG. 14 has been labelled to indicate the location of circuit elements. This view can be analyzed in accordance with a normal procedure of designers of monolithic integrated circuits using stacked transparencies of different colors reproducing the masks of FIGS. 15, 16, 17, 18, 19, 20, 21, 22 and 23, respectively, all aligned by superposing their corresponding corner alignment keys. The masks of FIGS. 15, 16, 17, 18, 19, 20, 21, 22 and 23 are those used for constructing, in accordance with conventional complementary metal oxide semiconductor (CMOS) processing, each pair of capacitors that are adjustable in complementary way to a weighting word and for the word storage element to store that weighting word.
Figure 16:
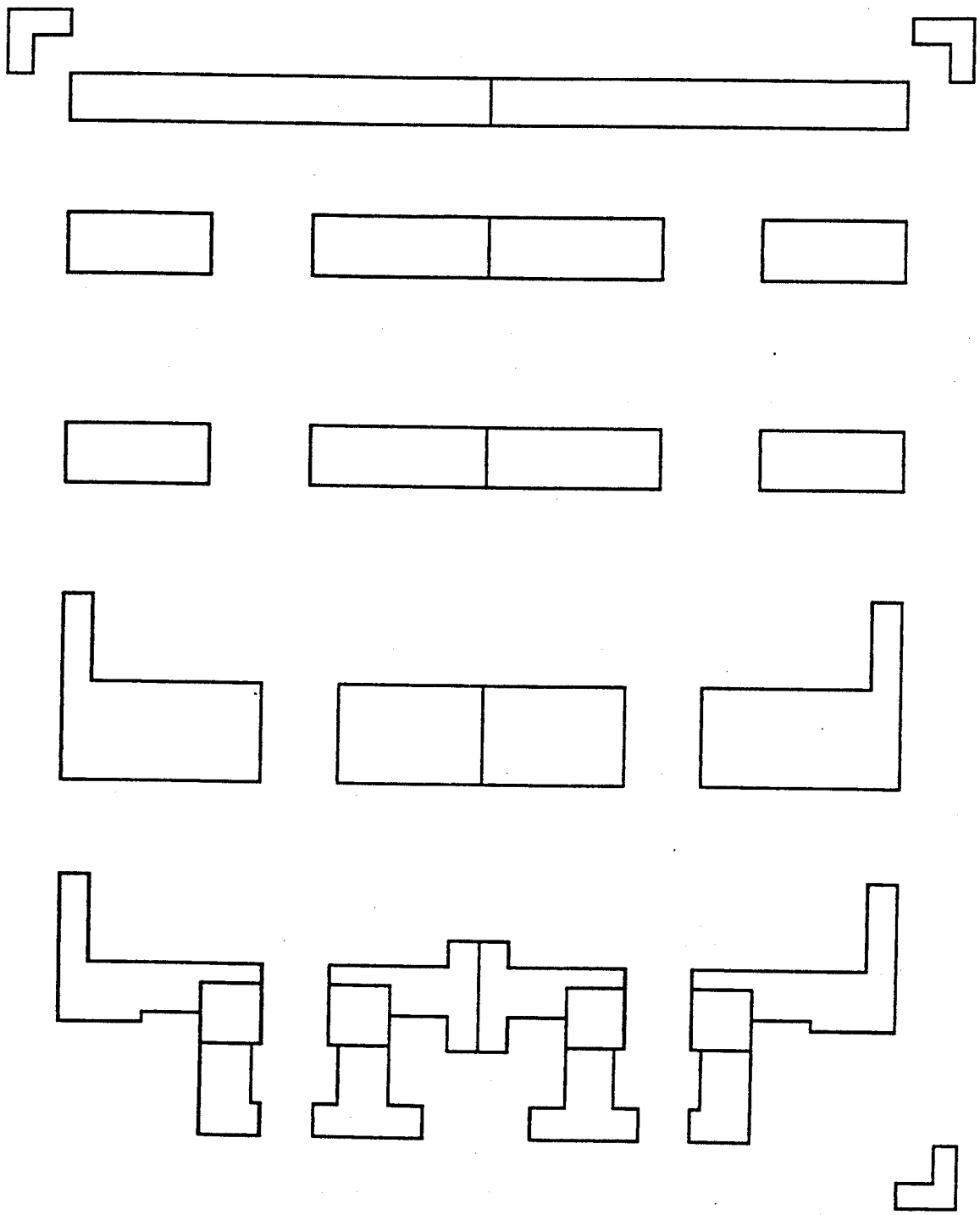
FIG. 16 is the mask defining the active area regions of both the n- and p-channel devices in a FIG. 14 double switched capacitor structure. These active area regions, covered by relatively thin gate oxide, are within rectangular boxes and include source, drain and channel regions. The region that surrounds each of these active area regions is a relatively thick field oxide area.
Figure 17:
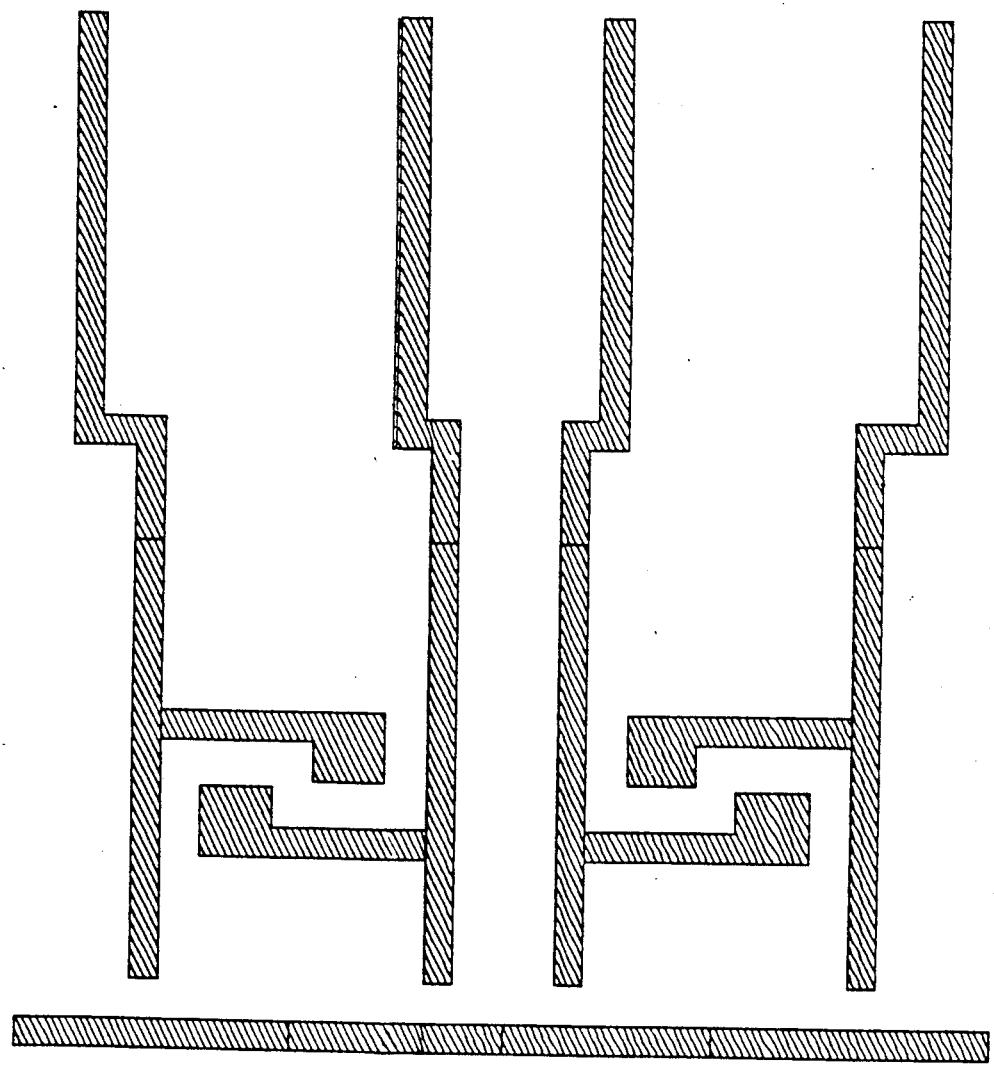
FIG. 17 is the mask defining the shape of the polycrystalline silicon conductors used in a FIG. 14 switched capacitor structure as gate electrodes in both the n- and p-channel field-effect transistors and for short-run conductors.
Figure 20:
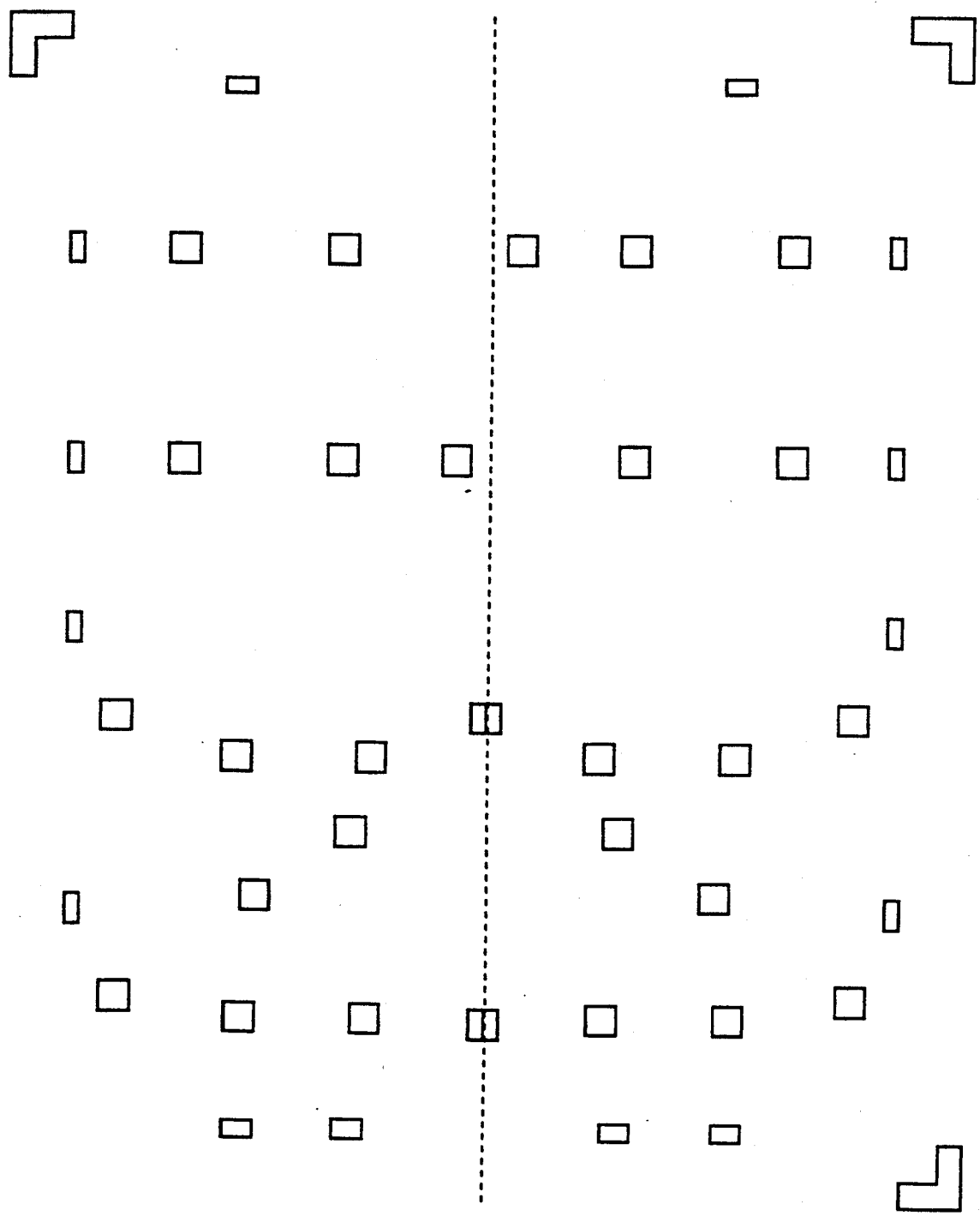
FIG. 20 is the mask locating, in a FIG. 14 double switched capacitor structure, the position of contact openings between the first metallization layer and all of the following: the polycrystalline silicon conductors defined by the FIG. 17 mask, the p+ source and drain regions of the p-channel field-effect transistors, and the n+ source and drain regions of the n-channel field-effect transistors.
Figure 21:
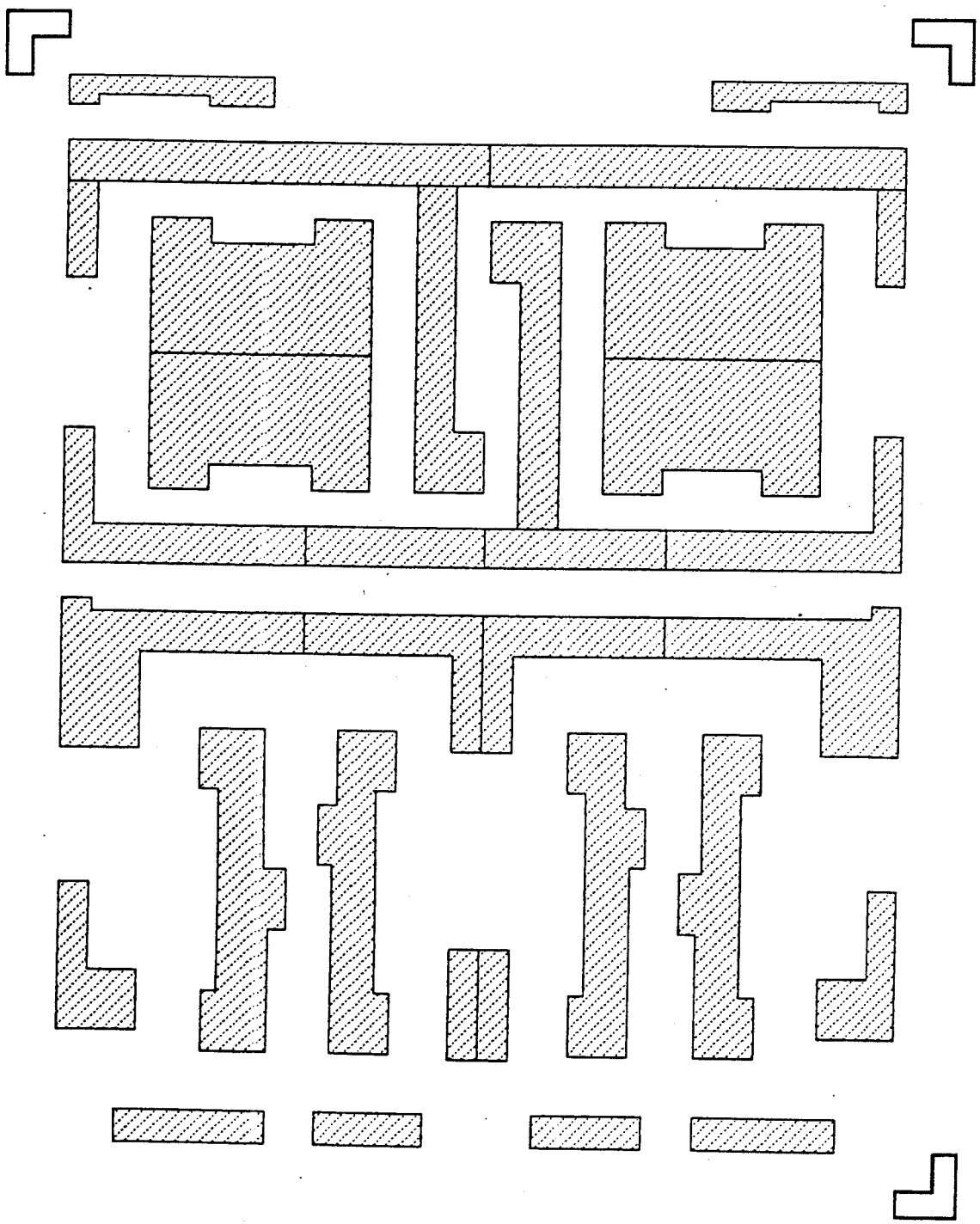
FIG. 21 is the mask defining the pattern of the first metallization layer in a FIG. 14 double switched capacitor structure.
Figure 22:
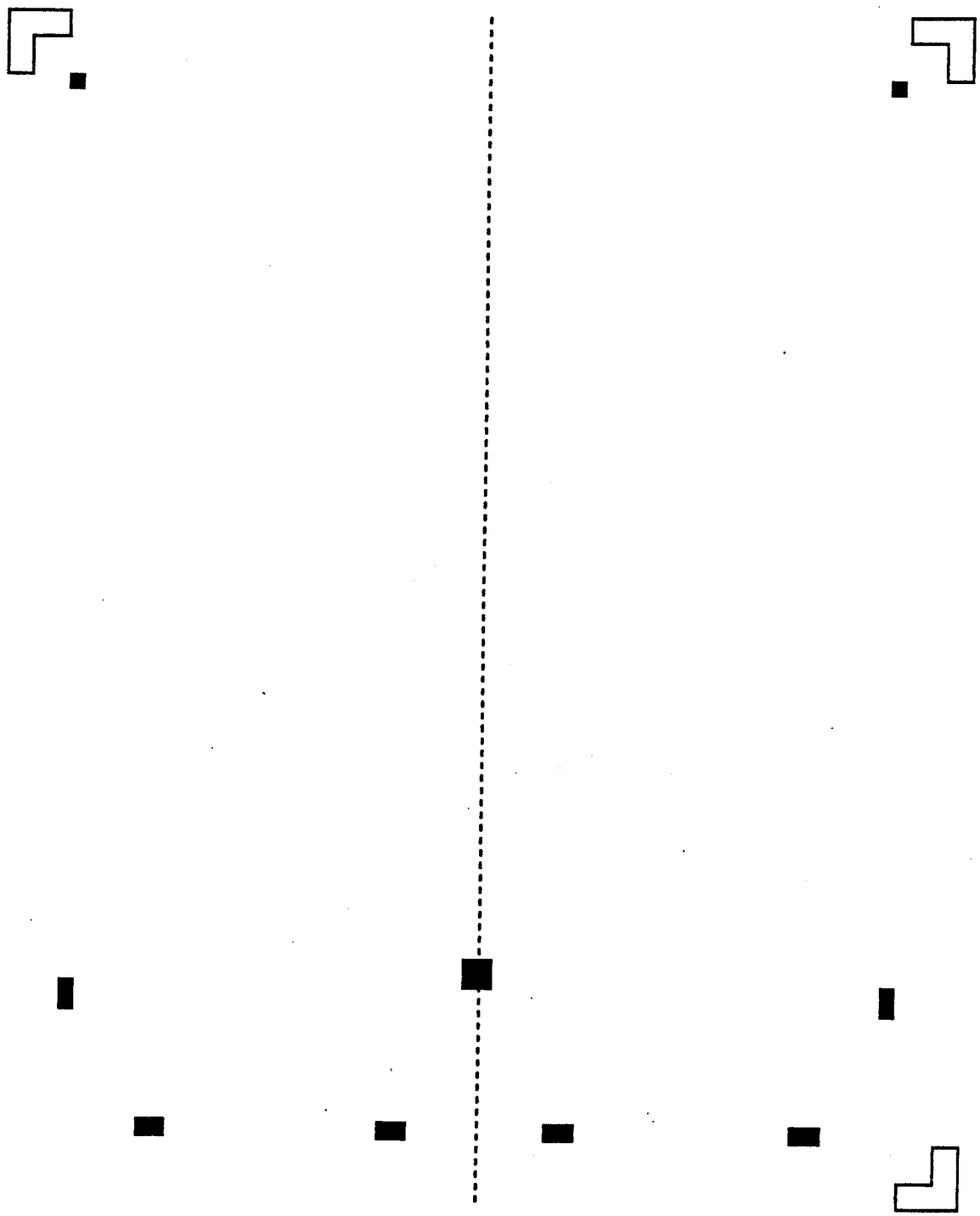
FIG. 22 is the mask locating the position of contact openings between the first and second metallization layers in a FIG. 14 double switched capacitor structure.
Figure 23:
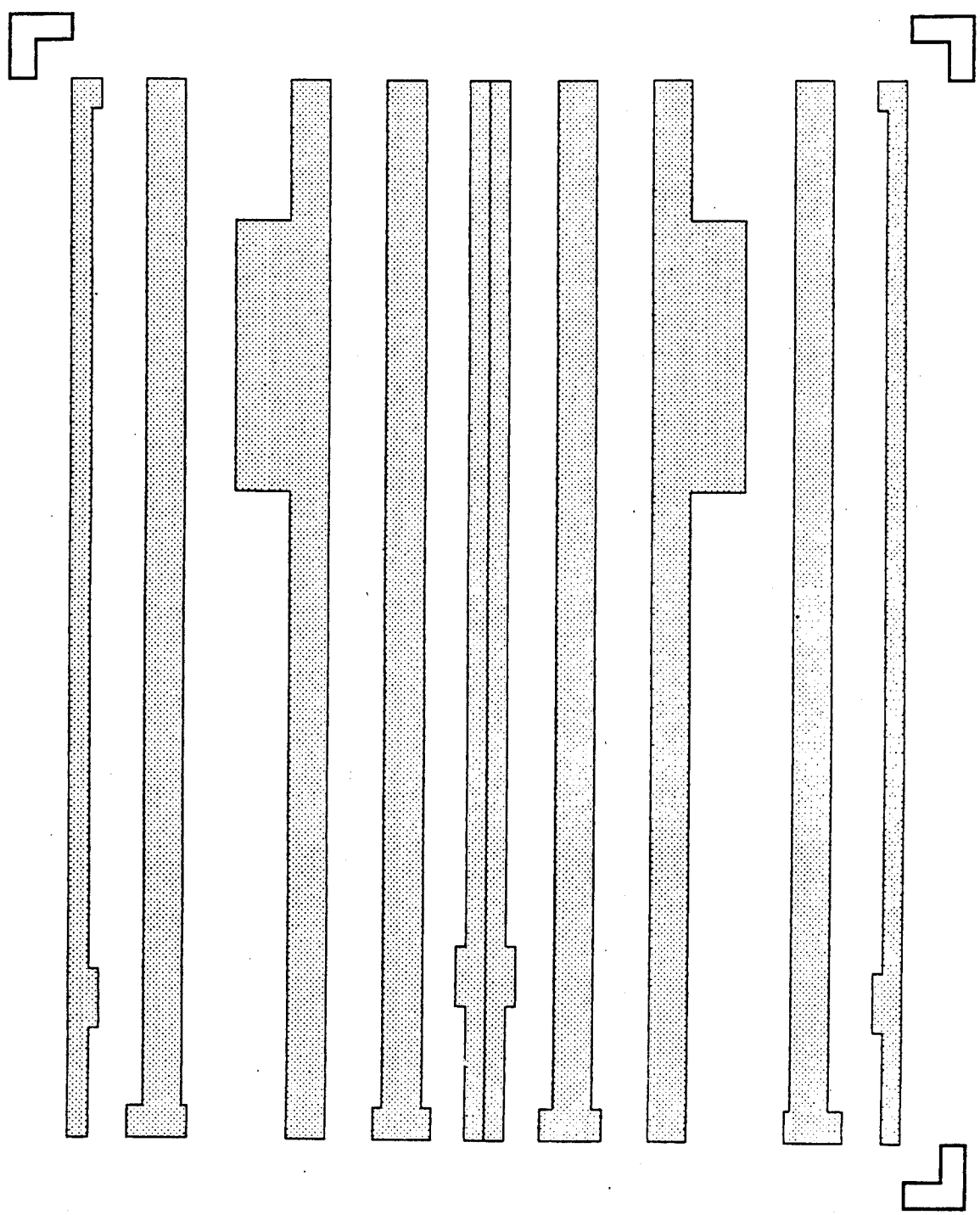
FIG. 23 is the mask defining the pattern of the second metallization layer in a FIG. 14 double switched capacitor structure.

FIG. 13 shows in detail the electrical connections to a corresponding memory element MEX of capacitive element CX that is one of the FIG. 9 switched capacitive elements C1, C2, C3 and C4. The memory element MEX is a flip-flop connection of enhancement-mode field effect transistors (FETs) Q1, Q2, Q3 and Q4 and is supplied a relatively positive operating supply voltage $V_{DD}$ and a relatively negative operating supply voltage $V_{SS}$. One plate of capacitive element CX is shown with fixed connection to COMMON LINE. The switch element SWX, used to connect the other plate of capacitive element CX selectively either to POSITIVE LINE or to NEGATIVE LINE, comprises enhancement-mode FETs Q5, Q6, Q7 and Q8. Enhancement-mode n-channel FETs Q10 and Q11 are selectively rendered conductive by a WRITE command applied to their gate electrodes to impose the bit conditions D and DBAR on the complementary output connections Q and QBAR of memory element MEX to switch element SWX.

If D is high (e.g., $V_{DD}$) and DBAR is low (e.g., $V_{SS}$), when the WRITE command is no longer applied to the gate electrodes of Q10 and Q12, DBAR being low conditions Q1 to be conductive and Q2 to be nonconductive to maintain Q high at $V_{DD}$ potential; and D being high conditions Q3 to be nonconductive and Q4 to be conductive to maintain QBAR low at $V_{SS}$ potential. In switch element SWX, Q being high conditions p-channel FET Q5 for non-conduction and n-channel FET Q6 for conduction, and QBAR being low conditions p-channel FET Q7 for conduction and n-channel FET Q8 for non-conduction. The NEGATIVE LINE is connected to capacitive element CX by FETs Q6 and Q7 being conditioned for conduction; and the POSITIVE LINE is disconnected from capacitive element CX by FETs Q5 and Q8 being conditioned for nonconduction.

If D is low (e.g., $V_{SS}$) and DBAR is high (e.g., $V_{DD}$), when the WRITE command is no longer applied to the gate electrodes of Q10 and Q12, DBAR being high conditions Q1 to be nonconductive and Q2 to be conductive to maintain Q low at $V_{SS}$ potential; and D being low conditions Q3 to be conductive and Q4 to be nonconductive to maintain QBAR high at $V_{DD}$ potential. In switch element SWX, Q being low conditions p-channel FET Q5 for conduction and n-channel FET Q6 for non-conduction, and QBAR being high conditions p-channel FET Q7 for non-conduction and n-channel FET Q8 for conduction. The POSITIVE LINE is connected to capacitive element CX by FETs Q5 and Q8 being conditioned for conduction; and the NEGATIVE LINE is disconnected from capacitive element CX by FETs Q6 and Q7 being conditioned for nonconduction.

FIGS. 14–23 depict two basic monolithic structure cells, the one at the left of these figures and the one at the left of these figures being laid out as mirror duplicates of each other. The basic monolithic structure cell can be replicated a small number of times to form a pair of weighting capacitors composed of switched capacitive elements. A network of such pairs of weighting capacitors formed by row and column array of the basic monolithic structure cells, with adjacent column structures mirroring each other, can be used in constructing weighted summation circuitry in accordance with the invention. The smallest switched capacitive element(s) can each consist of one basic monolithic structure cell, and the larger switched capacitive elements can each be a combination of a plurality of the basic monolithic structure cells having electrical connections in parallel. The bit storage element need not be duplicated if a single bit storage element is used to control both sets of electronic switches in the combination, however, and modifications of the monolithic circuit layout that eliminate the redundant bit storage element are possible. A quad of weighting capacitors composed of switched capacitive elements can simply comprise two pairs of weighting capacitors, each pair composed of switched capacitive elements as just described, but again there are redundant bit storage elements. Layout modifications are possible that can remove these redundant bit storage elements, so there is the possibility of layout reconfiguration to save area on the monolithic die. Reconfigurations where the first and second switched capacitive elements controlled by the same bit storage element adjoin each other can give rise to T-shaped or L-shaped basic monolithic structure cells. A row of T-shaped or L-shaped basic monolithic structure cells exhibits teeth along one edge of the row. Where there are rows of T-shaped or L-shaped basic monolithic structure cells, a technique to save area on the monolithic die is to flip alternate rows of cells about their row axes so their teeth can be interleaved.

Figure 24:
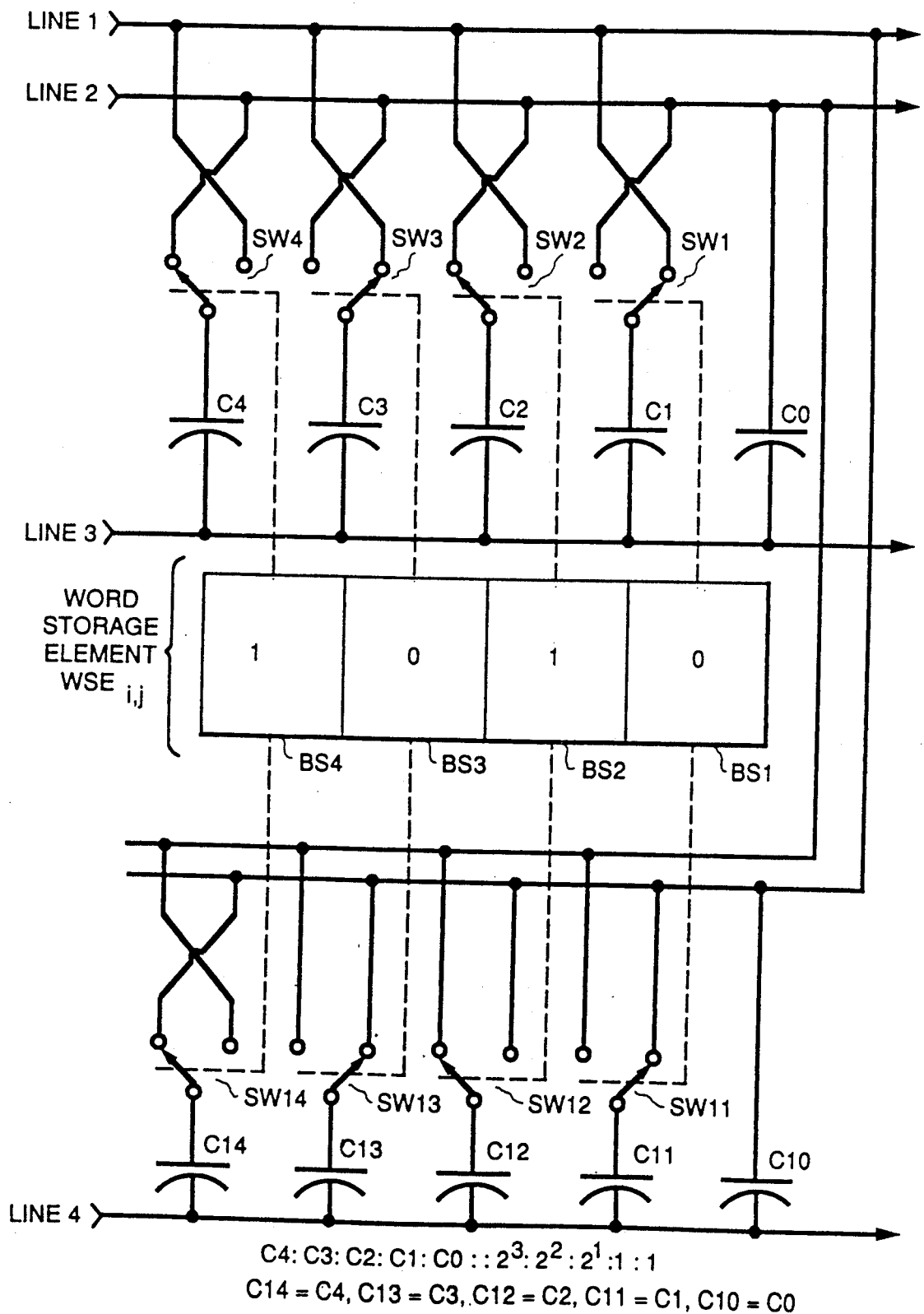
FIG. 24 is a conceptual schematic diagram of a quad connection of four capacitors, the capacitances of which are programmable responsive to digital words encoding weighting factor in two's complement arithmetic.

FIG. 24 is a conceptual schematic diagram of a quad connection of four capacitors having their capacitances digitally controlled by two's complement weighting factor words. Lines LINE1, LINE2, LINE3 and LINE4 of FIG. 24 may be considered to correspond to POSITIVE LINE, to NEGATIVE LINE, to COMMON LINE and to ac ground, respectively, of FIG. 9. One pair of the four capacitors in the quad is provided by selective connection of component capacitive elements C0, C1, C2, C3 and C4 to lines LINE1 and LINE2. Capacitive elements C0, C1, C2, C3 and C4 have respective capacitances weighted in $2^0:2^0:2^1:2^2:2^3$ ratio; have respective first plates each connected to LINE3; and have respective second plates connected by respective ones of single-pole-double-throw electronic switches SW1, SW2, SW3 and SW4 each to LINE1 or to LINE2. Single-pole-double-throw electronic switches SW1, SW2, SW3 and SW4 each provide for connection to LINE1 or to LINE2, as determined by a respective bit of a weighting word, which word is stored in a respective word storage element $WSE_{i,j}$. The other pair of the four capacitors in the quad is provided by selective connection of component capacitive elements C10, C11, C12, C13 and C14. Capacitive elements C10, C11, C12, C13 and C14 have respective capacitances weighted in $2^0:2^0:2^1:2^2:2^3$ ratio; have respective first plates each connected to LINE4; and have respective second plates connected by respective ones of single-pole-double-throw electronic switches SW11, SW12, SW13 and SW14 each to LINE1 or to LINE2. Component capacitive elements C10, C11, C12, C13 and C14 have respective capacitances which correspond to the respective capacitances of component capacitive elements C0, C1, C2, C3 and C4, respectively. Single-pole-double-throw electronic switches SW11, SW12, SW13 and SW14 each provide for connection to LINE1 or to LINE2 in a way complementary to the way the electronic switches SW1, SW2, SW3 and SW4 do, as determined by a respective bit of the weighting word stored in a respective word storage element $WSE_{i,j}$.

Lines LINE1, LINE2, LINE3 and LINE4 of FIG. 24 have thusfar been considered to correspond to POSITIVE LINE, to NEGATIVE LINE, to COMMON LINE and to ac ground, respectively. In such case, to prevent stray capacitance to substrate ground appearing in unbalanced form on the POSITIVE LINE and the NEGATIVE LINE—i.e., more on one of the lines LINE1 and LINE2 than on the other—the component capacitive elements C0, C1, C2, C3 and C4 are poled so as to place their stray capacitances to substrate on LINE3, the COMMON LINE. The component capacitive elements C10, C11, C12, C13 and C14 are poled so as to connect to LINE4, and thence to substrate ground, their stray capacitances to substrate, which avoids their having to be charged and discharged at all.

Alternatively, lines LINE1, LINE2, LINE3 and LINE4 of FIG. 24 can be considered to correspond to COMMON LINE, to ac ground, to POSITIVE LINE and to NEGATIVE LINE, respectively. In such case, to prevent stray capacitance to substrate ground appearing in unbalanced form, more on one of the lines POSITIVE LINE and NEGATIVE LINE than on the other, the component capacitive elements C0, C1, C2, C3 and C4 are poled so as to place their stray capacitances to substrate on the POSITIVE LINE, LINE3; and the component capacitive elements C10, C11, C12, C13 and C14 are poled so as to place their stray capacitances to substrate on the NEGATIVE LINE, LINE4. However, this method of avoiding unbalanced stray capacitance to substrate appearing on the POSITIVE LINE and NEGATIVE LINE relies on matching between the stray capacitances of component capacitive elements C0, C1, C2, C3 and C4 and the stray capacitances of component capacitive elements C10, C11, C12, C13 and C14, unless the stray capacitances to substrate of the POSITIVE LINE and of the NEGATIVE LINE is shunted by relatively low source impedance balanced drive from differential amplifier $ID_j$. So, the former method of avoiding unbalanced stray capacitance to substrate appearing on the POSITIVE LINE and NEGATIVE LINE is preferred over the latter method, at least where these lines are to be differentially sensed by an output driver amplifier $OD_j$.

The FIG. 6 type of neural net uses pairs of input lines driven by balanced input signal for connection to the pairs of differentially sensed output lines by weighting capacitors connected in quad configurations and operated as full bridges. In the FIG. 6 type of neural net, lines LINE3 and LINE4 of FIG. 24 can be chosen to correspond to one of the pairs of input lines driven by balanced input signals, and LINE1 and LINE2 can be considered to correspond to one of the pairs of differentially sensed output lines. This choice arranges for the unbalanced stray capacitance to substrate appearing on LINE3 and LINE4 to be shunted by relatively low source impedance balanced drive from differential amplifier $ID_i$.

Figure 25:
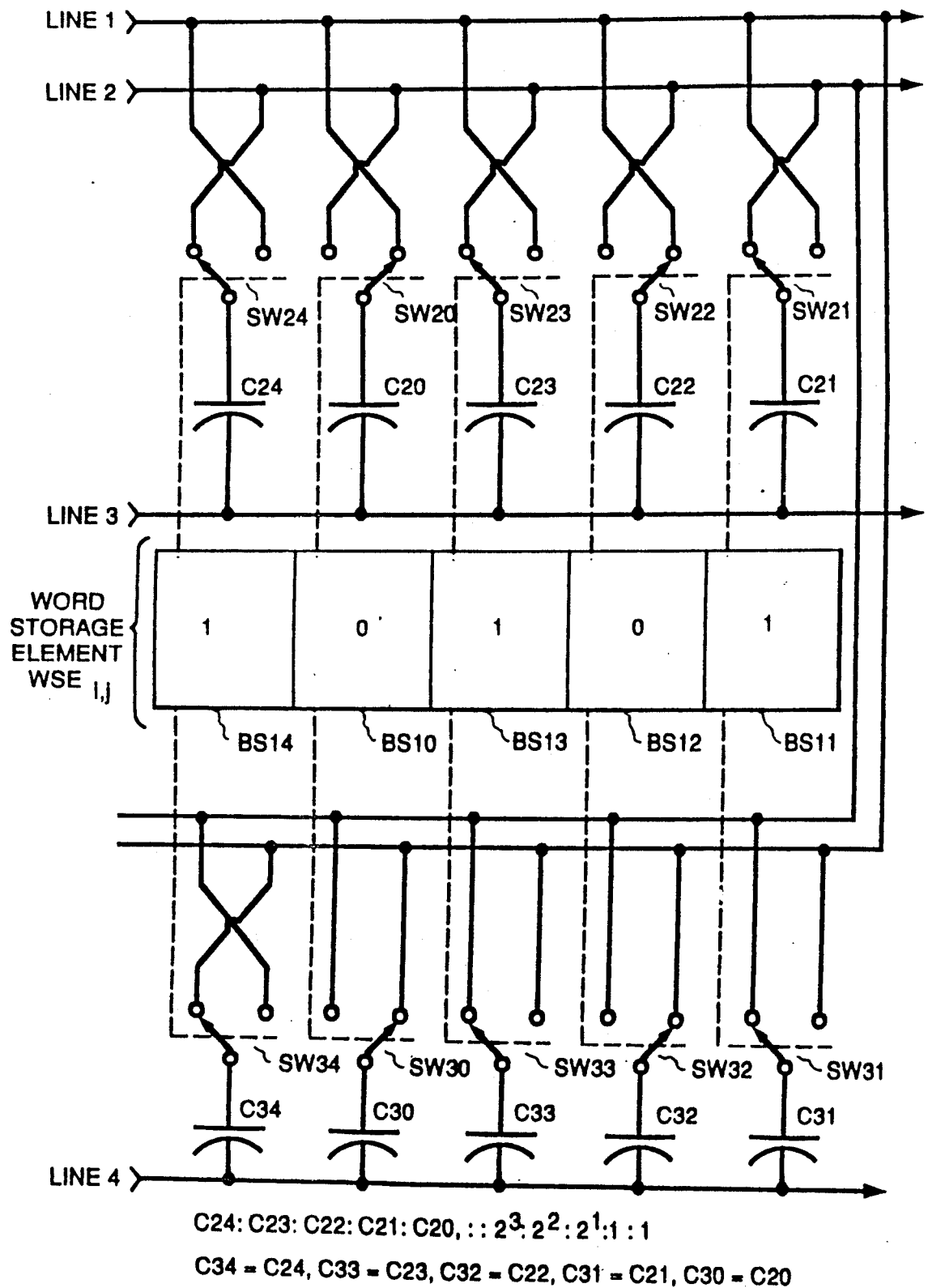
FIG. 25 is a conceptual schematic diagram of a quad connection of four capacitors, the capacitances of which are programmable responsive to digital words encoding weighting factor in one's complement arithmetic.

FIG. 25 is a conceptual schematic diagram of how a quad connection of four capacitors having their capacitances digitally controlled by one's complement weighting factor words can be constructed. One pair of the four capacitors is provided by selective connection of component capacitive elements C20, C21, C22, C23 and C24. Capacitive elements C20, C21, C22, C23 and C24 have respective capacitances weighted in $2^0:2^0:2^1:2^2:2^3$ ratio; have respective first plates each connected to LINE3; and have respective second plates connected by respective ones of single-pole-double-throw electronic switches SW20, SW21, SW22, SW23 and SW24 each to LINE1 or to LINE2. Single-pole-double-throw electronic switches SW24, SW20, SW23, SW22 and SW21 each provide for connection to LINE1 or to LINE2, as determined by successive bits of a weighting word stored in bit stores BS14, BS10, BS13, BS12 and BS11 of a respective word storage element $WSE_{i,j}'$. The other pair of the four capacitors is provided by selective connection of component capacitive elements C30, C31, C32, C33 and C34. Capacitive elements C30, C31, C32, C33 and C34 have respective capacitances weighted in $2^0:2^0:2^1:2^2:2^3$ ratio; have respective first plates each connected to LINE 4; and have respective second plates connected by respective ones of single-pole-double-throw electronic switches SW30, SW31, SW32, SW33 and SW34 each to LINE1 or to LINE2. Component capacitive elements C30, C31, C32, C33 and C34 have respective capacitances which correspond to the respective capacitances of component capacitive elements C20, C21, C22, C23 and C24, respectively. Single-pole-double-throw electronic switches SW34, SW30, SW33, SW32 and SW31 each provide for connection to LINE1 or to LINE2 in a way complementary to the way the electronic switches SW24, SW20, SW23, SW22 and SW21 do, as determined by successive bits of a weighting word stored in bit stores BS14, BS10, BS13, BS12 and BS11 of a respective word storage element $WSE_{i,j}'$.

In the FIG. 25 quad connection of capacitors, as in the FIG. 24 quad connection of capacitors, lines LINE1, LINE2, LINE3 and LINE4 can be considered to correspond to POSITIVE LINE, to NEGATIVE LINE, to COMMON LINE and to ac ground, respectively, or alternatively, can be considered to correspond to COMMON LINE, to ac ground, to POSITIVE LINE and to NEGATIVE LINE, respectively. In the FIG. 6 type of neural net lines LINE1 and LINE2 of FIG. 25 can be considered to correspond to one of the pairs of input lines driven by balanced input signals, and LINE3 and LINE4 can be considered to correspond to one of the pairs of differentially sensed output lines. In any case, the component capacitive elements C20, C21, C22, C23 and C24 are poled so as to place their stray capacitances to substrate on LINE3; and the component capacitive elements C30, C31, C32, C33 and C34 are poled so as to place their stray capacitances to substrate on LINE4. The reasons for this are the same as offered in regard to the FIG. 24 quad connection of capacitors.

FIG. 26 illustrates how, in order to provide greater resolution in weighting, at every i,j crosspoint in the neural net layer a plurality of similar weighting capacitor quads are employed rather than just a single weighting capacitor quad comprising digital capacitors $DC_{i,j}$, $DC_{(i+m),j}$, $DC_{i,(j+n)}$ and $DC_{(i+m),(j+n)}$. In FIG. 26, one weighting capacitor quad $MSWC_{i,j}$ is used to provide weighting responsive to the leftmost (generally more significant) bits of the eight-bit weighting word stored in the word storage element $WSE_{i,j}$ of the interstitial memory array, and another weighting capacitor quad $LSWC_{i,j}$ is used to provide weighting responsive to the rightmost (generally less significant) bits of the weighting word stored in the word storage element $WSE_{i,j}$ of the interstitial memory array. The relative significances of the weighting provided by the weighting capacitor quad $MSWC_{i,j}$ and by the other weighting capacitor quad $LSWC_{i,j}$ are in a prescribed ratio.

Much as previously, weighting capacitor quad $MSWC_{i,j}$ supplies to a charge-sensing amplifier $FDQS_j$ weighted response to $x_i$ input signal. Another charge-sensing amplifier $FDQS_{(j+n)}$ besides charge sensing amplifier $FDQS_j$ is used for the forward propagation of signals at the i,j crosspoint of the neural net layer and is supplied via weighting capacitor quad $LSWC_{i,j}$ with another weighted response to $x_i$ input signal. The output port of analog multiplier $AM_j$ supplies analog signal to the input port of an analog scaling amplifier $ASA_j$, and the analog scaling amplifier $ASA_j$ responds with an analog signal at its output port that is scaled down from the analog signal at its input port by a factor equal to the ratio of the relative significances of the weighting provided by the weighting capacitor quad MSWCi,j and by the other weighting capacitor quad $LSWC_{i,j}$. The input port of charge-sensing amplifier $FDQS_{(j+N)}$ and the output port of the analog scaling amplifier $ASA_j$ are multiplexed to the weighting capacitor quad $LSWC_{i,j}$ via output lines $OL_{(j+2N)}$ and $OL_{(j+3N)}$ by multiplexers $OLM_{(j+2N)}$. Differential-input charge-sensing amplifiers $FDQS_j$ and $FDQS_{(j+N)}$ are both linear charge-sensing amplifiers; and in a weight and sum circuit $FW\&S_j$ their output responses are added after being scaled in accordance with the ratio of the relative significances of the weighting provided by the weighting capacitor quad MSWCi,j and by the other weighting capacitor quad $LSWC_{i,j}$. Weight and sum circuit $FW\&S_j$ thereby generates the input signal for non-linear amplifier $NL_{i,j}$. For example, suppose the word storage element $WSE_{i,j}$ stores an eight-bit word describing a weight in two's complement arithmetic, four bits of which control the weighting afforded by the weighting capacitor quad $MSWC_{i,j}$ and four bits of which control the weighting afforded by the weighting capacitor quad $LSWC_{i,j}$. Then, the output signal from charge-sensing amplifiers $FDQS_j$ and $FDQS_{(j+N)}$ are weighted in 16:1 ratio before being summed in the weight and sum circuit $FW\&S_j$ to generate the input signal for the non-linear amplifier $NL_j$.

FIG. 27 shows a modification of the FIG. 26 portion of a neural net layer to provide for driving pairs of balanced output lines from single-ended input lines per FIGS. 2A and 2B.

FIG. 28 shows a modification of the FIG. 26 portion of a neural net layer to provide for driving single-ended output lines from pairs of balanced input lines per FIGS. 4A and 4B. FIG. 26 shows a portion of a neural net layer in which neither the input lines to or the output lines from the weighting capacitance network are single-ended. Modifications per FIGS. 27 and 28 do not affect the way in which different magnitudes of weighting are achieved with groups of switched capacitor elements which groups are alike.

While FIGS. 26, 27 and 28 each show two ranks of switched capacitor elements, one for responding to the more significant bits of the weighting words stored in the interstitial memory array and the other for responding to the less significant bits of the weighting words stored in the interstitial memory array, there may instead be three or more such ranks of switched capacitor elements in accordance with the invention. Indeed, bit-slicing the weighting factors may be a preferred structure for neural net layers, owing to the facts that each portion of a neural net layer associated with a single bit slice of the weighting factors is like the other portions of the neural net layer respectively associated with the other bit slices of the weighting factors; and that single design can use the minimum-size digitally controlled capacitors throughout.

FIG. 29 shows more particularly the nature of two corresponding pairs of capacitors in the weighting capacitor quads $MSWC_{i,j}$ and $LSWC_{i,j}$ when the word storage element $WSE_{i,j}$ stores an eight-bit weight in two's complement arithmetic. One pair of capacitors in the quad is formed from the capacitive elements C0, C1, C2, C3, and C4, which determine the differential capacitance to COMMON LINE from lines POSITIVE LS LINE and NEGATIVE LS LINE in the weighting capacitor quad $LSWC_{i,j}$, and from the capacitive elements C5, C6, C7, and C8, which determine the differential capacitance to COMMON LINE from lines POSITIVE MS LINE and NEGATIVE MS LINE in the weighting capacitor quad $MSWC_{i,j}$. The capacitive elements C5, C6, C7 and C8 in the weighting capacitor quad $MSWC_{i,j}$ have capacitances respectively similar to those of capacitive elements C1, C2, C3, and C4 in the weighting capacitor quad $LSWC_{i,j}$. The other pair of capacitors in the quad is formed from the capacitive elements C10, C11, C12, C13, and C14, which which determine the differential capacitance to signal ground from lines POSITIVE LS LINE and NEGATIVE LS LINE in the weighting capacitor quad $LSWC_{i,j}$, and from the capacitive elements C15, C16, C17, and C18, which determine the differential capacitance to signal ground from lines POSITIVE MS LINE and NEGATIVE MS LINE in the weighting capacitor quad $MSWC_{i,j}$. The capacitive elements C15, C16, C17 and C18 in the weighting capacitor quad $MSWC_{i,j}$ have capacitances respectively similar to those of capacitive elements C11, C12, C13, and C14 in the weighting capacitor quad $LSWC_{i,j}$. Capacitive elements in the capacitor quad that have the same last digit in their call-out have capacitances that are similar to each other.

FIG. 29 shows bit stores BS8, BS7, BS6, BS5, BS4, BS3, BS2 and BS1, which respectively store progressively less significant bits of a weighting word, as respective square boxes arranged from left to right within the rectangular box representing the word storage element $WSE_{i,j}$. The most significant bit of the eight-bit weighting word governs connection of capacitive element C8 to POSITIVE MS LINE or to NEGATIVE MS LINE by electronic switch SW8 in the reverse sense that the three next most significant bits of the eight-bit weighting word govern connection of capacitive elements C7, C6 and C5 to POSITIVE MS LINE or to NEGATIVE MS LINE by electronic switches SW7, SW6, and SW5 and in the reverse sense that the four least significant bits of the weighting word govern connections of capacitive elements C1, C2, C3 and C4 to POSITIVE LS LINE or to NEGATIVE LS LINE by electronic switches SW1, SW2, SW3 and SW4. The four most significant bits of the eight-bit weighting word govern connection of capacitive elements C18, C17, C16 and C15 to POSITIVE MS LINE or to NEGATIVE MS LINE by electronic switches SW18, SW17, SW16, and SW15 in the reverse sense that it governs connection of capacitive elements C8, C7, C6 and C5 to POSITIVE MS LINE or to NEGATIVE MS LINE by electronic switches SW8, SW7, SW6 and SW5. The four least significant bits of the eight-bit weighting word govern connection of capacitive elements C14, C13, C12 and C11 to POSITIVE LS LINE or to NEGATIVE LS LINE by electronic switches SW14, SW13, SW12, and SW11 in the reverse sense that it governs connection of capacitive elements C4, C3, C2 and C1 to POSITIVE LS LINE or to NEGATIVE LS LINE by electronic switches SW4, SW3, SW2 and SW1.

In the FIG. 26 neural net layer using capacitor quads per FIG. 29, then, when respective capacitive elements C8 and C18 are included in each quad of capacitors in the weighting capacitor quad $MSWC_{i,j}$, these respective capacitive elements C8 and C18 are switched in reverse sense from all other capacitive elements in that quad of capacitors to implement two's complement arithmetic in regard to weighting value. Respective non-switched C0 and C10 minimum-weight capacitive elements are included in each quad of capacitors in the weighting capacitor quad $LSWC_{i,j}$, to bias the zero-capacitance condition to correspond to the all-ZERO condition of the two's complement numbers that can be stored in the word storage element $WSE_{i,j}$ of the interstitial memory array. However, the weighting capacitor quad $MSWC_{i,j}$ includes no non-switched minimum-weight capacitive elements.

FIG. 30 shows more particularly the nature of a quad of capacitors in the weighting capacitance networks $MSWC_{i,j}$ and $LSWC_{i,j}$ when the word storage element $WSE_{i,j}$ stores nine-bit weights in one's complement form in bit stores BS10, BS11, BS12, BS13, BS14, BS15, BS16, BS17 and BS18. One pair of capacitors in the quad is formed from the capacitive elements C20, C21, C22, C23, and C24, which determine the differential capacitance to COMMON LINE from lines POSITIVE LS LINE and NEGATIVE LS LINE in the weighting capacitor quad $LSWC_{i,j}$, and from the capacitive elements C25, C26, C27, and C28, which determine the differential capacitance to COMMON LINE from lines POSITIVE MS LINE and NEGATIVE MS LINE in the weighting capacitor quad $MSWC_{i,j}$. The capacitive elements C25, C26, C27 and C28 in the weighting capacitor quad $MSWC_{i,j}$ have capacitances respectively similar to those of capacitive elements C21, C22, C23, and C24 in the weighting capacitor quad $LSWC_{i,j}$. The other pair of capacitors in the quad is formed from the capacitive elements C30, C31, C32, C33, and C34, which determine the differential capacitance to signal ground from lines POSITIVE LS LINE and NEGATIVE LS LINE in the weighting capacitor quad $LSWC_{i,j}$, and from the capacitive elements C35, C36, C37, and C38, which determine the differential capacitance to signal ground from lines POSITIVE MS LINE and NEGATIVE MS LINE in the weighting capacitor quad $MSWC_{i,j}$. The capacitive elements C35, C36, C37 and C38 in the weighting capacitor quad $MSWC_{i,j}$ have capacitances respectively similar to those of capacitive elements C31, C32, C33, and C34 in the weighting capacitor quad $LSWC_{i,j}$. Capacitive elements in the capacitor quad that have the same last digit in their call-out have capacitances that are similar to each other. The weighting capacitor quad $MSWC_{i,j}$ has no capacitive element corresponding to capacitive element C20 or C30 in the weighting capacitor quad $LSWC_{i,j}$.

FIG. 30 shows bit stores BS18, BS10, BS17, BS16, BS15, BS14, BS13, BS12 and BS11 which respectively store successive bits of a nine-bit weight in one's complement arithmetic, as respective square boxes arranged from left to right within the rectangular box representing the word storage element $WSE_{i,j}'$. The leftmost bit of the nine-bit weighting word stored in bit store BS18 governs connection of capacitive element C28 to POSITIVE MS LINE or to NEGATIVE MS LINE by electronic switch SW28, depending whether that bit is a ONE or a ZERO; and that leftmost bit also governs connection of capacitive element C38 to POSITIVE MS LINE or to NEGATIVE MS LINE by electronic switch SW38, depending whether that bit is a ZERO or a ONE. The next to leftmost bit of the nine-bit weighting word stored in bit store BS10 governs connection of capacitive element C20 to POSITIVE LS LINE or to NEGATIVE LS LINE by electronic switch SW20, depending whether that bit is a ONE or a ZERO; and that next to leftmost bit also governs connection of capacitive element C30 to POSITIVE LS LINE or to NEGATIVE LS LINE by electronic switch SW30, depending whether that bit is a ZERO or a ONE. The three next most left bits of the nine-bit weighting word stored in bit stores BS17, BS16 and BS15 govern connection of capacitive elements C27, C26 and C25 to POSITIVE MS LINE or to NEGATIVE MS LINE by electronic switches SW27, SW26 and SW25, respectively, depending whether those bits are respectively each a ONE or a ZERO. The bits stored in bit stores BS17, BS16 and BS15 also govern connection of capacitive elements C37, C36 and C35 to POSITIVE MS LINE or to NEGATIVE MS LINE by electronic switches SW37, SW36 and SW35, respectively, depending whether those bits are respectively each a ZERO or a ONE. The four rightmost bits of the weighting word stored in bit stores BS11, BS12, BS13 and BS14 govern connections of capacitive elements C21, C22, C23 and C24 to POSITIVE LS LINE or to NEGATIVE LS LINE by electronic switches SW21, SW22, SW23 and SW24, respectively, depending whether those bits are respectively each a ONE or a ZERO. The four bits stored in bit stores BS11, BS12, BS13 and BS14 also govern connections of capacitive elements C31, C32, C33 and C34 to POSITIVE LS LINE or to NEGATIVE LS LINE by electronic switches SW31, SW32, SW33 and SW34, respectively, depending whether those bits are respectively each a ZERO or a ONE.

One skilled in the art and acquainted with the foregoing specification will be able to design numerous variants of the preferred embodiments of the invention described therein, and this should be borne in mind when construing the following claims.

What is claimed is:

1. Weighted summation circuitry for responding to a plurality of input signals to generate a final weighted summation result including each of said input signals as multiplied by a respective weighting factor, said weighted summation circuitry comprising:
- a plurality, R in number, of capacitance networks each of a type to perform weighting and summing;
- means for expressing each of said weighting factors in a respective plurality, R in number, of portions of different weighting significance, the portions of said respective weighting factors of similar weighting significance forming a respective set of values susceptible to each being divided by that similar weighting significance to be expressed as a corresponding normalized set of values;
- a plurality, R in number, of means for summing said plurality of input signals as weighted respectively by each said normalized set of values, to get respective partial weighted summation results having corresponding weighting significances the same as said normalized sets of values being weighted, each said means for weighting and summing said plurality of input signals including a respective one of said capacitance networks to perform weighting and summing; and
- means for summing the respective partial weighted summation results, as respectively weighted by their corresponding weighting significances, to generate said final weighted summation result.

2. Weighted summation circuitry as set forth in claim 1 included in a neural net layer together with:
- a non-linear amplifier supplying sigmoidal response to said final weighted summation result.

3. Apparatus for generating a weighted summation signal responsive to a plurality of input signals, M in number, said apparatus comprising:
- a plurality, R in number of output lines for respective partial weighted summation signals having different weighting significances, said output lines identified by respective consecutive ordinal numbers first through $R^{th}$;
- a plurality, 2M in number, of input lines respectively identified by connective ordinal numbers first through $2M^{th}$, M being a positive integer;
- R pluralities of weighting capacitors, said pluralities of weighting capacitors identified by respective consecutive ordinal numbers first through $R^{th}$, each said plurality of weighting capacitors including a number 2M of respective weighting capacitors, M being a positive integer, each said weighting capacitor exhibiting a respective capacitance including at least a respective stray capacitance component, each said weighting capacitor in an $n^{th}$ one of said R pluralities connecting the one of said first through $2M^{th}$ input lines identified by the same ordinal number to said $n^{th}$ output line, n assuming each of the integer values one through R;
- means for applying M input signal voltages in balanced form each to a respective pair of said input lines identified by ordinal numbers M apart, the difference in the capacitances of two weighting capacitors respectively connecting from each said pair of input lines to each said $n^{th}$ output line determining the weighting of the input signal applied in balanced form on that said pair of input lines as will appear on said $n^{th}$ output line, the two weighting capacitors respectively connecting from each said pair of input lines to each said $n^{th}$ output line being considered to be a respective pair of weighting capacitors, which pair is respectively identified within said plurality of weighting capacitors containing it by the same ordinal number as the lower-ordinal-numbered one of said pair of input lines it connects from; and
- means for summing the R respective partial weighted summation results, as respectively weighted by their corresponding weighting significances which increase with each higher ordinal number of the output line supplying the partial weighted summation result, to generate said final weighted summation result.

4. Apparatus as set forth in claim 3, in which each said pair of weighting capacitors respectively comprises:
- a respective plurality, P in number, of capacitive elements respectively identified by consecutive ordinal numbers first through $P^{th}$, each said capacitive element having between respective first and second plates thereof a respective capacitance scaled in $2^{(k-1)}$ ratio with the capacitance of said first capacitive element, where $k^{th}$ corresponds to the ordinal number of that said capacitive element; and
- respective electronic selecting means for selecting responsive to respective bits of a respective electronic control signal each of said first through $P^{th}$ capacitive elements as a component of either a first of or a second of said pair of weighting capacitors, at least one of which first and second of said pair of weighting capacitors can include no component capacitive elements if all the first through $P^{th}$ capacitive elements are selected as components of the other of said pair of weighting capacitors, the sum of the capacitances of which said pair of weighting capacitors is constant, and the difference of the capacitances of which said pair of weighting capacitors is a multiple of the value of the capacitance of the respective first capacitive element, which multiple may be either positive or negative in sense.

5. Apparatus as set forth in claim 4 including:
- an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively corresponding to the electronic control signals of said respective electronic selecting means in said pairs of weighting capacitors in said R pluralities of weighting capacitors which pairs are identified by the same ordinal number as the word storage element storing that respective selection signal.

6. Apparatus as set forth in claim 5 including:
- a respective zeroeth capacitive element included as a component of a first of each said pair of weighting capacitors in said first plurality of weighting capacitors, said respective zeroeth capacitive element having the same value of capacitance between respective first and second plates thereof as said respective first capacitive element in the same said pair of weighting capacitors has between its respective first and second plates.

7. Apparatus as set forth in claim 5 wherein each pair of said weighting capacitors in said first plurality of weighting capacitors includes:

a respective zeroeth capacitive element having between respective first and second plates thereof a respective capacitance equal to the capacitance of said first capacitive element, said respective electronic selecting means that is included within each said pair of said weighting capacitors together with said respective zeroeth capacitive element responding to a respective further bit of its said selection signal stored in said electronic memory for selecting said zeroeth capacitive element as a component of either the first of or a second of that said pair of weighting capacitors.

8. Apparatus as set forth in claim 4 including:

R further pluralities of weighting capacitors, said further pluralities of weighting capacitors identified by respective consecutive ordinal numbers $(R+1)^{th}$ through $2R^{th}$, each said further plurality of weighting capacitors including a number 2M of respective further weighting capacitors identified by respective ordinal numbers first through $2M^{th}$, each said weighting capacitor in said further pluralities of weighting capacitors connecting the correspondingly numbered one of said input lines to a signal ground for said input signal voltages in balanced form, said weighting capacitors in each of said further pluralities of weighting capacitors that connect to said signal ground ones of said input lines having ordinal numbers differing by M being considered to be a respective further pair of weighting capacitors, the difference in the capacitances of each further pair of said weighting capacitors connecting to said signal ground from a said pair of input lines being the same in amplitude and the opposite in sense as the difference in the capacitances of a corresponding said pair of weighting capacitors connecting to said output line from the same said pair of input lines, thereby to provide for capacitive loading on each one of that said pair of input lines that is substantially the same as the capacitive loading on each other of said input lines, each said further pair of weighting capacitors being identified by an ordinal number M higher than that of its corresponding said pair of weighting capacitors.

9. Apparatus as set forth in claim 8 wherein each said further pair of said weighting capacitors respectively comprises:

a respective plurality, P in number, of capacitive elements respectively identified by consecutive ordinal numbers first through $P^{th}$, each said capacitive element having between respective first and second plates thereof a respective capacitance scaled in $2^{(k-1)}$ ratio with the capacitance of said first capacitive element, where $k^{th}$ corresponds to the ordinal number of that said capacitive element; and respective electronic selecting means, responding to respective electronic control signals, for selecting each of said first through $P^{th}$ capacitive elements as a component of either the first of or a second of said further pair of weighting capacitors, at least one of which first and second of said further pair of weighting capacitors can include no component capacitive elements if all the respective first through $P^{th}$ capacitive elements of said further pair are selected as components of the other of said further pair of weighting capacitors, the sum of the capacitances of which said further pair of weighting capacitors is constant, and the difference of the capacitances of which said further pair of weighting capacitors is a multiple of the value of the capacitance of the first capacitive element thereof, which multiple may be either positive or negative in sense, the capacitance of said first capacitive element in each said pair of weighting capacitors connecting from a said pair of input lines being the same as the capacitance of said first capacitive element in said corresponding further pair of weighting capacitors connecting from that same said pair of input lines.

10. Apparatus as set forth in claim 9 including:

a respective zeroeth capacitive element included as a component of a first of each said pair of weighting capacitors in said first plurality of weighting capacitors and as a component of a first of each said further pair of weighting capacitors in said $(R+1)^{th}$ plurality of weighting capacitors, said respective zeroeth capacitive element having the same value of capacitance between respective first and second plates thereof as said respective first capacitive element in the same said pair or further pair of weighting capacitors has between its respective first and second plates.

11. Apparatus as set forth in claim 10 including:

an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively determining the electronic control signals of said respective electronic selecting means in the pairs of weighting capacitors which pairs are identified by the same ordinal number as the word storage element storing that respective selection signal and in the further pairs of weighting capacitors which further pairs are identified by the ordinal number M higher than that of the word storage element storing that respective selection signal.

12. Apparatus as set forth in claim 9 wherein each pair of said weighting capacitors in said first plurality of weighting capacitors includes:

a respective zeroeth capacitive element having between respective first and second plates thereof a respective capacitance equal to the capacitance of said first capacitive element, said respective electronic selecting means that is included within each said pair of said weighting capacitors together with said respective zeroeth capacitive element responding to a respective further bit of its said selection signal stored in said electronic memory for selecting said zeroeth capacitive element as a component of either the first of or a second of that said pair of weighting capacitors; and wherein each said further pair of weighting capacitors in said $(R+1)^{th}$ plurality of weighting capacitors includes:

a respective zeroeth capacitive element having between respective first and second plates thereof a respective capacitance equal to the capacitance of said first capacitive element, said respective electronic selecting means that is included within each said further pair of said weighting capacitors together with said respective zeroeth capacitive element responding to a respective further bit of its said selection signal stored in said electronic memory for selecting said zeroeth capacitive element as a component of either the first of or a second of that said further pair of weighting capacitors.

13. Apparatus as set forth in claim 12 including:
an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively determining the electronic control signals of said respective electronic selecting means in the pairs of weighting capacitors which pairs are identified by the same ordinal number as the word storage element storing that respective selection signal and in the further pairs of weighting capacitors which further pairs are identified by the ordinal number M higher than that of the word storage element storing that respective selection signal.

14. Apparatus as set forth in claim 9 including:
an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively determining the electronic control signals of said respective electronic selecting means in the pairs of weighting capacitors which pairs are identified by the same ordinal number as the word storage element storing that respective selection signal and in the further pairs of weighting capacitors which further pairs of weighting capacitors which further pairs are identified by the ordinal number M higher than that of the word storage element storing that respective selection signal.

15. Apparatus for generating a weighted summation signal responsive to a plurality of input voltage signals, M in number, said apparatus comprising:
a plurality, M in number, of input lines respectively identified by consecutive ordinal numbers, first through $M^{th}$, for receiving respective ones of said input voltage signals;
a plurality, 2R in number, of output lines identified by respective ones of consecutive ordinal numbers first through $2R^{th}$, R being a positive integer, each said output line insulated from its surroundings and exhibiting respective capacitance respective to its surroundings;
R pluralities of weighting capacitors, said pluralities of weighting capacitors identified by respective consecutive ordinal numbers first through $R^{th}$, each said plurality of weighting capacitors including a number 2M of respective weighting capacitors identified by respective consecutive ordinal numbers first through $2M^{th}$, M being a positive integer, each said weighting capacitor exhibiting a respective capacitance including at least a respective stray capacitance component, each said first through $M^{th}$ weighting capacitor in an $n^{th}$ one of said R pluralities connecting to said $n^{th}$ output line the one of said first through $M^{th}$ input lines identified by the same ordinal number as that said weighting capacitor, and each said $(M+1)^{th}$ through $2M^{th}$ weighting capacitor in an $n^{th}$ one of said R pluralities connecting to said $(R+n)^{th}$ output line the one of said first through $M^{th}$ input lines identified by the ordinal number M lower than that said weighting capacitor is identified by, the two weighting capacitors in an $n^{th}$ one of said R pluralities connecting to the same one of said first through $M^{th}$ input lines being included in a respective pair of weighting capacitors identified by the same ordinal number as that same one of said first through $M^{th}$ input lines those two weighting capacitors connect to, n assuming each of the integer values one through R;
means for maintaining substantially equal capacitances on each output line in each of R pairs of said output lines having ordinal numbers that differ by R;
respective means for providing a response to change in the difference of charge on the respective capacitances of the output lines in each of said R pairs of output lines respective to their surroundings, which response is a respective partial weighted summation signal; and
means for summing the R respective partial weighted summation results, as respectively weighted by their corresponding weighting significances which increase with each higher ordinal number of the output line supplying the partial weighted summation result, to generate said final weighted summation result.

16. Apparatus as set forth in claim 15 in which said each pair of said weighting capacitors respectively comprises:
a respective plurality, P in number, of capacitive elements respectively identified by consecutive ordinal numbers first through $P^{th}$, each said respective capacitive element having between respective first and second plates thereof a respective capacitance scaled in $2^{(k-1)}$ ratio with the capacitance of said respective first capacitive element, where $k^{th}$ corresponds to the ordinal number of that said capacitive element; and
respective electronic selecting means for selecting responsive to respective bits of a respective electronic control signal each of said respective first through $P^{th}$ capacitive elements as a component of either the first of or a second of said pair of weighting capacitors, at least one of which first and second of said pair of weighting capacitors can include no component capacitive elements if all the first through $P^{th}$ capacitive elements are selected as components of the other of said pair of weighting capacitors, the sum of the capacitances of which said pair of weighting capacitors is constant, and the difference of the capacitances of which said pair of weighting capacitors is a multiple of the value of the capacitance of the first capacitive element, which multiple may be either positive or negative in sense.

17. Apparatus as set forth in claim 16 including:
an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively corresponding to the electronic control signals of respective electronic selecting means in said pairs of weighting capacitors in said R pluralities of weighting capacitors which pairs are identified by the same ordinal number as the word storage element storing that respective selection signal.

18. Apparatus as set forth in claim 17 including:
a respective zeroeth capacitive element included as a component of a first of each said pair of weighting capacitors in said first plurality of weighting capacitors, said respective zeroeth capacitive element having the same value of capacitance between respective first and second plates thereof as said respective first capacitive element in the same said pair of weighting capacitors has between its respective first and second plates.

19. Apparatus as set forth in claim 17 wherein each pair of said weighting capacitors in said first plurality of weighting capacitors includes:
a respective zeroeth capacitive element having between respective first and second plates thereof a respective capacitance equal to the capacitance of said first capacitive element, said respective electronic selecting means that is included within each said pair of said weighting capacitors together with said respective zeroeth capacitive element responding to a respective further bit of its said selection signal stored in said electronic memory for selecting said zeroeth capacitive element as a component of either the first of or a second of that said pair of weighting capacitors.

20. Apparatus as set forth in claim 16 wherein said means for maintaining substantially equal capacitances on each output line in each of R pairs of said output lines having ordinal numbers that differ by R comprises:
R further pluralities of weighting capacitors, said further pluralities of weighting capacitors identified by respective consecutive ordinal numbers $(R+1)^{th}$ through $2R^{th}$, each said further plurality of weighting capacitors including a number 2M of respective weighting capacitors respectively identified by consecutive ordinal numbers $(2M+1)^{th}$ through $4M^{th}$, said $(2M+1)^{th}$ through $3M^{th}$ weighting capacitors in an $n^{th}$ one of said R pluralities connecting said $n^{th}$ output line to a signal ground, said $(3M+1)^{th}$ through $4M^{th}$ weighting capacitors in an $n^{th}$ one of said R pluralities connecting said $(R+n)^{th}$ output line to said signal ground, said weighting capacitors in each of said further pluralities of weighting capacitors that connect to said signal ground ones of said input lines having ordinal numbers differing by M being considered to be a respective further pair of weighting capacitors, which further respective pairs of weighting capacitors are identified by respective ones of the consecutive ordinal numbers $(M+1)^{th}$ through $2M^{th}$, the difference in the capacitances of each further pair of said weighting capacitors connecting to said signal ground from a said pair of output lines being the same in amplitude and the opposite in sense as the difference in the capacitances of a corresponding said pair of weighting capacitors identified by respective ordinal numbers lower by M than the weighting capacitors in the corresponding said further pair of said weighting capacitors.

21. Apparatus as set forth in claim 20 wherein each said further pair of said weighting capacitors comprises:
a respective plurality, P in number, of capacitive elements respectively identified by consecutive ordinal numbers first through $P^{th}$, each said capacitive element having between respective first and second plates thereof a respective capacitance scaled in $2^{(k-1)}$ ratio with the capacitance of said first capacitive element, where $k^{th}$ corresponds to the ordinal number of that said capacitive element; and
respective electronic selecting means, responding to respective electronic control signals, for selecting each of said first through $P^{th}$ capacitive elements as a component of either the first of or a second of said further pair of weighting capacitors, at least one of which first and second of said further pair of weighting capacitors can include no component capacitive elements if all the respective first through $P^{th}$ capacitive elements of said further pair are selected as components of the other of said further pair of weighting capacitors, the sum of the capacitances of which said further pair of weighting capacitors is constant, and the difference of the capacitances of which said further pair of weighting capacitors is a multiple of the value of the capacitance of the first capacitive element thereof, which multiple may be either positive or negative in sense, in which processor for providing neuron-like response to a plurality of input signal voltages the capacitance of said first capacitive element in each said pair of weighting capacitors is the same as the capacitance of said first capacitive element in said corresponding further pair of weighting capacitors.

22. Apparatus as set forth in claim 21 including:
a respective zeroeth capacitive element included as a component of a first of each said pair of weighting capacitors in said first plurality of weighting capacitors and as a component of a first of each said further pair of weighting capacitors in said $(R+1)^{th}$ plurality of weighting capacitors, said respective zeroeth capacitive element having the same value of capacitance between respective first and second plates thereof as said respective first capacitive element in the same said pair or further pair of weighting capacitors has between its respective first and second plates.

23. Apparatus as set forth in claim 22 including:
an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively determining the electronic control signals of said respective electronic selecting means in the pairs of weighting capacitors which pairs are identified by the same ordinal number as the word storage element storing that respective selection signal and in the further pairs of weighting capacitors which further pairs are identified by the ordinal number M higher than that of the word storage element storing that respective selection signal.

24. Apparatus as set forth in claim 21 wherein each pair of said weighting capacitors in said first plurality of weighting capacitors includes:
a respective zeroeth capacitive element having between respective first and second plates thereof a respective capacitance equal to the capacitance of said first capacitive element, said respective electronic selecting means that is included within each said pair of said weighting capacitors together with said respective zeroeth capacitive element responding to a respective further bit of its said selection signal stored in said electronic memory for selecting said zeroeth capacitive element as a component of either the first of or a second of that said pair of weighting capacitors; and wherein each said further pair of weighting capacitors in said $(R+1)^{th}$ plurality of weighting capacitors includes:
a respective zeroeth capacitive element having between respective first and second plates thereof a respective capacitance equal to the capacitance of said first capacitive element, said respective electronic selecting means that is included within each said further pair of said weighting capacitors together with said respective zeroeth capacitive element responding to a respective further bit of its said selection signal stored in said electronic memory for selecting said zeroeth capacitive element as a component of either the first of or a second of that said further pair of weighting capacitors.

25. Apparatus as set forth in claim 24 including:
an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively determining the electronic control signals of said respective electronic selecting means in the pairs of weighting capacitors which pairs are identified by the same ordinal number as the word storage element storing that respective selection signal and in the further pairs of weighting capacitors which further pairs are identified by the ordinal number M higher than that of the word storage element storing that respective selection signal.

26. Apparatus as set forth in claim 21 including:
an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively determining the electronic control signals of said respective electronic selecting means in the pairs of weighting capacitors which pairs are identified by the same ordinal number as the word storage element storing that respective selection signal and in the further pairs of weighting capacitors which further pairs of weighting capacitors which further pairs are identified by the ordinal number M higher than that of the word storage element storing that respective selection signal.

27. Apparatus for generating a weighted summation signal responsive to a plurality of input signals, M in number, said apparatus comprising:
a plurality, 2M in number, of input lines respectively identified by consecutive ordinal numbers, first through $2M^{th}$;
means for applying a respective input signal in balanced form to each pair of said input lines consisting of one of said first through $M^{th}$ input lines and the input line with ordinal number higher by M;
a plurality, 2R in number, of output lines identified by respective ones of consecutive ordinal numbers first through $2R^{th}$, R being a positive integer, each said output line insulated from its surroundings and exhibiting respective capacitance respective to its surroundings;
R pluralities of weighting capacitors, said pluralities of weighting capacitors identified by respective consecutive ordinal numbers first through $R^{th}$, each said plurality of weighting capacitors including a number 4M of respective weighting capacitors, M being a positive integer, each said weighting capacitor exhibiting a respective capacitance including at least a respective stray capacitance component, each said first through $2M^{th}$ weighting capacitors in an $n^{th}$ one of said R pluralities connecting to said $n^{th}$ output line the one of said first through $2M^{th}$ input lines identified by the same ordinal number as that said first through $2M^{th}$ weighting capacitors, each said $(2M+1)^{th}$ through $4M^{th}$ weighting capacitor in an $n^{th}$ one of said R pluralities connecting to said $(R+n)^{th}$ output line the one of said first through $2M^{th}$ input lines identified by the ordinal number lower by 2M than that said $(2M+1)^{th}$ through $4M^{th}$ weighting capacitor, n assuming each of the integer values one through R;
respective means for providing a response to change in the difference of charge on the respective capacitances of the output lines in each of said R pairs of output lines respective to their surroundings, which response is a respective partial weighted summation signal; and
means for summing the R respective partial weighted summation results, as respectively weighted by their corresponding weighting significances which increase with each higher ordinal number of the output line supplying the partial weighted summation result, to generate said final weighted summation result.

28. Apparatus as set forth in claim 27, wherein within each of said R pluralities of weighting capacitors each two of those weighting capacitors having ordinal numbers differing by 2M are considered to be a respective pair of said weighting capacitors, and wherein each pair of said weighting capacitors respectively comprises:
a respective plurality, P in number, of capacitive elements respectively identified by consecutive ordinal numbers first through $P^{th}$, each said capacitive element having between respective first and second plates thereof a respective capacitance scaled in $2^{(k-1)}$ ratio with the capacitance of said first capacitive element, where $k^{th}$ corresponds to the ordinal number of that said capacitive element; and
electronic selecting means, responding to a respective selection signal, for selecting each of said first through $P^{th}$ capacitive elements as a component of either the first of or a second of said pair of weighting capacitors, at least one of which first and second of said pair of weighting capacitors can include no component capacitive elements if all the first through $P^{th}$ capacitive elements are selected as components of the other of said pair of weighting capacitors, the sum of the capacitances of which said pair of weighting capacitors is constant, and the difference of the capacitances of which said pair of weighting capacitors is a multiple of the value of the capacitance of the first capacitive element, which multiple may be either positive or negative in sense.

29. Apparatus as set forth in claim 28 including:
a respective zeroeth capacitive element included as a component of a first of each said pair of weighting capacitors in said first plurality of weighting capacitors and as a component of a first of each said further pair of weighting capacitors in said $(R+1)^{th}$ plurality of weighting capacitors, said respective zeroeth capacitive element having the same value of capacitance between respective first and second plates thereof as said respective first capacitive element in the same said pair or further pair of weighting capacitors has between its respective first and second plates.

30. Apparatus as set forth in claim 28 including:
an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively determining the electronic control signals of said respective electronic selecting means in the pairs of weighting capacitors which pairs are identified by the same ordinal number as the word storage element storing that respective selection signal and in the further pairs of weighting capacitors which further pairs are identified by the ordinal number M higher than that of the word storage element storing that respective selection signal.

31. Apparatus as set forth in claim 28 wherein each pair of said weighting capacitors in said first plurality of weighting capacitors includes:
a respective zeroeth capacitive element having between respective first and second plates thereof a respective capacitance equal to the capacitance of said first capacitive element, said respective electronic selecting means that is included within each said pair of said weighting capacitors together with said respective zeroeth capacitive element responding to a respective further bit of its said selection signal stored in said electronic memory for selecting said zeroeth capacitive element as a component of either the first of or a second of that said pair of weighting capacitors; and wherein each said further pair of weighting capacitors in said $(R+1)^{th}$ plurality of weighting capacitors includes:
a respective zeroeth capacitive element having between respective first and second plates thereof a respective capacitance equal to the capacitance of said first capacitive element, said respective electronic selecting means that is included within each said further pair of said weighting capacitors together with said respective zeroeth capacitive element responding to a respective further bit of its said selection signal stored in said electronic memory for selecting said zeroeth capacitive element as a component of either the first of or a second of that said further pair of weighting capacitors.

32. Apparatus as set forth in claim 31 including:
an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively determining the electronic control signals of said respective electronic selecting means in the pairs of weighting capacitors which pairs are identified by the same ordinal number as the word storage element storing that respective selection signal and in the further pairs of weighting capacitors which further pairs are identified by the ordinal number M higher than that of the word storage element storing that respective selection signal.

33. Apparatus as set forth in claim 28 including:
an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively determining the electronic control signals of said respective electronic selecting means in the pairs of weighting capacitors which pairs are identified by the same ordinal number as the word storage element storing that respective selection signal and in the further pairs of weighting capacitors which further pairs are identified by the ordinal number M higher than that of the word storage element storing that respective selection signal.

34. Apparatus as set forth in claim 27, wherein within each of said R pluralities of weighting capacitors each two of said first through $2M^{th}$ weighting capacitors having ordinal numbers differing by M are considered to be a respective pair of said weighting capacitors, wherein within each of said R pluralities of weighting capacitors each two of said $(2M+1)^{th}$ through $4M^{th}$ weighting capacitors having ordinal numbers differing by M are considered to be a respective pair of said weighting capacitors, and wherein each pair of said weighting capacitors respectively comprises:
a respective plurality, P in number, of capacitive elements respectively identified by consecutive ordinal numbers first through $P^{th}$, each said capacitive element having between respective first and second plates thereof a respective capacitance scaled in $2^{(k-1)}$ ratio with the capacitance of said first capacitive element, where $k^{th}$ corresponds to the ordinal number of that said capacitive element; and
electronic selecting means, responding to a respective selection signal, for selecting each of said first through $P^{th}$ capacitive elements as a component of either the first of or a second of said pair of weighting capacitors, at least one of which first and second of said pair of weighting capacitors can include no component capacitive elements if all the first through $P^{th}$ capacitive elements are selected as components of the other of said pair of weighting capacitors, the sum of the capacitances of which said pair of weighting capacitors is constant, and the difference of the capacitances of which said pair of weighting capacitors is a multiple of twice the value of the capacitance of the first capacitive element, which multiple may be either positive or negative in sense.

35. Apparatus as set forth in claim 34 including:
a respective zeroeth capacitive element included as a component of a first of each said pair of weighting capacitors in said first plurality of weighting capacitors and as a component of a first of each said further pair of weighting capacitors in said $(R+1)^{th}$ plurality of weighting capacitors, said respective zeroeth capacitive element having the same value of capacitance between respective first and second plates thereof as said respective first capacitive element in the same said pair or further pair of weighting capacitors has between its respective first and second plates.

36. Apparatus as set forth in claim 35 including:
an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively determining the electronic control signals of said respective electronic selecting means in the pairs of weighting capacitors which pairs are identified by the same ordinal number as the word storage element storing that respective selection signal and in the further pairs of weighting capacitors which further pairs are identified by the ordinal number M higher than that of the word storage element storing that respective selection signal.

37. Apparatus as set forth in claim 34 wherein each pair of said weighting capacitors in said first plurality of weighting capacitors includes:
a respective zeroeth capacitive element having between respective first and second plates thereof a respective capacitance equal to the capacitance of said first capacitive element, said respective electronic selecting means that is included within each said pair of said weighting capacitors together with said respective zeroeth capacitive element responding to a respective further bit of its said selection signal stored in said electronic memory for selecting said zeroeth capacitive element as a component of either the first of or a second of that said pair of weighting capacitors; and wherein each said further pair of weighting capacitors in said $(R+1)^{th}$ plurality of weighting capacitors includes:
a respective zeroeth capacitive element having between respective first and second plates thereof a respective capacitance equal to the capacitance of said first capacitive element, said respective electronic selecting means that is included within each said further pair of said weighting capacitors together with said respective zeroeth capacitive element responding to a respective further bit of its said selection signal stored in said electronic memory for selecting said zeroeth capacitive element as a component of either the first of or a second of that said further pair of weighting capacitors.

38. Apparatus as set forth in claim 37 including:
an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively determining the electronic control signals of said respective electronic selecting means in the pairs of weighting capacitors which pairs are identified by the same ordinal number as the word storage element storing that respective selection signal and in the further pairs of weighting capacitors which further pairs are identified by the ordinal number M higher than that of the word storage element storing that respective selection signal.

39. Apparatus as set forth in claim 34 including:
an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively determining the electronic control signals of said respective electronic selecting means in the pairs of weighting capacitors which pairs are identified by the same ordinal number as the word storage element storing that respective selection signal and in the further pairs of weighting capacitors which further pairs are identified by the ordinal number M higher than that of the word storage element storing that respective selection signal.

40. Apparatus included in a processor for providing neuron-like response to a plurality of input signal voltages, M in number, said apparatus comprising:
a plurality, R in number of output lines for respective partial weighted summation signals having different weighting significances, said output lines identified by respective consecutive ordinal numbers first through $R^{th}$;
a plurality, 2M in number, of input lines respectively identified by connective ordinal numbers first through $2M^{th}$, M being a positive integer;
R pluralities of weighting capacitors, said pluralities of weighting capacitors identified by respective consecutive ordinal numbers first through $R^{th}$, each said plurality of weighting capacitors including a number 2M of respective weighting capacitors, M being a positive integer, each said weighting capacitor exhibiting a respective capacitance including at least a respective stray capacitance component, each said weighting capacitor in an $n^{th}$ one of said R pluralities connecting the one of said first through $2M^{th}$ input lines identified by the same ordinal number to said $n^{th}$ output line, n assuming each of the integer values one through R;
means for applying M input signal voltages in balanced form each to a respective pair of said input lines identified by ordinal numbers M apart, the difference in the capacitances of two weighting capacitors respectively connecting from each said pair of input lines to each said $n^{th}$ output line determining the weighting of the input signal applied in balanced form on that said pair of input lines as will appear on said $n^{th}$ output line, the two weighting capacitors respectively connecting from each said pair of input lines to each said $n^{th}$ output line being considered to be a respective pair of weighting capacitors, which pair is respectively identified within said plurality of weighting capacitors containing it by the same ordinal number as the lower-ordinal-numbered one of said pair of input lines it connects from;

means for summing the R respective partial weighted summation results, as respectively weighted by their corresponding weighting significances which increase with each higher ordinal number of the output line supplying the partial weighted summation result, to generate a final weighted summation result; and a non-linear amplifier having an input port to which said final weighted summation result is supplied and having an output port at which said neuron-like response is provided.

41. Apparatus as set forth in claim 40, in which each said pair of weighting capacitors respectively comprises:

a respective plurality, P in number, of capacitive elements respectively identified by consecutive ordinal numbers first through $P^{th}$, each said capacitive element having between respective first and second plates thereof a respective capacitance scaled in $2^{(k-1)}$ ratio with the capacitance of said first capacitive element, where $k^{th}$ corresponds to the ordinal number of that said capacitive element; and respective electronic selecting means for selecting responsive to respective bits of a respective electronic control signal each of said first through $P^{th}$ capacitive elements as a component of either a first of or a second of said pair of weighting capacitors, at least one of which first and second of said pair of weighting capacitors can include no component capacitive elements if all the first through $P^{th}$ capacitive elements are selected as components of the other of said pair of weighting capacitors, the sum of the capacitances of which said pair of weighting capacitors is constant, and the difference of the capacitances of which said pair of weighting capacitors is a multiple of the value of the capacitance of the respective first capacitive element, which multiple may be either positive or negative in sense.

42. Apparatus as set forth in claim 41 including:

an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively corresponding to the electronic control signals of said respective electronic selecting means in said pairs of weighting capacitors in said R pluralities of weighting capacitors which pairs are identified by the same ordinal number as the word storage element storing that respective selection signal.

43. Apparatus as set forth in claim 42 including:

a respective zeroeth capacitive element included as a component of a first of each said pair of weighting capacitors in said first plurality of weighting capacitors, said respective zeroeth capacitive element having the same value of capacitance between respective first and second plates thereof as said respective first capacitive element in the same said pair of weighting capacitors has between its respective first and second plates.

44. Apparatus as set forth in claim 42 wherein each pair of said weighting capacitors in said first plurality of weighting capacitors includes:

a respective zeroeth capacitive element having between respective first and second plates thereof a respective capacitance equal to the capacitance of said first capacitive element, said respective electronic selecting means that is included within each said pair of said weighting capacitors together with said respective zeroeth capacitive element responding to a respective further bit of its said selection signal stored in said electronic memory for selecting said zeroeth capacitive element as a component of either the first of or a second of that said pair of weighting capacitors.

45. Apparatus as set forth in claim 41 including:

R further pluralities of weighting capacitors, said further pluralities of weighting capacitors identified by respective consecutive ordinal numbers $(R+1)^{th}$ through $2R^{th}$, each said further plurality of weighting capacitors including a number 2M of respective further weighting capacitors identified by respective ordinal numbers first through $2M^{th}$, each said weighting capacitor in said further pluralities of weighting capacitors connecting the correspondingly numbered one of said input lines to a signal ground for said input signal voltages in balanced form, said weighting capacitors in each of said further pluralities of weighting capacitors that connect to said signal ground ones of said input lines having ordinal numbers differing by M being considered to be a respective further pair of weighting capacitors, the difference in the capacitances of each further pair of said weighting capacitors connecting to said signal ground from a said pair of input lines being the same in amplitude and the opposite in sense as the difference in the capacitances of a corresponding said pair of weighting capacitors connecting to said output line from the same said pair of input lines, thereby to provide for capacitive loading on each one of that said pair of input lines that is substantially the same as the capacitive loading on each other of said input lines, each said further pair of weighting capacitors being identified by an ordinal number M higher than that of its corresponding said pair of weighting capacitors.

46. Apparatus as set forth in claim 45 wherein each said further pair of said weighting capacitors respectively comprises:

a respective plurality, P in number, of capacitive elements respectively identified by consecutive ordinal numbers first through $P^{th}$, each said capacitive element having between respective first and second plates thereof a respective capacitance scaled in $2^{(k-1)}$ ratio with the capacitance of said first capacitive element, where $k^{th}$ corresponds to the ordinal number of that said capacitive element; and respective electronic selecting means, responding to respective electronic control signals, for selecting each of said first through $P^{th}$ capacitive elements as a component of either the first of or a second of said further pair of weighting capacitors, at least one of which first and second of said further pair of weighting capacitors can include no component capacitive elements if all the respective first through $P^{th}$ capacitive elements of said further pair are selected as components of the other of said further pair of weighting capacitors, the sum of the capacitances of which said further pair of weighting capacitors is constant, and the difference of the capacitances of which said further pair of weighting capacitors is a multiple of the value of the capacitance of the first capacitive element thereof, which multiple may be either positive or negative in sense, the capacitance of said first capacitive element in each said pair of weighting capacitors connecting from a said pair of input lines being the same as the capacitance of said first capacitive element in said corresponding further pair of weighting capacitors connecting from that same said pair of input lines.

47. Apparatus as set forth in claim 46 including:
a respective zeroeth capacitive element included as a component of a first of each said pair of weighting capacitors in said first plurality of weighting capacitors and as a component of a first of each said further pair of weighting capacitors in said $(R+1)^{th}$ plurality of weighting capacitors, said respective zeroeth capacitive element having the same value of capacitance between respective first and second plates thereof as said respective first capacitive element in the same said pair or further pair of weighting capacitors has between its respective first and second plates.

48. Apparatus as set forth in claim 47 including:
an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively determining the electronic control signals of said respective electronic selecting means in the pairs of weighting capacitors which pairs are identified by the same ordinal number as the word storage element storing that respective selection signal and in the further pairs of weighting capacitors which further pairs are identified by the ordinal number M higher than that of the word storage element storing that respective selection signal.

49. Apparatus as set forth in claim 46 wherein each pair of said weighting capacitors in said first plurality of weighting capacitors includes:
a respective zeroeth capacitive element having between respective first and second plates thereof a respective capacitance equal to the capacitance of said first capacitive element, said respective electronic selecting means that is included within each said pair of said weighting capacitors together with said respective zeroeth capacitive element responding to a respective further bit of its said selection signal stored in said electronic memory for selecting said zeroeth capacitive element as a component of either the first of or a second of that said pair of weighting capacitors; and wherein each said further pair of weighting capacitors in said $(R+1)^{th}$ plurality of weighting capacitors includes: :
a respective zeroeth capacitive element having between respective first and second plates thereof a respective capacitance equal to the capacitance of said first capacitive element, said respective electronic selecting means that is included within each said further pair of said weighting capacitors together with said respective zeroeth capacitive element responding to a respective further bit of its said selection signal stored in said electronic memory for selecting said zeroeth capacitive element as a component of either the first of or a second of that said further pair of weighting capacitors.

50. Apparatus as set forth in claim 49 including:
an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively determining the electronic control signals of said respective electronic selecting means in the pairs of weighting capacitors which pairs are identified by the same ordinal number as the word storage element storing that respective selection signal and in the further pairs of weighting capacitors which further pairs are identified by the ordinal number M higher than that of the word storage element storing that respective selection signal.

51. Apparatus as set forth in claim 46 including:
an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively determining the electronic control signals of said respective electronic selecting means in the pairs of weighting capacitors which pairs are identified by the same ordinal number as the word storage element storing that respective selection signal and in the further pairs of weighting capacitors which further pairs of weighting capacitors which further pairs are identified by the ordinal number M higher than that of the word storage element storing that respective selection signal.

52. Apparatus included in a processor for providing neuron-like response to a plurality of input signal voltages, M in number, said apparatus comprising:
a plurality, M in number, of input lines respectively identified by consecutive ordinal numbers, first through $M^{th}$, for receiving respective ones of said input voltage signals;
a plurality, 2R in number, of output lines identified by respective ones of consecutive ordinal numbers first through $2R^{th}$, R being a positive integer, each said output line insulated from its surroundings and exhibiting respective capacitance respective to its surroundings;
R pluralities of weighting capacitors, said pluralities of weighting capacitors identified by respective consecutive ordinal numbers first through $R^{th}$, each said plurality of weighting capacitors including a number 2M of respective weighting capacitors identified by respective consecutive ordinal numbers first through $2M^{th}$, M being a positive integer, each said weighting capacitor exhibiting a respective capacitance including at least a respective stray capacitance component, each said first through $M^{th}$ weighting capacitor in an $n^{th}$ one of said R pluralities connecting to said $n^{th}$ output line the one of said first through $M^{th}$ input lines identified by the same ordinal number as that said weighting capacitor, and each said $(M+1)^{th}$ through $2M^{th}$ weighting capacitor in an $n^{th}$ one of said R pluralities connecting to said $(R+n)^{th}$ output line the one of said first through $M^{th}$ input lines identified by the ordinal number M lower than that said weighting capacitor is identified by, the two weighting capacitors in an $n^{th}$ one of said R pluralities connecting to the same one of said first through $M^{th}$ input lines being included in a respective pair of weighting capacitors identified by the same ordinal number as that same one of said first through $M^{th}$ input lines those two weighting capacitors connect to, n assuming each of the integer values one through R;

means for maintaining substantially equal capacitances on each output line in each of R pairs of said output lines having ordinal numbers that differ by R;

respective means for providing a response to change in the difference of charge on the respective capacitances of the output lines in each of said R pairs of output lines respective to their surroundings, which response is a respective partial weighted summation signal;

means for summing the R respective partial weighted summation results, as respectively weighted by their corresponding weighting significances which increase with each higher ordinal number of the output line supplying the partial weighted summation result, to generate a final weighted summation result; and a non-linear amplifier having an input port to which said final weighted summation result is supplied and having an output port at which said neuron-like response is provided.

53. Apparatus as set forth in claim 52 in which said each pair of said weighting capacitors respectively comprises:

a respective plurality, P in number, of capacitive elements respectively identified by consecutive ordinal numbers first through $P^{th}$, each said respective capacitive element having between respective first and second plates thereof a respective capacitance scaled in $2^{(k-1)}$ ratio with the capacitance of said respective first capacitive element, where $k^{th}$ corresponds to the ordinal number of that said capacitive element; and respective electronic selecting means for selecting responsive to respective bits of a respective electronic control signal each of said respective first through $P^{th}$ capacitive elements as a component of either the first of or a second of said pair of weighting capacitors, at least one of which first and second of said pair of weighting capacitors can include no component capacitive elements if all the first through $P^{th}$ capacitive elements are selected as components of the other of said pair of weighting capacitors, the sum of the capacitances of which said pair of weighting capacitors is constant, and the difference of the capacitances of which said pair of weighting capacitors is a multiple of the value of the capacitance of the first capacitive element, which multiple may be either positive or negative in sense.

54. Apparatus as set forth in claim 53 including:

an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively corresponding to the electronic control signals of respective electronic selecting means in said pairs of weighting capacitors in said R pluralities of weighting capacitors which pairs are identified by the same ordinal number as the word storage element storing that respective selection signal.

55. Apparatus as set forth in claim 54 including:

a respective zeroeth capacitive element included as a component of a first of each said pair of weighting capacitors in said first plurality of weighting capacitors, said respective zeroeth capacitive element having the same value of capacitance between respective first and second plates thereof as said respective first capacitive element in the same said pair of weighting capacitors has between its respective first and second plates.

56. Apparatus as set forth in claim 54 wherein each pair of said weighting capacitors in said first plurality of weighting capacitors includes:

a respective zeroeth capacitive element having between respective first and second plates thereof a respective capacitance equal to the capacitance of said first capacitive element, said respective electronic selecting means that is included within each said pair of said weighting capacitors together with said respective zeroeth capacitive element responding to a respective further bit of its said selection signal stored in said electronic memory for selecting said zeroeth capacitive element as a component of either the first of or a second of that said pair of weighting capacitors.

57. Apparatus as set forth in claim 53 wherein said means for maintaining substantially equal capacitances on each output line in each of R pairs of said output lines having ordinal numbers that differ by R comprises:

R further pluralities of weighting capacitors, said further pluralities of weighting capacitors identified by respective consecutive ordinal numbers $(R+1)^{th}$ through $2R^{th}$, each said further plurality of weighting capacitors including a number 2M of respective weighting capacitors respectively identified by consecutive ordinal numbers $(2M+1)^{th}$ through $4M^{th}$, said $(2M+1)^{th}$ through $3M^{th}$ weighting capacitors in an $n^{th}$ one of said R pluralities connecting said $n^{th}$ output line to a signal ground, said $(3M+1)^{th}$ through $4M^{th}$ weighting capacitors in an $n^{th}$ one of said R pluralities connecting said $(R+n)^{th}$ output line to said signal ground, said weighting capacitors in each of said further pluralities of weighting capacitors that connect to said signal ground ones of said input lines having ordinal numbers differing by M being considered to be a respective further pair of weighting capacitors, which further respective pairs of weighting capacitors are identified by respective ones of the consecutive ordinal numbers $(M+1)^{th}$ through $2M^{th}$, the difference in the capacitances of each further pair of said weighting capacitors connecting to said signal ground from a said pair of output lines being the same in amplitude and the opposite in sense as the difference in the capacitances of a corresponding said pair of weighting capacitors identified by respective ordinal numbers lower by M than the weighting capacitors in the corresponding said further pair of said weighting capacitors.

58. Apparatus as set forth in claim 57 wherein each said further pair of said weighting capacitors comprises:
a respective plurality, P in number, of capacitive elements respectively identified by consecutive ordinal numbers first through $P^{th}$, each said capacitive element having between respective first and second plates thereof a respective capacitance scaled in $2^{(k-1)}$ ratio with the capacitance of said first capacitive element, where $k^{th}$ corresponds to the ordinal number of that said capacitive element; and
respective electronic selecting means, responding to respective electronic control signals, for selecting each of said first through $P^{th}$ capacitive elements as a component of either the first of or a second of said further pair of weighting capacitors, at least one of which first and second of said further pair of weighting capacitors can include no component capacitive elements if all the respective first through $P^{th}$ capacitive elements of said further pair are selected as components of the other of said further pair of weighting capacitors, the sum of the capacitances of which said further pair of weighting capacitors is constant, and the difference of the capacitances of which said further pair of weighting capacitors is a multiple of the value of the capacitance of the first capacitive element thereof, which multiple may be either positive or negative in sense, in which processor for providing neuron-like response to a plurality of input signal voltages the capacitance of said first capacitive element in each said pair of weighting capacitors is the same as the capacitance of said first capacitive element in said corresponding further pair of weighting capacitors.

59. Apparatus as set forth in claim 58 including:
a respective zeroeth capacitive element included as a component of a first of each said pair of weighting capacitors in said first plurality of weighting capacitors and as a component of a first of each said further pair of weighting capacitors in said $(R+1)^{th}$ plurality of weighting capacitors, said respective zeroeth capacitive element having the same value of capacitance between respective first and second plates thereof as said respective first capacitive element in the same said pair or further pair of weighting capacitors has between its respective first and second plates.

60. Apparatus as set forth in claim 59 including:
an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively determining the electronic control signals of said respective electronic selecting means in the pairs of weighting capacitors which pairs are identified by the same ordinal number as the word storage element storing that respective selection signal and in the further pairs of weighting capacitors which further pairs are identified by the ordinal number M higher than that of the word storage element storing that respective selection signal.

61. Apparatus as set forth in claim 58 wherein each pair of said weighting capacitors in said first plurality of weighting capacitors includes:
a respective zeroeth capacitive element having between respective first and second plates thereof a respective capacitance equal to the capacitance of said first capacitive element, said respective electronic selecting means that is included within each said pair of said weighting capacitors together with said respective zeroeth capacitive element responding to a respective further bit of its said selection signal stored in said electronic memory for selecting said zeroeth capacitive element as a component of either the first of or a second of that said pair of weighting capacitors; and wherein each said further pair of weighting capacitors in said $(R+1)^{th}$ plurality of weighting capacitors includes: :
a respective zeroeth capacitive element having between respective first and second plates thereof a respective capacitance equal to the capacitance of said first capacitive element, said respective electronic selecting means that is included within each said further pair of said weighting capacitors together with said respective zeroeth capacitive element responding to a respective further bit of its said selection signal stored in said electronic memory for selecting said zeroeth capacitive element as a component of either the first of or a second of that said further pair of weighting capacitors.

62. Apparatus as set forth in claim 61 including:
an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively determining the electronic control signals of said respective electronic selecting means in the pairs of weighting capacitors which pairs are identified by the same ordinal number as the word storage element storing that respective selection signal and in the further pairs of weighting capacitors which further pairs are identified by the ordinal number M higher than that of the word storage element storing that respective selection signal.

63. Apparatus as set forth in claim 58 including:
an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively determining the electronic control signals of said respective electronic selecting means in the pairs of weighting capacitors which pairs are identified by the same ordinal number as the word storage element storing that respective selection signal and in the further pairs of weighting capacitors which further pairs of weighting capacitors which further pairs are identified by the ordinal number M higher than that of the word storage element storing that respective selection signal.

64. Apparatus included in a processor for providing neuron-like response to a plurality of input signal voltages, M in number, said apparatus comprising:
- a plurality, 2M in number, of input lines respectively identified by consecutive ordinal numbers, first through $2M^{th}$;
- means for applying a respective input signal in balanced form to each pair of said input lines consisting of one of said first through $M^{th}$ input lines and the input line with ordinal number higher by M;
- a plurality, 2R in number, of output lines identified by respective ones of consecutive ordinal numbers first through $2R^{th}$, R being a positive integer, each said output line insulated from its surroundings and exhibiting respective capacitance respective to its surroundings;
- R pluralities of weighting capacitors, said pluralities of weighting capacitors identified by respective consecutive ordinal numbers first through $R^{th}$, each said plurality of weighting capacitors including a number 4M of respective weighting capacitors, M being a positive integer, each said weighting capacitor exhibiting a respective capacitance including at least a respective stray capacitance component, each said first through $2M^{th}$ weighting capacitors in an $n^{th}$ one of said R pluralities connecting to said $n^{th}$ output line the one of said first through $2M^{th}$ input lines identified by the same ordinal number as that said first through $2M^{th}$ weighting capacitors, each said $(2M+1)^{th}$ through $4M^{th}$ weighting capacitor in an $n^{th}$ one of said R pluralities connecting to said $(R+n)^{th}$ output line the one of said first through $2M^{th}$ input lines identified by the ordinal number lower by 2M than that said $(2M+1)^{th}$ through $4M^{th}$ weighting capacitor, n assuming each of the integer values one through R;
- respective means for providing a response to change in the difference of charge on the respective capacitances of the output lines in each of said R pairs of output lines respective to their surroundings, which response is a respective partial weighted summation signal;
- means for summing the R respective partial weighted summation results, as respectively weighted by their corresponding weighting significances which increase with each higher ordinal number of the output line supplying the partial weighted summation result, to generate a final weighted summation result; and
- a non-linear amplifier having an input port to which said final weighted summation result is supplied and having an output port at which said neuron-like response is provided.

65. Apparatus as set forth in claim 64, wherein within each of said R pluralities of weighting capacitors each two of those weighting capacitors having ordinal numbers differing by 2M are considered to be a respective pair of said weighting capacitors, and wherein each pair of said weighting capacitors respectively comprises:
- a respective plurality, P in number, of capacitive elements respectively identified by consecutive ordinal numbers first through $P^{th}$, each said capacitive element having between respective first and second plates thereof a respective capacitance scaled in $2^{(k-1)}$ ratio with the capacitance of said first capacitive element, where $k^{th}$ corresponds to the ordinal number of that said capacitive element; and
- electronic selecting means, responding to a respective selection signal, for selecting each of said first through $P^{th}$ capacitive elements as a component of either the first of or a second of said pair of weighting capacitors, at least one of which first and second of said pair of weighting capacitors can include no component capacitive elements if all the first through $P^{th}$ capacitive elements are selected as components of the other of said pair of weighting capacitors, the sum of the capacitances of which said pair of weighting capacitors is constant, and the difference of the capacitances of which said pair of weighting capacitors is a multiple of the value of the capacitance of the first capacitive element, which multiple may be either positive or negative in sense.

66. Apparatus as set forth in claim 65 including:
- a respective zeroeth capacitive element included as a component of a first of each said pair of weighting capacitors in said first plurality of weighting capacitors and as a component of a first of each said further pair of weighting capacitors in said $(R+1)^{th}$ plurality of weighting capacitors, said respective zeroeth capacitive element having the same value of capacitance between respective first and second plates thereof as said respective first capacitive element in the same said pair or further pair of weighting capacitors has between its respective first and second plates.

67. Apparatus as set forth in claim 66 including:
- an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively determining the electronic control signals of said respective electronic selecting means in the pairs of weighting capacitors which pairs are identified by the same ordinal number as the word storage element storing that respective selection signal and in the further pairs of weighting capacitors which further pairs are identified by the ordinal number M higher than that of the word storage element storing that respective selection signal.

68. Apparatus as set forth in claim 65 wherein each pair of said weighting capacitors in said first plurality of weighting capacitors includes:
- a respective zeroeth capacitive element having between respective first and second plates thereof a respective capacitance equal to the capacitance of said first capacitive element, said respective electronic selecting means that is included within each said pair of said weighting capacitors together with said respective zeroeth capacitive element responding to a respective further bit of its said selection signal stored in said electronic memory for selecting said zeroeth capacitive element as a component of either the first of or a second of that said pair of weighting capacitors; and wherein each said further pair of weighting capacitors in said $(R+1)^{th}$ plurality of weighting capacitors includes:

a respective zeroeth capacitive element having between respective first and second plates thereof a respective capacitance equal to the capacitance of said first capacitive element, said respective electronic selecting means that is included within each said further pair of said weighting capacitors together with said respective zeroeth capacitive element responding to a respective further bit of its said selection signal stored in said electronic memory for selecting said zeroeth capacitive element as a component of either the first of or a second of that said further pair of weighting capacitors.

69. Apparatus as set forth in claim 68 including:

an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively determining the electronic control signals of said respective electronic selecting means in the pairs of weighting capacitors which pairs are identified by the same ordinal number as the word storage element storing that respective selection signal and in the further pairs of weighting capacitors which further pairs are identified by the ordinal number M higher than that of the word storage element storing that respective selection signal.

70. Apparatus as set forth in claim 65 including:

an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively determining the electronic control signals of said respective electronic selecting means in the pairs of weighting capacitors which pairs are identified by the same ordinal number as the word storage element storing that respective selection signal and in the further pairs of weighting capacitors which further pairs are identified by the ordinal number M higher than that of the word storage element storing that respective selection signal.

71. Apparatus as set forth in claim 64, wherein within each of said R pluralities of weighting capacitors each two of said first through $2M^{th}$ weighting capacitors having ordinal numbers differing by M are considered to be a respective pair of said weighting capacitors, wherein within each of said R pluralities of weighting capacitors each two of said $(2M+1)^{th}$ through $4M^{th}$ weighting capacitors having ordinal numbers differing by M are considered to be a respective pair of said weighting capacitors, and wherein each pair of said weighting capacitors respectively comprises:

a respective plurality, P in number, of capacitive elements respectively identified by consecutive ordinal numbers first through $P^{th}$, each said capacitive element having between respective first and second plates thereof a respective capacitance scaled in $2^{(k-1)}$ ratio with the capacitance of said first capacitive element, where $k^{th}$ corresponds to the ordinal number of that said capacitive element; and electronic selecting means, responding to a respective selection signal, for selecting each of said first through $P^{th}$ capacitive elements as a component of either the first of or a second of said pair of weighting capacitors, at least one of which first and second of said pair of weighting capacitors can include no component capacitive elements if all the first through $P^{th}$ capacitive elements are selected as components of the other of said pair of weighting capacitors, the sum of the capacitances of which said pair of weighting capacitors is constant, and the difference of the capacitances of which said pair of weighting capacitors is a multiple of twice the value of the capacitance of the first capacitive element, which multiple may be either positive or negative in sense.

72. Apparatus as set forth in claim 71 including:

a respective zeroeth capacitive element included as a component of a first of each said pair of weighting capacitors in said first plurality of weighting capacitors and as a component of a first of each said further pair of weighting capacitors in said $(R+1)^{th}$ plurality of weighting capacitors, said respective zeroeth capacitive element having the same value of capacitance between respective first and second plates thereof as said respective first capacitive element in the same said pair or further pair of weighting capacitors has between its respective first and second plates.

73. Apparatus as set forth in claim 72 including:

an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively determining the electronic control signals of said respective electronic selecting means in the pairs of weighting capacitors which pairs are identified by the same ordinal number as the word storage element storing that respective selection signal and in the further pairs of weighting capacitors which further pairs are identified by the ordinal number M higher than that of the word storage element storing that respective selection signal.

74. Apparatus as set forth in claim 71 wherein each pair of said weighting capacitors in said first plurality of weighting capacitors includes:

a respective zeroeth capacitive element having between respective first and second plates thereof a respective capacitance equal to the capacitance of said first capacitive element, said respective electronic selecting means that is included within each said pair of said weighting capacitors together with said respective zeroeth capacitive element responding to a respective further bit of its said selection signal stored in said electronic memory for selecting said zeroeth capacitive element as a component of either the first of or a second of that said pair of weighting capacitors; and wherein each said further pair of weighting capacitors in said $(R+1)^{th}$ plurality of weighting capacitors includes::
a respective zeroeth capacitive element having between respective first and second plates thereof a respective capacitance equal to the capacitance of said first capacitive element, said respective electronic selecting means that is included within each said further pair of said weighting capacitors together with said respective zeroeth capacitive element responding to a respective further bit of its said selection signal stored in said electronic memory for selecting said zeroeth capacitive element as a component of either the first of or a second of that said further pair of weighting capacitors.

75. Apparatus as set forth in claim 74 including:
an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively determining the electronic control signals of said respective electronic selecting means in the pairs of weighting capacitors which pairs are identified by the same ordinal number as the word storage element storing that respective selection signal and in the further pairs of weighting capacitors which further pairs are identified by the ordinal number M higher than that of the word storage element storing that respective selection signal.

76. Apparatus as set forth in claim 71 including:
an electronic memory having a plurality of word storage elements, M in number, identified by respective ones of consecutive ordinal numbers first through $M^{th}$, each word storage element for storing therein within R respective segments thereof R respective segments of a respective selection signal in digital form, said R respective segments of each respective selection signal in digital form respectively determining the electronic control signals of said respective electronic selecting means in the pairs of weighting capacitors which pairs are identified by the same ordinal number as the word storage element storing that respective selection signal and in the further pairs of weighting capacitors which further pairs are identified by the ordinal number M higher than that of the word storage element storing that respective selection signal.

* * * * *